United States Patent
Ogura et al.

(10) Patent No.: US 6,498,624 B1
(45) Date of Patent: *Dec. 24, 2002

(54) OPTICAL APPARATUS AND IMAGE SENSING APPARATUS MOUNTED ON THE SAME SURFACE OF A BOARD

(75) Inventors: Shigeo Ogura, Tokyo; Toshiya Kurihashi, Kokubunji; Nobuhiro Takeda, Kawasaki; Yoshihiro Uchino, Yokohama; Kenichi Kimura; Toshikazu Yanai, both of Kawasaki; Hiroyuki Ogino, Yokohama, all of (JP)

(73) Assignee: Canon Kabushiki Kaisha (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/607,178

(22) Filed: Feb. 26, 1996

(30) Foreign Application Priority Data

| Feb. 28, 1995 | (JP) | 7-065104 |
| Feb. 28, 1995 | (JP) | 7-065106 |
| Feb. 28, 1995 | (JP) | 7-065107 |
| Feb. 28, 1995 | (JP) | 7-065108 |
| Feb. 28, 1995 | (JP) | 7-065111 |

(51) Int. Cl.$^7$ ............................................. H04N 5/225
(52) U.S. Cl. ................. 348/335; 348/220; 348/360
(58) Field of Search ................ 348/335, 340, 348/363, 373, 374, 375, 376, 65, 36, 39, 220, 360; 250/208.1, 201.2; 359/822, 823, 831; 356/400; 396/87; H04N 5/225

(56) References Cited

U.S. PATENT DOCUMENTS

| 5,130,804 A | * | 7/1992 | Tamura et al. | 348/374 |
| 5,418,566 A | * | 5/1995 | Kameishi | 348/294 |
| 5,444,485 A | * | 8/1995 | Uchioke et al. | 348/335 |
| 5,483,284 A | * | 1/1996 | Ishiguro | 348/207 |
| 5,589,882 A | * | 12/1996 | Shiraishi et al. | 348/340 |
| 5,825,560 A | * | 10/1998 | Ogura et al. | 359/882 |
| 5,847,887 A | * | 12/1998 | Ogure et al. | 359/822 |

\* cited by examiner

*Primary Examiner*—Tuan Ho
(74) *Attorney, Agent, or Firm*—Morgan & Finnegan, LLP

(57) ABSTRACT

There is provided an optical apparatus which has excellent assembly performance, can suppress an increase in cost, and attain a decrease in thickness. The optical apparatus includes a board (1) having a photographing optical system and a mechanical system mounted on its surface. A plurality of opening portions (1a, 1b, 1c) are formed in the board (1). The opening portion (1a) is sealed with a sealing member such as a glass member to allow a light beam to pass and prevent dust and the like from entering the storage space for parts between the board (1) and a shield case (49). The photographing optical system mounted on the board (1) includes a stop unit (30) for adjusting the light amount of an object image guided through the opening portion (1a), and prism-like optical members (G1, G2, G3, G4), each consisting of, e.g., a glass or plastic material and having a sculptured surface as a reflecting surface. Light emerging from the optical member (G4) is received by a solid-state image sensing element (2) mounted on the lower surface of the board (1) through the opening portion (1c).

30 Claims, 36 Drawing Sheets

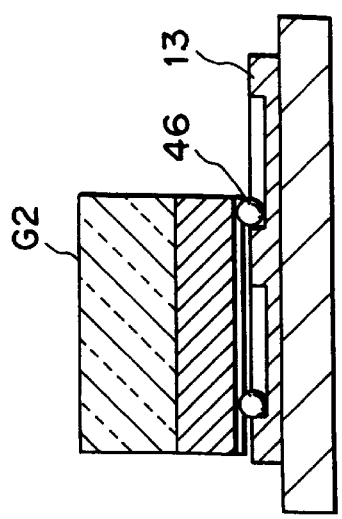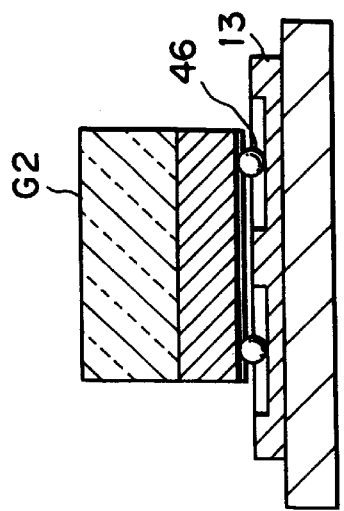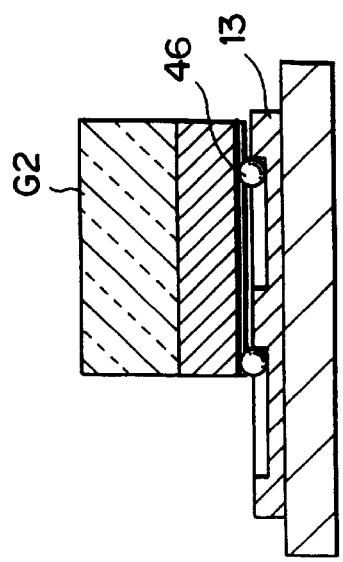

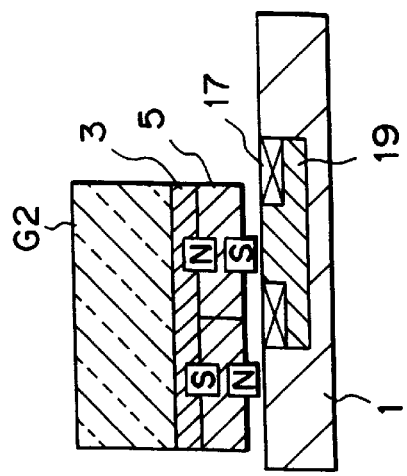
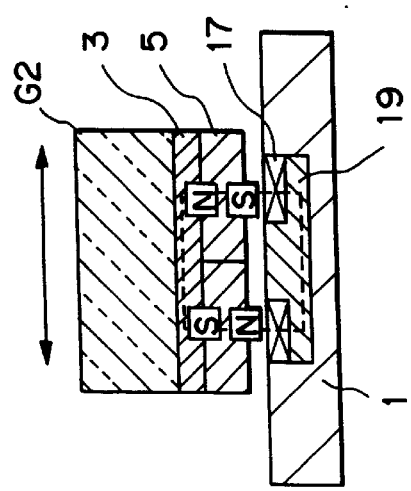
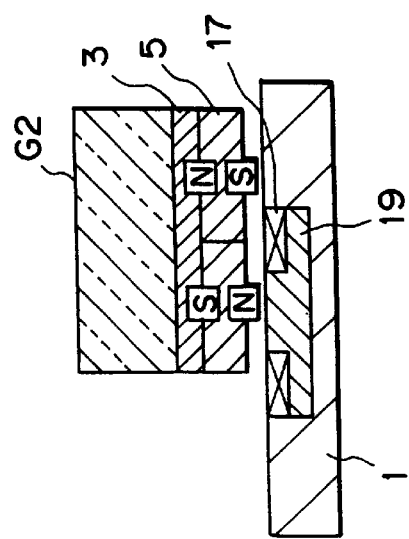

OPTICAL APPARATUS AND IMAGE SENSING APPARATUS MOUNTED ON THE SAME SURFACE OF A BOARD

BACKGROUND OF THE INVENTION

The present invention relates to an optical apparatus and image sensing apparatus which form an object image on a solid-state image sensing element through a photographing optical member and, more particularly, to an optical apparatus and image sensing apparatus which sense an object image by using a solid-state image sensing element.

A solid-state image sensing element such as a CCD is used for an image sensing apparatus such as an electronic still camera or video camera. This solid-state image sensing element is sealed in a bare chip, a ceramic package, or the like. The image sensing surface of the solid-state image sensing element is exposed on the upper surface of this package, and a plurality of terminals such as an output terminal for outputting signals accumulated in the solid-state image sensing element and an input terminal for inputting a timing pulse or the like are arranged on the lower surface of the package. These terminals are soldered to corresponding electrical connection portions formed on a board. By soldering the terminals to the board, the solid-state image sensing element is mounted on the board.

Generally, an optical apparatus using a solid-state image sensing element has a zoom lens mechanism to obtain a desired photographing range.

A method of mounting this solid-state image sensing element will be described in detail below with reference to FIG. 30. FIG. 30 is a perspective view showing a method of mounting a conventional solid-state image sensing element.

When a solid-state image sensing element sealed in a package is to be mounted on a board, the solid-state image sensing element is mounted with its lower surface opposing the upper surface of the board, and the terminals arranged on the lower surface of the solid-state image sensing element are soldered to the corresponding lands on the upper surface of the board, as shown in FIG. 30. The board on which this solid-state image sensing element is mounted is connected, through a wiring means such as lead wires or a flexible board, to a board on which a signal processing IC and the like are mounted.

The image sensing apparatus using the above solid-state image sensing element will be described next with reference to FIG. 31. FIG. 31 is a longitudinal sectional view showing the arrangement of the image sensing apparatus using the solid-state image sensing element.

As shown in FIG. 31, the image sensing apparatus includes a plurality of lens groups constituted by a first lens group 101a, a second lens group 101b, a third lens group 101c, and a fourth lens group 101d. The second and fourth lens groups 101b and 101d are moved along the optical axis within predetermined ranges. The second lens group 101b is moved to perform a zooming operation. The fourth lens group 101d is moved to perform focus adjustment.

An optical low-pass filter 102 and a solid-state image sensing element 103 such as a CCD are sequentially arranged on the optical axis behind the fourth lens group 101d.

The first lens group 101a, the third lens group 101c, the optical low-pass filter 102, the solid-state image sensing element 103, and the like are held in a housing 104.

The second lens group 101b is held in an optical holding member 105. The optical holding member 105 is supported to be movable along the optical axis on a guide pin 106 and a threaded member 107 which extend parallel along the optical axis. Each end portion of the guide pin 106 is supported on the housing 104.

The threaded member 107 has a threaded portion to be engaged with the optical holding member 105. Each end portion of the threaded member 107 is rotatably supported on the housing 104. A driving force from a stepping motor 110 is transferred to the threaded member 107 through a gear group 101. When the threaded member 107 is rotated by the driving force from the stepping motor 110, the optical holding member 105 is guided by the guide pin 106 and moved along the optical axis upon rotation of the threaded member 107. By moving the optical holding member 105, a zooming operation using the second lens group 101b is performed. The play between the threaded member 107 and the optical holding member 105 is removed by a biasing spring 108 and a biasing member 109.

Similar to the second lens group 101b, the fourth lens group 101d is supported in an optical holding member 116. The optical holding member 116 is supported to be movable along the optical axis on a guide pin 117 and a threaded member 113 which extend parallel along the optical axis. Each end portion of the guide pin 117 is supported on the housing 104.

The threaded member 113 has a threaded portion to be engaged with the optical holding member 116. One end portion of the threaded member 113 is rotatably supported on the housing 104. The other end portion of the threaded member 113 is rotatably supported on the housing 104 and directly connected to the output shaft of a stepping motor 112. When the threaded member 113 is rotated by a driving force from the stepping motor 112, the optical holding member 116 is guided by the guide pin 117 and moved along the optical axis upon rotation of the threaded member 113. By moving the optical holding member 116, focus adjustment using the fourth lens group 101d is performed. The play between the threaded member 113 and the optical holding member 116 is removed by the biasing spring 108 and the biasing member 109.

The moving positions of the second and fourth lens groups 101b and 101d, i.e., the moving positions of the optical holding members 105 and 116, are detected by position detection means (not shown). The detection amounts are used to control a zooming operation and a focus adjusting operation.

A stop 114 is disposed between the second lens group 101b and the third lens group 101c. The aperture of the stop 114 is adjusted by a driving force from a motor 115. The exposure amount is adjusted by this adjustment of the aperture of the stop 114.

The housing 104 serves both as a means for shielding each lens group and the solid-state image sensing element 103 against light and as a means for shielding them against electromagnetism.

With the recent advances in semiconductor chips such as memories and microcomputers, portable information devices have spread. Efforts have been made to further miniaturize such devices and improve their performance. Portability is a requirement for such portable information devices. Regarding the forms of the devices, a low profile is especially required.

These portable information devices include an optical apparatus for photographing an object image, information equipment including this optical apparatus, and the like. In order to obtain a low-profile optical apparatus, the overall thickness of the apparatus including a photographing optical system (a system constituted by, e.g., the lens groups, the stop, and the solid-state image sensing element in FIG. 31) and a mechanical system (a system constituted by, e.g., the gears and the motors which drive the lens groups, the motor which drives the stop, and the like in FIG. 31) must be decreased.

In general, in the conventional optical apparatus, however, since the optical holding member 105 included in the mechanical system is axially supported to be symmetrical with the optical axis, the outer size of the housing 104 becomes large as compared with the lens system. In addition, since the motor and the like are disposed outside the housing 104, the overall outer size of the apparatus further increases. It is therefore very difficult to decrease the size of the apparatus in a direction perpendicular to the optical axis, i.e., to attain a decrease in thickness in the direction perpendicular to the optical axis.

The first to fourth lens groups 101*a* to 101*d*, the optical low-pass filter 102, the solid-state image sensing element 103, and the like are held in the housing 104, and the motor 115 for driving the stop 114, the stepping motor 110 for driving the second lens group 101*b*, the stepping motor 112 for driving the fourth lens group 101*d*, and the like are held outside the housing 104. For this reason, the housing 104 has a three-dimensionally complicated shape. In addition, a light-shielding means for shielding each lens group and the solid-state image sensing element 103 against light or a shielding means for shielding each lens group and the solid-state image sensing element 103 against electromagnetism must be formed by using this housing 104 having the complicated shape. With the light-shielding means or the shielding means, a decrease in the thickness of the apparatus is more difficult to attain.

As described above, in the method of mounting a conventional solid-state image sensing element on a signal processing board on which a signal processing IC and the like are mounted, the solid-state image sensing element is mounted on the board, and the board is then connected to the signal processing board, on which the signal processing IC and the like are mounted, through lead wires or a flexible board. Such a mounting method requires many steps, resulting in a complicated assembly operation.

Since the board on which the solid-state image sensing element is mounted is interposed between the solid-state image sensing element and the signal processing board, the signal processing board, on which the solid-state image sensing element is mounted, increases in size in the direction of thickness. It is therefore difficult to decrease the thickness of the photographing optical system, and hence it is very difficult to obtain a low-profile image sensing apparatus.

In addition, in the conventional optical apparatus, for example, since the optical holding member 105 is supported on the guide pin 106 and the threaded member 107 to be symmetrical about the optical axis, the outer diameter of the housing 104 becomes larger as compared with the outer diameter of the second lens group 101*b*. In addition, the motor 115 for driving the stop 114, the stepping motor 110 for driving the second lens group 101*b*, the stepping motor 112 for driving the fourth lens group 101*d*, and the like are held outside the housing 104. For this reason, it is very difficult to decrease the dimension in a direction perpendicular to the optical axis, i.e., the thickness in the direction perpendicular to the optical axis. That is, it is very difficult to obtain a low-profile apparatus.

Furthermore, in the conventional optical apparatus, the first to fourth lens groups 101*a* to 101*d*, the optical low-pass filter 102, the solid-state image sensing element 103, and the like are held in the housing 104, and the motor 115 for driving the stop 114, the stepping motor 110 for driving the second lens group 101*b*, the stepping motor 112 for driving the fourth lens group 101*d*, and the like are held outside the housing 104. That is, the housing 104 has a three-dimensionally complicated shape. For this reason, the cost in manufacturing a housing mold generally using a plastic mold increases. In addition, sink marks, warpage, and the like are caused by partial heat shrinkage of the housing 104, and hence it is difficult to manufacture the housing 104 with high dimensional precision. Consequently, it is difficult to perform positioning of each lens group with respect to the solid-state image sensing element 103. Deterioration in image quality such as blurring of photographed images is caused by a slight offset between each lens group and the solid-state image sensing element 103.

Generally, the optical holding members 105 included in the mechanical system is axially supported to be symmetrical about the optical axis. For this reason, the outer size of the housing 104 is large as compared with the lens system. In addition, since the motor and the like are disposed outside the housing 104, the overall outer size of the apparatus further increases. It is therefore very difficult to decrease the size of the apparatus in a direction perpendicular to the optical axis, i.e., the thickness of the apparatus in the direction perpendicular to the optical axis.

In the conventional optical apparatus, the first to fourth lens groups 101*a* to 101*d*, the optical low-pass filter 102, the solid-state image sensing element 103, and the like are held in the housing 104, and the motor 115 for driving the stop 114, the stepping motor 110 for driving the second lens group 101*b*, the stepping motor 112 for driving the fourth lens group 101*d*, and the like are held outside the housing 104. That is, the housing 104 has a three-dimensionally complicated shape. For this reason, the cost in manufacturing a housing mold generally using a plastic mold increases. In addition, sink marks, warpage, and the like are caused by partial heat shrinkage of the housing 104, and hence it is difficult to manufacture the housing 104 with high dimensional precision. Consequently, it is difficult to perform positioning of each lens group with respect to the solid-state image sensing element 103, positioning of each holding member, and the like. For this reason, each lens group may tilts or lenses may swing during movement of each lens group. This may cause blurring or fluctuations of photographed images.

An electric circuit board on which an image sensing element drive circuit for driving the solid-state image sensing element included in the photographing optical system and actuator drive circuits for driving the motors included in the mechanical system are mounted must be connected to the solid-state image sensing element and the motor through lead wires, a flexible board, or the like. Such a mounting method requires many steps, resulting in a complicated assembly operation.

Since the optical holding member 105 included in the mechanical system is generally supported to be symmetrical about the optical axis, the outer size of the housing 104 is large as compared with the lens system. Since the motors and the like are disposed outside the housing 104, the overall outer size of the apparatus further increases. It is, therefore, very difficult to decrease the dimension of the apparatus in the direction perpendicular to the optical axis, i.e., the thickness in the direction perpendicular to the optical axis.

In addition, since mechanical and electric parts must be mounted in various directions in assembling the apparatus, a cumbersome assembly operation is required, resulting in an increase in cost.

SUMMARY OF THE INVENTION

It is an object of the present invention to provide an optical apparatus which has good assembly performance, can suppress an increase in cost, and can decrease the thickness.

It is another object of the present invention to provide an optical apparatus which can decrease the overall thickness of the apparatus, and prevents a light-shielding means from interfering with a decrease in the thickness of the apparatus.

It is still another object of the present invention to provide an optical apparatus which can decrease the overall thickness of the apparatus, and prevents a shielding means from interfering with a decrease in the thickness of the apparatus.

It is still another object of the present invention to provide an optical apparatus which can decrease the overall thickness of the apparatus, and prevents light-shielding and shielding means from interfering with a decrease in the thickness of the apparatus.

It is still another object of the present invention to provide an image sensing apparatus which can facilitate an assembly process, and can decrease the thickness.

It is still another object of the present invention to provide an optical apparatus which can easily decrease the overall thickness of the apparatus.

It is still another object of the present invention to provide an optical apparatus which can prevent image quality from being deteriorated by inaccuracy of relative positioning between each optical member and a solid-state image sensing element included in a photographing optical system, and can decrease the overall thickness of the apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 4A to 4C are sectional views taken along a line IV—IV in FIG. 3;

FIGS. 5A to 5C are sectional views taken along a line V—V in FIG. 3;

DETAILED DESCRIPTION OF THE PREFERRED EMBODIMENTS

Embodiments of the present invention will be described below with reference to the accompanying drawings.
(First Embodiment)

Figure 1:
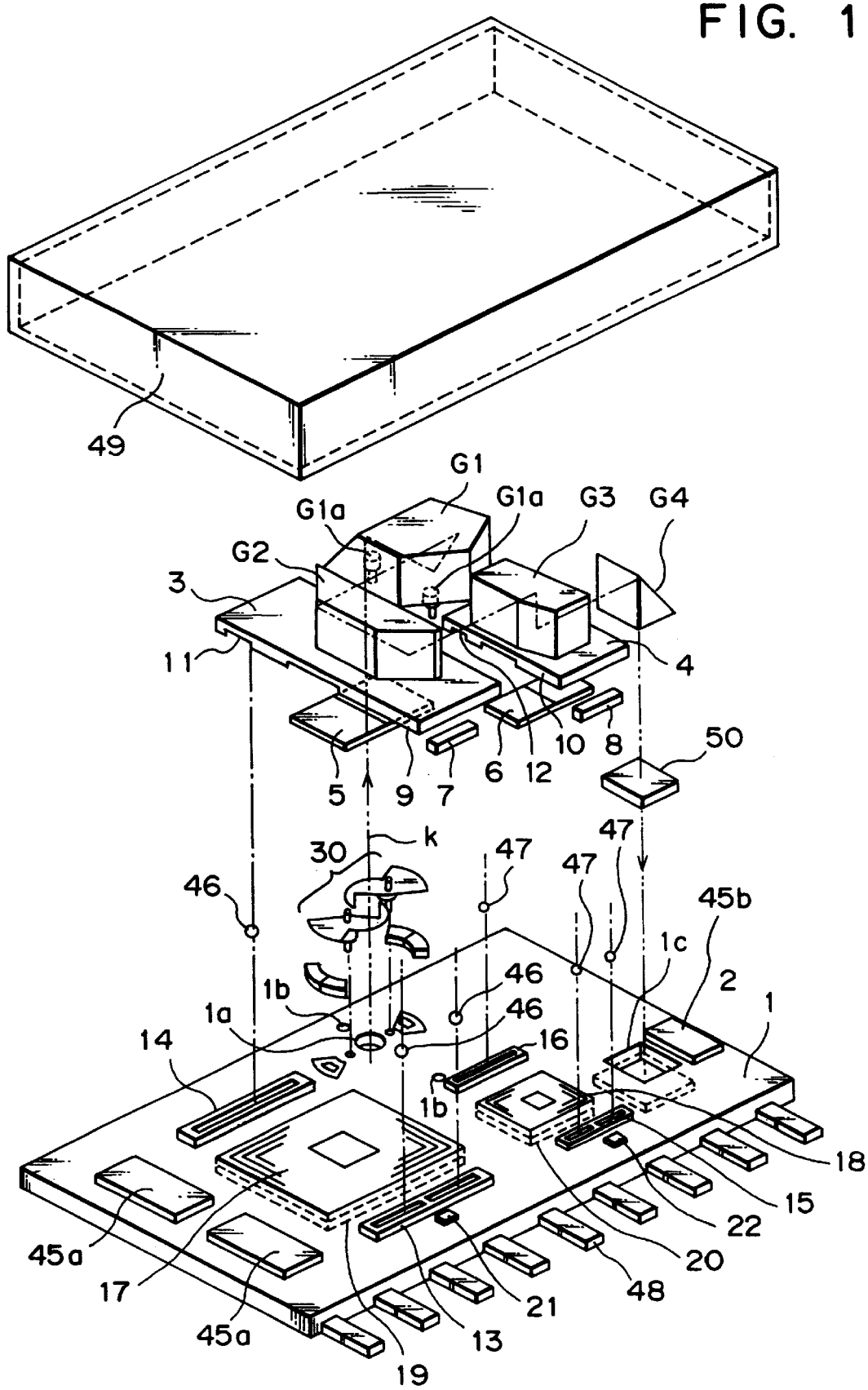
FIG. 1 is an exploded perspective view showing the arrangement of an image sensing apparatus apparatus according to the first embodiment of the present invention.
Figure 2:
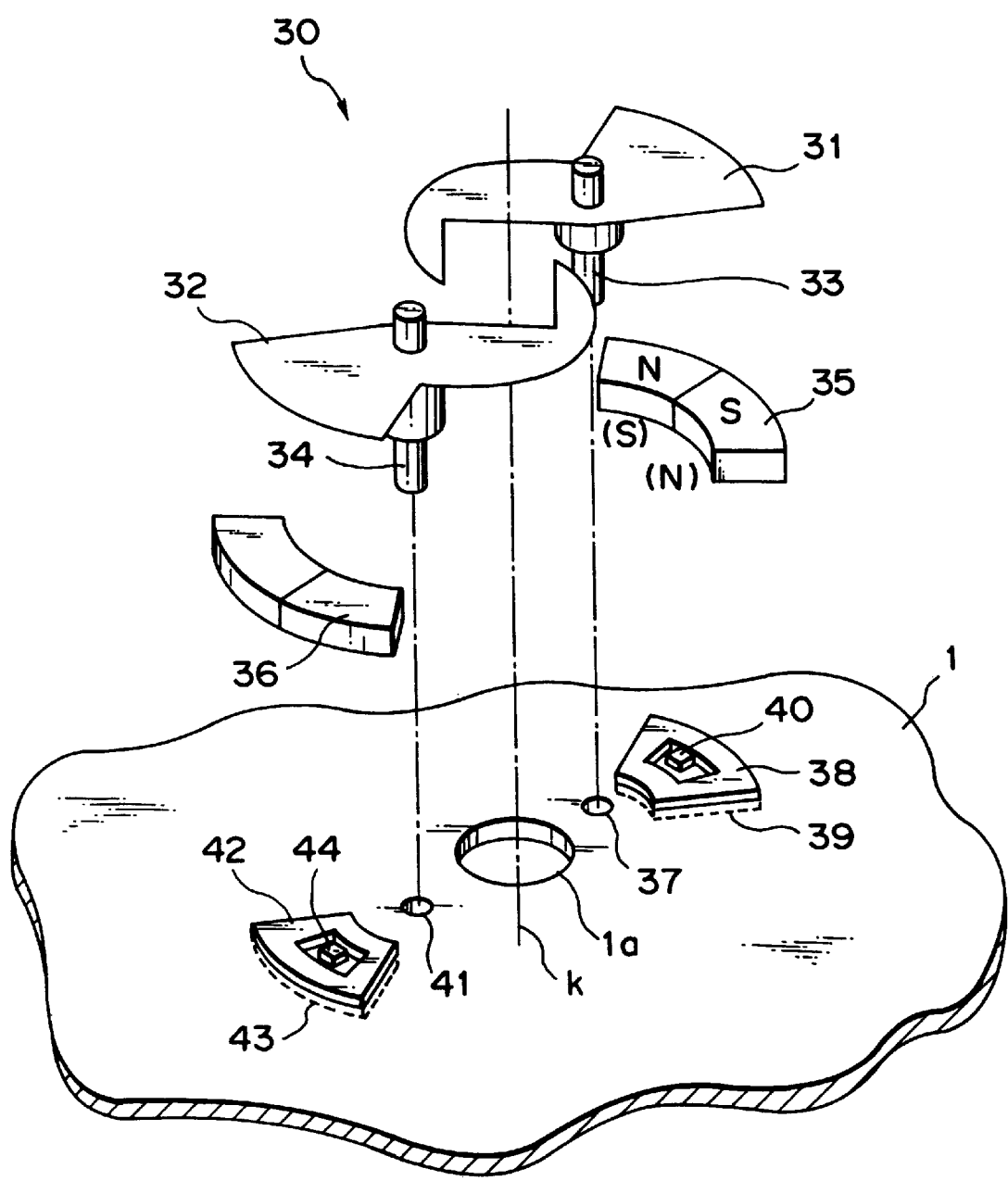
FIG. 2 is an exploded perspective view showing the arrangement of a stop unit of the optical apparatus in FIG. 1.
Figure 3:
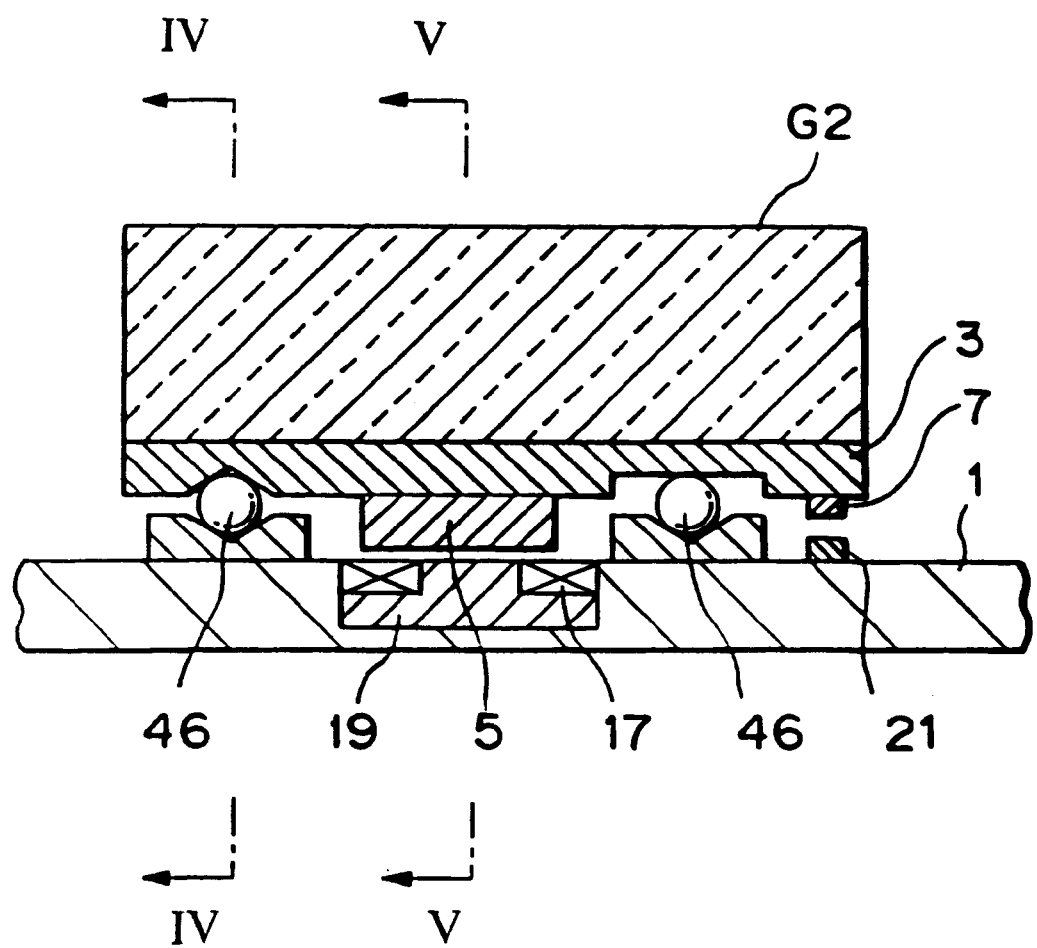
FIG. 3 is a longitudinal sectional view showing the arrangement of an actuator of an optical member G2 of the optical apparatus in FIG. 1.
Figure 6:
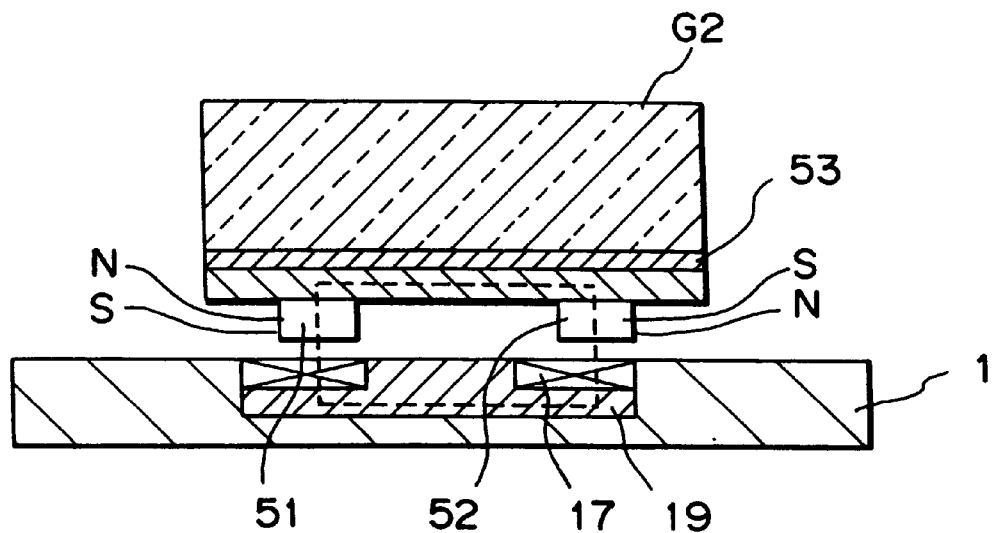
FIG. 6 is a longitudinal sectional view showing another arrangement of the actuator of the optical member G2.
Figure 7:
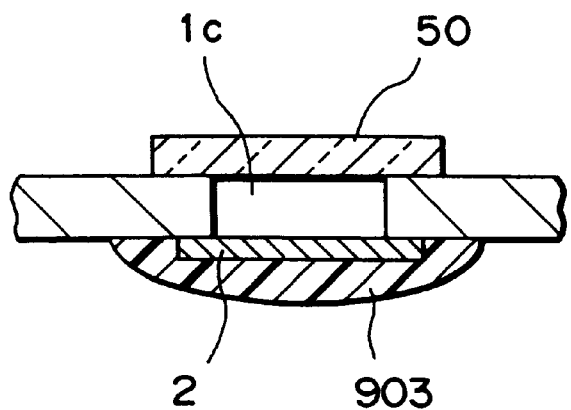
FIG. 7 is a longitudinal sectional view showing portions around a solid-state image sensing element of the image sensing apparatus <or image sensing apparatus> in FIG. 1.
Figure 8:
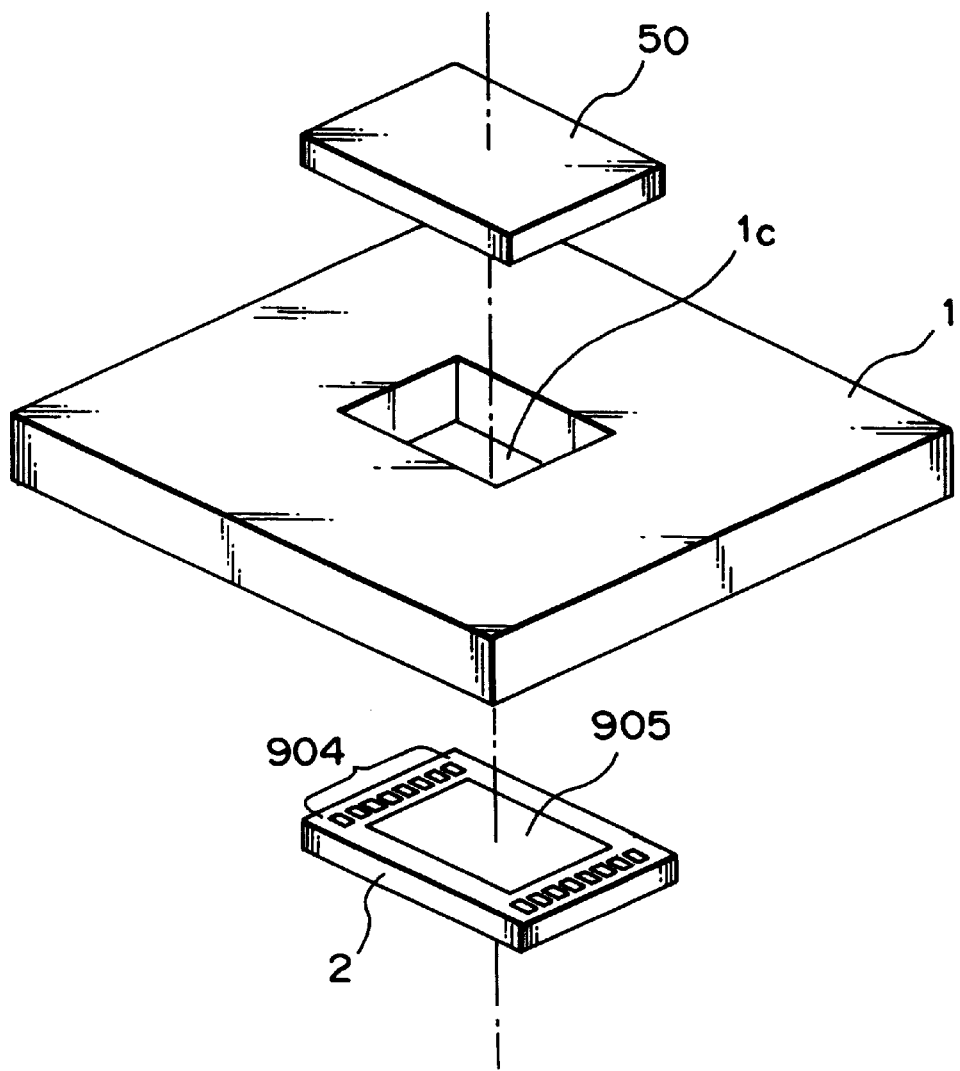
FIG. 8 is an exploded perspective view showing portions around the solid-state image sensing element of the image sensing apparatus in FIG. 1.
Figure 9:
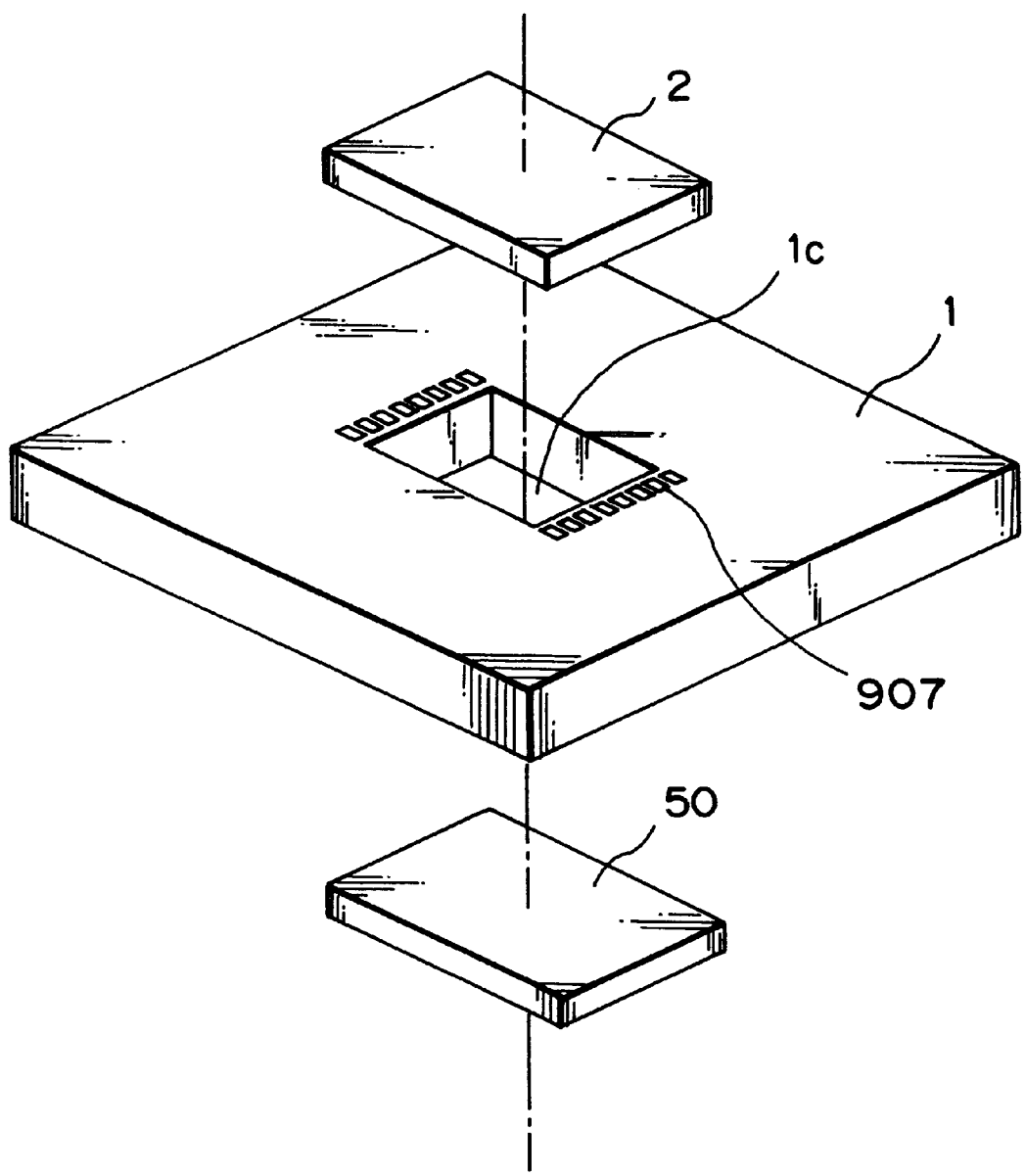
FIG. 9 is an exploded perspective view showing portions (on the lower surface side of the board) around the solid-state image sensing element of the image sensing apparatus in FIG. 1.
Figure 10:
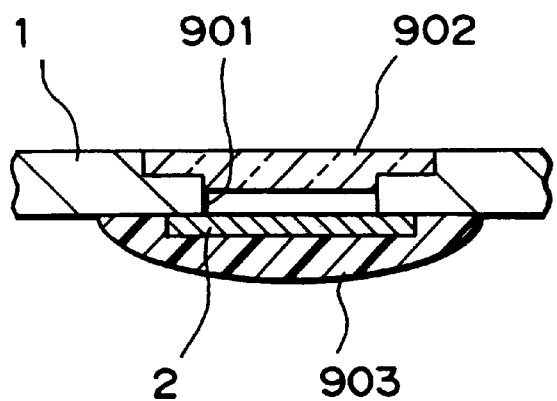
FIG. 10 is a longitudinal sectional view showing another example of how a glass member for protecting the image sensing surface of the solid-state image sensing element is mounted.
Figure 11:
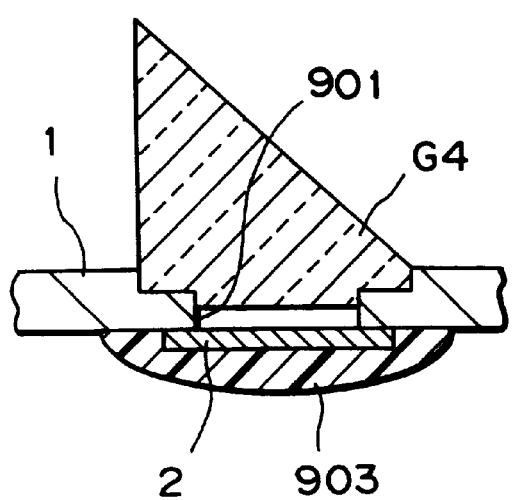
FIG. 11 is a longitudinal sectional view showing still another example of how the glass member for protecting the image sensing surface of the solid-state image sensing element is mounted.
Figure 12:
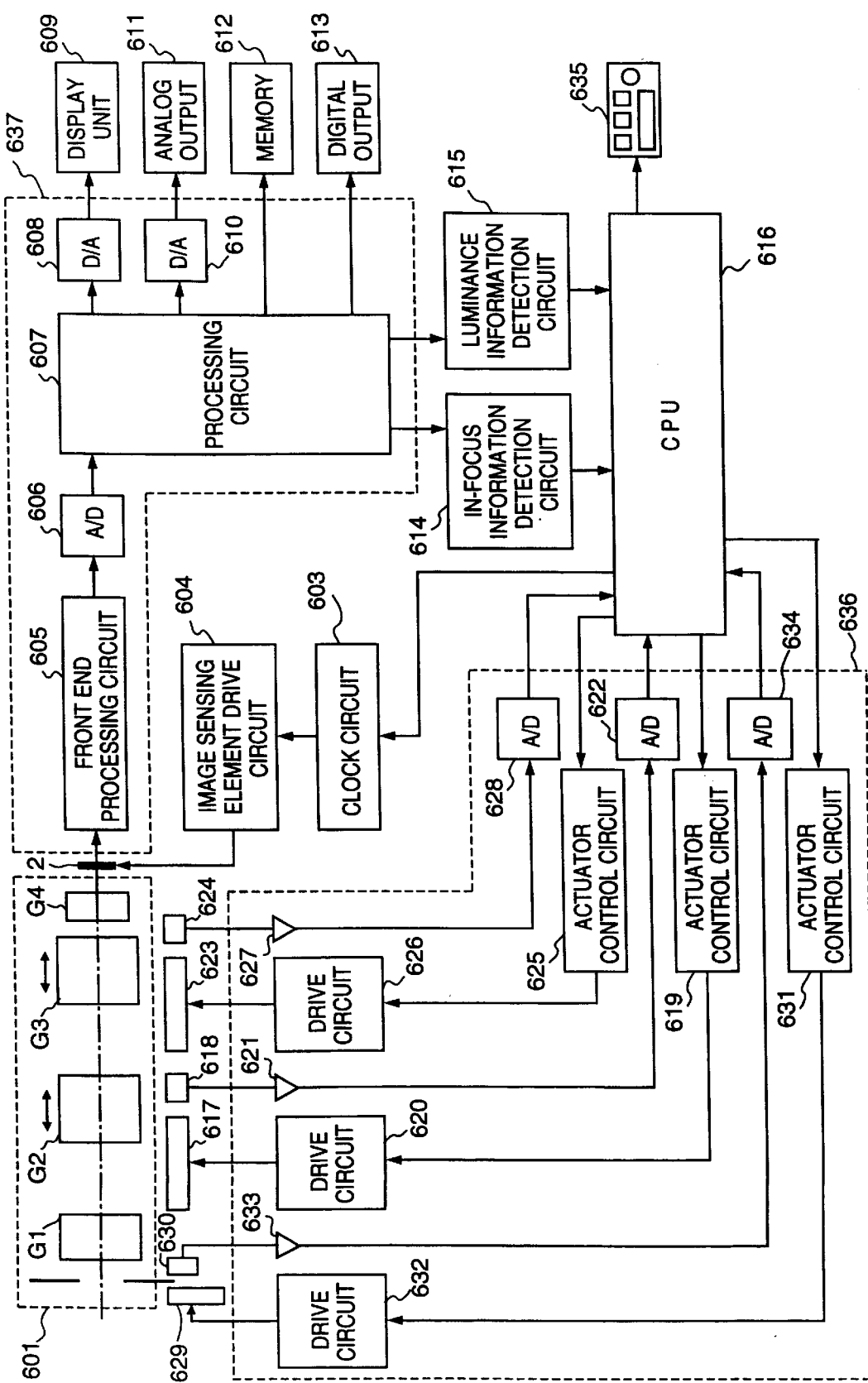
FIG. 12 is a block diagram showing the arrangement of the image sensing apparatus in FIG. 1.
Figure 13:
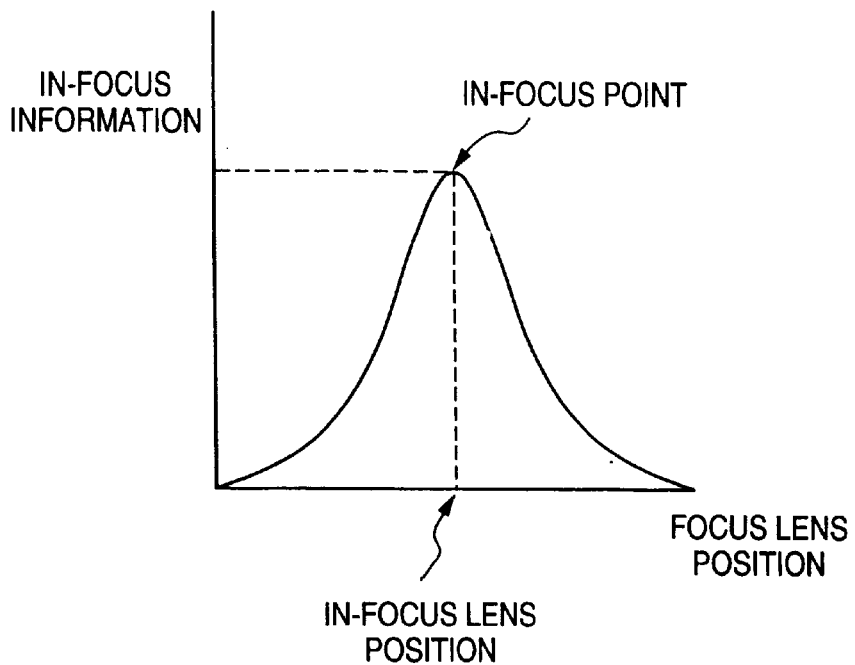
FIG. 13 is a graph showing in-focus characteristics in a focusing operation.
Figure 14:
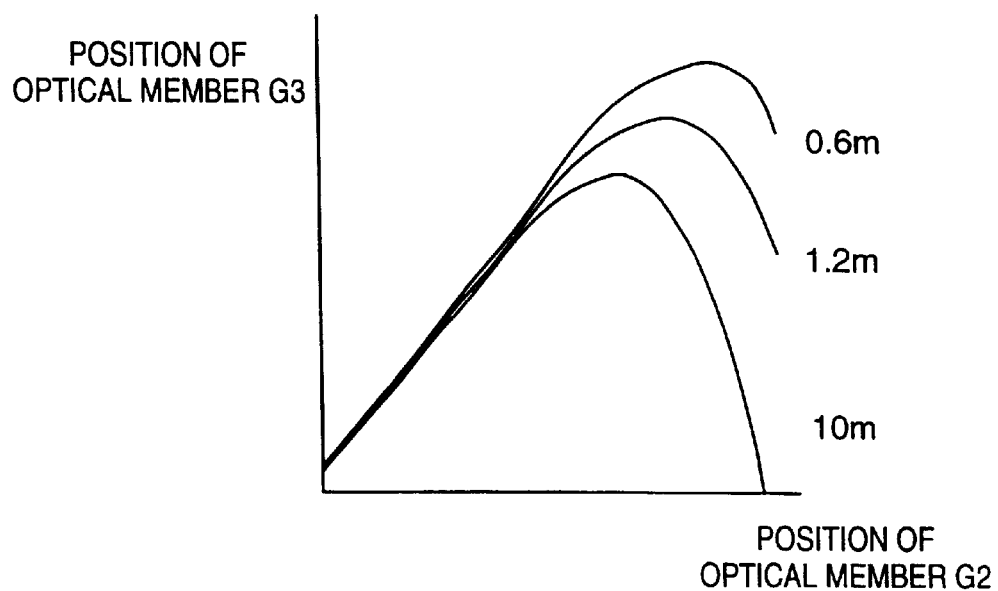
FIG. 14 is a graph showing zoom tracking curves.

FIG. 1 is an exploded perspective view showing the arrangement of an optical apparatus according to the first embodiment of the present invention. FIG. 2 is an exploded perspective view showing the arrangement of a stop unit of the optical apparatus in FIG. 1. FIG. 3 is a longitudinal sectional view showing the arrangement of an actuator of an optical member G2 of the optical apparatus in FIG. 1. FIGS. 4A to 4C are sectional views taken along a line IV—IV in FIG. 3. FIGS. 5A to 5C are sectional views taken along a line V—V in FIG. 3. FIG. 6 is a longitudinal sectional view showing another arrangement of the actuator of the optical member G2. FIG. 7 is a longitudinal sectional view showing portions around a solid-state image sensing element of the optical apparatus in FIG. 1. FIG. 8 is an exploded perspective view showing portions around the solid-state image sensing element of the optical apparatus in FIG. 1. FIG. 9 is an exploded perspective view showing portions (on the lower surface side of the board) around the solid-state image sensing element of the optical apparatus in FIG. 1. FIG. 10 is a longitudinal sectional view showing another example of how a glass member for protecting the image sensing surface of the solid-state image sensing element is mounted. FIG. 11 is a longitudinal sectional view showing still another example of how the glass member for protecting the image sensing surface of the solid-state image sensing element is mounted. FIG. 12 is a block diagram showing the arrangement of the optical apparatus in FIG. 1. FIG. 13 is a graph showing in-focus characteristics in a focusing operation. FIG. 14 is a graph showing zoom tracking curves.

As shown in FIG. 1, the optical apparatus includes a board 1 having an upper surface on which a photographing optical system and a mechanical system are mounted. A plurality of opening portions 1a, 1b, and 1c are formed in the board 1. The opening portion 1a is sealed with a sealing member such as a glass member to allow light beams to pass therethrough and prevent dust and the like from entering a part storage space formed between the board 1 and a shield case 49.

The photographing optical system mounted on the board 1 includes a stop unit 30 for adjusting the light amount of an object and guided through the opening portion 1a, a plurality of prism-like optical members G1, G2, G3, and G4, each consisting of a glass or plastic material and having a sculptured surface as a reflecting surface, and a solid-state image sensing element 2 for receiving light emerging from the optical member G4 and converting it into an electrical signal.

As shown in FIG. 2, the stop unit 30 has two aperture blades 31 and 32 which are point-symmetrical with an optical axis K coinciding with the axis of the opening portion 1a. The aperture blades 31 and 32 are designed to rotate about shafts 33 and 34 respectively arranged therefor. The shaft 33 of the aperture blade 31 is rotatably inserted into a positioning hole 37 formed in the board 1. The shaft 34 of the aperture blade 32 is rotatably inserted into a positioning hole 41 in the board 1. As the aperture blades 31 and 32 rotate, the aperture changes to adjust the light amount. The position of the aperture regulated by the rotation of the aperture blades 31 and 32 coincides with the optical axis K.

The aperture blades 31 and 32 respectively have permanent magnets 35 and 36 each serving as part of an actuator. These permanent magnets 35 and 36 are also used as magnetic scales for detecting the positions of the aperture blades 31 and 32. The permanent magnets 35 and 36 are magnetized such that the magnets are disposed in a direction perpendicular to the rotational direction of the aperture blades 31 and 32 and in a direction perpendicular to the board 1.

A coil 38, a yoke 39, and a position sensor 40 are disposed on the board 1 to oppose the permanent magnet 35. A coil 42, a yoke 43, and a position sensor 44 are disposed on the board 1 to oppose the permanent magnet 36.

As will be described later, the yoke 39 is fitted in a recess portion (not shown) formed in the board 1 to be integrated therewith.

The permanent magnet 35, the coil 38, and the yoke 39 cooperate to constitute an actuator for driving the aperture blade 31. When a current is supplied to the coil 38 while a magnetic flux is passing between the permanent magnet 35 and the yoke 39, this actuator rotates the permanent magnet 35, i.e., the aperture blade 31, about the shaft 33 owing to the interaction between the magnetic flux and the current. The position sensor 40 is constituted by a Hall sensor. This Hall sensor detects a change in the magnetic field of the permanent magnet 35 upon rotation of the aperture blade 31. The detection value obtained by the position sensor 40 is used as a controlled variable for controlling the rotational amount of the aperture blade 31 to obtain a predetermined f-number.

The permanent magnet 36, the coil 42, and the yoke 43 cooperate to constitute an actuator for driving the aperture blade 32. Similar to the coil 42, the position sensor 44 is constituted by a Hall sensor for detecting a change in the magnetic field of the permanent magnet 36 upon rotation of the aperture blade 32.

Note that the permanent magnets 35 and 36 may be constituted by plastic magnets, and the plastic magnets may be integrally formed as portions of the aperture blades 31 and 32.

The optical members G1, G2, G3, and G4 have the same function as that of a lens group formed by combining a plurality of spherical lenses such that, for example, light incident through the opening portion 1a and the stop unit 30 is reflected a plurality of number of times within the optical member G1 and guided into the optical member G2.

The optical member G1 is fixed on the board 1. The optical member G1 has a pair of shafts G1a for positioning with respect to the board 1. By fitting the shafts G1a in the corresponding opening portions 1b of the board 1, the optical member G1 is positioned/fixed on the board 1. In this embodiment, the optical member G1 is positioned/fixed on the board 1 by fitting the shafts G1a in the corresponding opening portions 1b. However, the optical member G1 may be positioned first with respect to the board 1 by a positioning means (not shown), and the board 1 and the optical member G1 may be then fixed to each other with an adhesive.

The optical members G2 and G3 are optical members which are moved parallel to the upper surface of the board 1 in a predetermined direction (the longitudinal direction of the board 1) to perform a zooming (focal length adjustment) operation and a focusing (focus adjustment) operation.

The optical member G2 is fixed to a moving base 3 with an adhesive. The moving base 3 is made of a high-permeability material such as iron in a flat form. A portion of an actuator for moving the moving base 3 parallel to the board 1 in a predetermined direction, a position detection unit for detecting the moving direction of the moving base 3, and a position regulation unit for guiding the moving direction of the moving base 3 and regulating its moving position are disposed on the moving base 3.

In this embodiment, as shown in FIGS. 1 and 3 to 5C, a permanent magnet 5 as a portion of the actuator, a magnetic scale 7 as the position detection unit, and a groove portion 9 having a V-shaped cross-section within a plane perpendicular to the moving direction of the moving base 3 and a groove portion 11 in the form of a recess, which constitute the position regulation unit, are disposed on the moving base 3. The permanent magnet 5 is constituted by two pairs of magnets magnetized in a direction perpendicular to the moving direction of the optical member G2. Each magnet is disposed in a direction parallel to the board 1.

A coil 17 and a yoke 19, which constitute an actuator together with the moving base 3 and the permanent magnet 5, are disposed on the board 1. As shown in FIG. 3, a portion of the coil and the yoke 19 are fitted in a recess portion 1e formed in the board 1.

A magnetic force from the magnetic scale 7 is detected by a position sensor 21 constituted by an MR sensor or a Hall sensor. This position sensor 21 is disposed on the board 1 to oppose the magnetic scale 7.

Rail portions 13 and 14 for guiding the moving direction of the moving base 3 and regulating its moving position are disposed at positions on the board 1 to oppose the groove portions 9 and 11, respectively. Grooves each having a V-shaped cross-section within a plane perpendicular to the moving direction of the moving base 3 are formed in the rail portions 13 and 14. Balls 46 are inserted between the groove portions 9 and 11 and the corresponding rail portions 13 and 14.

In the actuator constituted by the moving base 3, the permanent magnet 5, the coil 17, and the yoke 19, when a current is supplied to the coil 17, a driving force is generated owing to the interaction between a magnetic circuit (to be described later) and the current, and the moving base 3, i.e., the optical member G2, is moved along the optical axis (in a direction perpendicular to the drawing surface in FIG. 3) by this driving force. More specifically, as shown in FIG. 5B, the magnetic path indicated by the dotted line is formed between the permanent magnet 5, the moving base 3 having a permeability, and the yoke 19. When a current is supplied to the coil 17 in the magnetic path between the permanent magnet 5 and the yoke 19, the moving base 3, i.e., the optical member G2, is moved in the direction indicated by the arrow in FIG. 5B by a driving force generated by the interaction between the magnetic force and the current. By changing the flowing direction of the current, the moving direction of the moving base 3 is changed. For example, the moving base 3 can be moved from the position indicated in FIG. 5B to the position indicated in FIG. 5A and to the position indicated in FIG. 5C.

While the moving base 3 is moving, an attracting force based on the magnetic force is acting between the permanent magnet 5 and the yoke 19. The moving base 3 and the balls 46 are therefore in tight contact without any backlash. When the moving base 3 moves in the direction indicated in FIG. 4A, the balls 46 rotate clockwise. When the moving base 3 moves in the direction indicated in FIG. 4C, the balls 46 rotate counterclockwise. During this movement, the posture of the moving base 3 is stably held with respect to the rail portion 13 through the balls 46. In addition, since the balls 46 rotate while the moving base 3 is moving, the rolling friction acting on the contact surfaces between the balls 46 and the moving base 3 and the rail portion 13 is negligibly small as compared with the sliding friction acting on the contact portions between the guide pins and the lens holding members in the prior art. The load based on friction during movement of the optical member G2 can be reduced. As the moving base 3 moves, the magnetic field of the magnetic scale 7 changes. This change is read by the position sensor 21. The detection value from the position sensor 21 is used to control the movement of the moving base 3.

Although this embodiment uses the permanent magnet 5 constituted by two pair of magnets arranged in the direction parallel to the board 1, permanent magnets 51 and 52, each magnetized in a direction perpendicular to the optical axis, may be used, and these permanent magnets 51 and 52 may be fixed to a back yoke 53, as shown in FIG. 6. With this arrangement, a magnetic path concentrates in the smallest spatial gaps between the lower surfaces of the permanent magnets 51 and 52 and the yoke 19, thereby stabilizing the driving force and the magnetic path.

Similarly, the optical member G3 is fixed to a moving base 4 with an adhesive. The moving base 4 has the same arrangement as that of the moving base 3. A permanent magnet 6 as a portion of an actuator, a magnetic scale 8 as a position detection unit, and a groove portion 10 having a V-shaped cross-section within a plane perpendicular to the moving direction of the moving base 4 and a groove portion 12 in the form of a recess, which constitute a position regulation unit, are disposed on the moving base 4.

A coil 18 and A yoke 20 which constitute an actuator together with the moving base 4 and the permanent magnet 6 are disposed on the board 1. As will be described later, the yoke 20 is constituted by an iron base which is fitted in an opening portion (not shown) formed in the board 1 to be integrated with the board 1.

The actuator constituted by the moving base 4, the permanent magnet 6, the coil 18, and the yoke 20 performs the same operation as that performed by the actuator constituted by the permanent magnet 5, the coil 17, and the yoke 19.

The magnetic force of the groove portion 9 is detected by a position sensor 22 constituted by an MR sensor, a Hall sensor, or the like. This position sensor 22 is disposed on the board 1 to oppose the groove portion 9.

Rail portions 15 and 16 for guiding the moving direction of the moving base 4 and regulating its moving position are disposed at positions on the board 1 to oppose the groove portions 10 and 12, respectively. Grooves each having a V-shaped cross-section within a plane perpendicular to the moving direction of the moving base 4 are formed in the rail portions 15 and 16. Balls 47 are inserted between the groove portions 10 and 20 and the corresponding rail portions 15 and 16. As the moving base 4 moves, the optical member G3 moves in a predetermined direction. The frictional forces generated between the groove portions 10 and 12 and the corresponding rail portions 15 and 16 during movement of the moving base 4 are reduced owing to the rolling movement of the balls 47.

In this embodiment, the optical members G2 and G3 and the moving bases 3 and 4 are fixed to each other with an adhesive. However, the optical members G2 and G3 may be formed by insert molding or outsert molding with respect to the moving bases 3 and 4 such that the optical members G2 and G3 are integrally formed with the moving bases 3 and 4.

The optical member G4 is fixed to the board 1 with an adhesive. The optical member G4 is disposed on the board 1 such that the optical axis of light emerging from the member coincides with the axis of the opening portion 1c of the board 1. An optical filter (not shown) for removing unnecessary high-frequency components and infrared rays contained in an object image is bonded to the optical member G4. Note that this optical filter may be integrally formed with the optical member G4 by deposition.

In the optical system constituted by the optical members G1, G2, G3, and G4, light incident through the opening portion 1a of the board 1 and the stop unit 30 is reflected by the optical member G1 in a direction parallel to the upper surface of the board 1, the reflected light is guided to the optical member G4 by the optical members G2 and G3, and the light then emerges from the optical member G4 in a direction perpendicular to the upper surface of the board 1.

The light emerging from the optical member G4 is guided to the solid-state image sensing element 2 through the opening portion 1c of the board 1.

As shown in FIGS. 1 and 7 to 9, the solid-state image sensing element 2 is mounted on the lower surface of the board 1. As shown in FIG. 8, the solid-state image sensing element 2 has a plurality of terminals 904 including an terminal for outputting accumulated signals and a terminal for receiving timing pulses and the like. The terminals 904 are disposed on the image sensing surface 905 side of the solid-state image sensing element 2. The solid-state image sensing element 2 is disposed on the lower surface side of the board 1 such that the optical axis of the image sensing surface 905 coincides with the axis of the opening portion 1c of the board 1. The terminals 904 are directly connected to terminals 907 disposed on the lower surface of the board 1 by soldering or the like, and hence are not easily influenced by noise and the like.

The solid-state image sensing element 2 is sealed from the lower surface side with a resin member 903. With this resin member 903, the solid-state image sensing element 2 is protected, and its mounting strength with respect to the board 1 increases.

The opening portion 1c of the board 1 is covered with a glass member 50. The glass member 50 is disposed between the optical member G4 and the board 1. The glass member 50 protects the image sensing surface 905 of the solid-state image sensing element 2.

In this embodiment, the glass member 50 for protecting the image sensing surface 905 is disposed between the board 1 and the optical member G4. However, as shown in FIG. 10, a glass member 902 for protecting the image sensing surface 905 of the solid-state image sensing element 2 may be fitted in an opening portion 901 of the board 1. With this arrangement, the glass member 902 does not protrude from the upper surface of the board 1 so that an increase in the size of the board 1 near the solid-state image sensing element 2 along the direction of thickness can be suppressed. Consequently, the overall thickness of the apparatus can be decreased.

As shown in FIG. 11, instead of using the glass member 50, a portion of the optical member G4 may be fitted in the opening portion 901 of the board 1 so that the optical member G4 can also serve as a glass member for protecting the image sensing surface 905 of the solid-state image sensing element 2. In addition, the optical member G4 can be easily positioned to the solid-state image sensing element 2.

Furthermore, this embodiment uses the solid-state image sensing element 2 having the terminals 904 formed on its image sensing surface side. However, the embodiment may use an assembly obtained by mounting the solid-state image sensing element 2 on a board such as a ceramic board in advance. This assembly has electrodes to be connected to the terminals 904 of the solid-state image sensing element 2, and these electrodes can be directly connected to the electrodes on the lower surface of the board 1.

As shown in FIG. 1, a plurality of circuit elements 45a and 45b are mounted on the board 1 in addition to the above parts constituting the photographing optical system. The circuit elements 45a include elements constituting drive circuits for the actuators for the moving bases 3 and 4 on which the optical members G2 and G3 are mounted, the actuator for the moving base 3, and the respective positions sensors. The circuit elements 45b include elements constituting a drive circuit for the solid-state image sensing element 2 and a video signal processing circuit.

The board 1 has connectors 48 for connecting the circuit elements 45a and 45b to external circuits.

The shield case 49 is mounted on the board 1. The shield case 49 is formed in a box-like shape by using, for example, an iron plate having an inner surface painted in black.

This shield case 49 shields the parts mounted on the board 1 against external light. In addition, even if external light enters the space between the board 1 and the shield case 49, since inner surface reflection is suppressed, the adverse effects of light on photographed images, i.e., ghost and flare, can be reduced. Furthermore, entrance of external dust is prevented.

The shield case 49 also shields the parts mounted on the board 1 against external electromagnetism to reduce the adverse effects of electromagnetism and the like on photographed images, i.e., noise. Since the shield case 49 also serves as a light-shielding means, a reduction in the cost and size of the apparatus can be attained.

The shield case 49 is formed into a box-like shape to cover the surface of the board 1. This arrangement minimizes an increase in the size of the board 1 in the direction of thickness, and does not interfere with a decrease in the thickness of the apparatus.

A procedure for assembling the optical apparatus of this embodiment will be described next.

In the first step, parts to be fixed are disposed on the board 1. The parts to be fixed include the solid-state image sensing element 2, the optical members G1 and G4, the coils 17 and 18 and the yokes 19 and 20 which constitute the actuators for the optical members G2 and G3, the rail portions 13, 14, 15, and 16, the position sensors 21 and 22, the coils 38 and 42 and the yokes 39 and 43 of the stop unit 30, the position sensors 40 and 44, and the circuit elements 45a and 45b.

The solid-state image sensing element 2 is fixed to the lower surface of the board 1 with a solder, an adhesive, or the like, and the terminals 904 of the solid-state image sensing element 2 are electrically connected to the terminals 907 of the board 1.

The glass member 50 is mounted on the board 1 to cover the opening portion 1a, and the optical member G4 is fixed to the upper surface of the board 1. The optical member G4 is fixed to the board 1 with an adhesive or the like.

After the optical member G4 is mounted, the shafts G1a of the optical member G1 are fitted in the corresponding opening portions 1b. As a result, the optical member G1 is positioned on the board 1.

Subsequently, other parts to be fixed are sequentially positioned and fixed to the board 1 with a solder, an adhesive, or the like. The coils 17 and 18, the yokes 19 and 20, the position sensors 21 and 22, the coils 38 and 42, the yokes 39 and 43, the position sensors 40 and 44, and the circuit elements 45a and 45b are connected to a wiring pattern formed on the board 1.

Upon completion of the first step, mounting of the parts on the board 1 and electrical connection of the coils, the position sensors, and the like for drive control on movable members such as the aperture blades 31 and 32 of the stop unit 30, the moving bases 3 and 4 on which the optical members G2 and G3 are mounted, and the like are completed. As described above, since the parts to be fixed, including the solid-state image sensing element 2, which need to be electrically connected to the board 1, are electrically connected to the board 1 with a solder or the like without the mediacy of lead wires and a flexible printed board, the assembly step required for electric wiring can be omitted, resulting in a reduction in cost.

The second step is then executed. In the second step, the aperture blades 31 and 32 as movable members are mounted on the board 1. More specifically, the shaft 33 of the aperture blade 31 is inserted into the hole 37 in the board 1. Similarly, the shaft 34 of the aperture blade 32 is inserted into the hole in the board 1.

The third step is executed. In the third step, the optical members G2 and G3 constituting the photographing optical system and the movable members constituting the actuators for the optical members are mounted. The moving bases 3 and 4 are mounted on the rail portions 13, . . . , 16 through the balls 46 and 47. The optical members G2 and G3 are positioned on the moving bases 3 and 4.

The fourth step is executed. In the fourth step, the shield case 49 is mounted. The shield case 49 is placed on the board 1 to cover its upper surface, and is fixed by soldering corresponding portions to ground patterns on the board 1.

Upon completion of the fourth step, all the parts are mounted on the board 1.

As described above, the assembly process can be simplified without using any complicated, expensive part called a housing for holding an optical system such as lenses in the prior art. A low-cost photographing optical system can therefore be provided.

In addition, since the above members and parts are arranged on the flat board 1, the positions and postures of the respective parts can be easily determined such that an increase in the dimension of the board 1 in the direction of thickness is minimized. Consequently, a low-profile optical apparatus can be easily obtained.

Furthermore, since the respective optical members, the regulation units for the optical members, the stop unit 30, and the respective position sensors are arranged on the board 1 on which the solid-state image sensing element 2 is mounted, the position precision of each part can be improved.

This embodiment exemplifies the photographing optical system constituted by the optical members G1, G2, G3, and G4. In a photographing optical system constituted by a lens group based on a refraction optical system as in the prior art, or a photographing optical system additionally having a lens group based on a refraction optical system, it is possible to dispose these optical systems on a substrate or a moving base to be movable.

The electrical arrangement of this embodiment will be described next with reference to FIG. 12. FIG. 12 is a block diagram showing the arrangement of the optical apparatus in FIG. 1.

As shown in FIG. 12, the optical apparatus has a photographing optical system 601. The photographing optical system 601 includes a stop unit G12 (the stop unit 30 in FIG. 1) for regulating the amount of incident light, the optical member G2 which changes its position to change the image magnification, the optical member G3 which changes its position to perform focus adjustment, and the optical member G4 whose position is fixed and on which an optical filter for removing unnecessary high-frequency components and infrared rays contained in an object image is formed.

Light emerging from the optical member G4 is incident on the solid-state image sensing element 2. The incident light is then converted into an electrical signal by the solid-state image sensing element 2. The solid-state image sensing element 2 is driven by an image sensing element drive circuit 604. The image sensing element drive circuit 604 amplifies a timing signal generated by a clock circuit 603 and drives the solid-state image sensing element 2 by using the amplified signal. The timing at which the clock circuit 603 generates a timing signal is controlled by a CPU 616.

The electrical signal output from the solid-state image sensing element 2 is supplied to a front end processing circuit 605. The front end processing circuit 605 amplifies the electrical signal from the solid-state image sensing element 2 and performs a CDS process and the like. The signal from the front end processing circuit 605 is converted into a digital signal by an A/D converter 606. This digital signal is supplied to a process circuit 607. The process circuit 607 variously processes the digital signal to form a video signal.

The video signal from the process circuit 607 is supplied to a display unit 609 through a D/A converter 608, to an analog output 611 through a D/A converter 610, to a memory 612, to a digital output 613, to an in-focus information detection circuit 614, and to a luminance information detection circuit 615.

The display unit 609 is constituted by an LCD for displaying an image based on the video signal. The analog output 611 is, for example, an analog signal output terminal for outputting a signal to a TV monitor. The memory 612 records the video signal. The digital output 613 is, for example, a terminal for outputting a signal to an external recording medium.

The in-focus information detection circuit 614 detects the in-focus state of the object on the basis of the video signal from the process circuit 607. The detection result is supplied to the CPU 616.

The luminance information detection circuit 615 detects the brightness information of the object on the basis of the video signal from the process circuit 607. The detection result is supplied to the CPU 616.

The optical member G2 is moved in a predetermined direction by an actuator 617. As shown in FIG. 1, this actuator 617 is constituted by the moving base 3, the permanent magnet 5, the coil 17, and the yoke 19. Drive control on the actuator 617 is performed by a control signal from an actuator control circuit 619. This control signal is amplified by a drive circuit 620 and supplied to the actuator 617. The position of the optical member G2 is detected by a position detector 618. The position detector 618 is constituted by the position sensor 21 in FIG. 1. The signal from the position detector 618 is amplified by an amplifier 621 and supplied to the CPU 616 through an A/D converter 622.

The optical member G3 is moved by an actuator 623 in a predetermined direction. As shown in FIG. 1, this actuator 623 is constituted by the moving base 4, the permanent magnet 6, the coil 18, and the yoke 20. Drive control on the actuator 623 is performed by a control signal from an actuator control circuit 625. This control signal is amplified by a drive circuit 626 and supplied to the actuator 623. The position of the optical member G3 is detected by a position detector 624. The position detector 624 is constituted by the position sensor 22 in FIG. 1. The signal from the position detector 624 is amplified by an amplifier 627 and supplied to the CPU 616 through an A/D converter 628.

The stop unit G12 is moved by an actuator 629 to set a predetermined aperture. As shown in FIG. 1, the actuator 629 is constituted by the aperture blades 31 and 32, the permanent magnets 35 and 36, the coils 38 and 42, and the yokes 39 and 43. Drive control on the actuator 629 is performed by a control signal from an actuator control circuit 631. This control signal is amplified by a drive circuit 632 and supplied to the actuator 629. The aperture of the stop unit G12, i.e., the rotational positions of the aperture blades 31 and 32, are detected by a position detector 630. The position detector 630 is constituted by the position sensors 40 and 44 in FIG. 1. Signals from the position detector 630 are amplified by an amplifier 633 and supplied to the CPU 616 through an A/D converter 634.

The CPU 616 controls the drive circuits 620 and 630 on the basis of detection results from the detectors 618, 624, and 630, a detection result from the in-focus information detection circuit 614, and a detection result from the luminance information detection circuit 615.

An operation designation signal from an operation unit 635 is supplied to the CPU 616. The operation unit 635 generates an operation designation signal corresponding to an operation performed by a photographer.

This circuit arrangement can be divided into the photographing optical system 601, an actuator drive circuit 636, and a video signal processing circuit 637 for processing an electrical signal from the solid-state image sensing element 2. The actuator drive circuit 636 includes the actuator control circuits 619, 625, and 631. The actuator drive circuit 636 is arranged in the circuit element 45a in FIG. 1. The video signal processing circuit 637 is arranged in the circuit element 45b together with the image sensing element drive circuit 604 and the clock circuit 603.

Although the CPU 616, the in-focus information detection circuit 614, and the luminance information detection circuit 615 can be mounted on the board 1, their mounting positions are not specifically limited.

The operation of the optical apparatus will be described next.

When the photographer operates the operation unit 635, an instruction to start a photographing operation is input to the CPU 616. Upon reception of this instruction, the CPU 616 turns on the power supply for each circuit, and instructs the clock circuit 603 to output a timing signal for the solid-state image sensing element 2. The timing signal output from the clock circuit 603 is amplified into a signal capable of driving the solid-state image sensing element 2 by the image sensing element drive circuit 604. Light incident on the solid-state image sensing element 2 is converted into an electrical signal by this drive signal. This electrical signal is supplied to the front end processing circuit 605. The front end processing circuit 605 performs processes such as a CDS process, a nonlinear process, and signal amplification for the electrical signal from the solid-state image sensing element 2. The output signal from the front end processing circuit 605 is converted into a digital signal by the A/D converter 606. The digital signal is supplied to the process circuit 607. The process circuit 607 performs various processes for visualizing the digital signal from the A/D converter 606, e.g., primary color separation and white balance adjustment, gamma correction, aperture correction, and generation of luminance and color difference signals. This video signal is converted into an analog signal by the D/A converter 608. An image represented by the analog signal is displayed on the display unit 609. The video signal is recorded as a digital signal or output to an external equipment, as needed.

The operation of the photographing optical system 601 will be described next.

In general, focusing is automatically performed. Upon reception of a video signal from the process circuit 607, the in-focus information detection circuit 614 detects the amount of high-frequency components (to be referred to as in-focus information hereinafter) of the input video signal. As shown in FIG. 13, the in-focus information exhibits the maximum level when the photographing optical system 601 is in the in-focus state with respect to an object, and exhibits lower levels as the photographing optical system 601 is defocused.

The CPU 616 detects a change in in-focus information while moving the optical member G3, and controls the actuator control circuit 625 to move the optical member G3 to the position where the in-focus information exhibits the maximum level. The CPU 616 outputs a focus lens moving signal to make the actual lens position follow a target lens position calculated from the in-focus information. Position information detected by the position detector 624 is amplified by the amplifier 627 and digitalized by the A/D converter 628. The resultant data is input to the CPU 616. The CPU 616 then calculates the actual lens position of the optical member G3.

The actuator control circuit 625 generates an actuator control signal on the basis of the focus lens moving signal. The actuator control signal is amplified into a signal capable of driving the actuator 623 by the drive circuit 626 to drive the actuator 623. As the actuator 623 is driven, the optical member G3 is moved to perform focusing.

Zooming is performed when the photographer operates the operation unit 635. The CPU 616 calculates the target position of the optical member G2 in accordance with an instruction input from the operation unit 635. The current lens position of the optical member G2 is detected by the position detector 618. The output signal from the position detector 618 is amplified by the amplifier 621 and input to the A/D converter 622. The output signal from the position detector 618, which is digitalized by the A/D converter 622, is input to the CPU 616 to calculate the lens position information of the optical member G2. The CPU 616 outputs a moving signal for the optical member to make the actual lens position follow the target lens position. The actuator control circuit 619 generates an actuator control signal on the basis of the moving signal for the optical member G2. The actuator control signal is amplified into a signal capable of driving the actuator by the drive circuit 620 to drive the actuator 617. As the actuator 617 is driven, the optical member G2 is moved to perform zooming.

As in this embodiment, in the inner focus zoom lens, in order to perform zooming while an object is in focus, the positions of the optical members G2 and G3 must move on a predetermined curve (zoom tracking curve). FIG. 14 shows zoom tracking curves. Referring to FIG. 14, "0.6 m", "1.2 m", and "1.0 m" indicate object distances.

The current object distance is calculated on the basis of the position information of the optical member G2, obtained by the position detector 618, and the position information of the optical member G3, obtained by the position detector 624. While a zooming operation is performed, the target position of the optical member G3 is calculated on the basis of the tracking curve corresponding to the current object distance. Similar to the optical member G2, the current lens position of the optical member G3 is detected by the position detector 624. The output signal from the position detector 624 is amplified by the amplifier 627 and input to the A/D converter 628. The output signal from the position detector 624, which is digitalized by the A/D converter 628, is input to the CPU 616 to calculate the lens position information of the optical member G3. The CPU 616 outputs a focus lens moving signal to make the actual lens position follow the target lens position. The actuator control circuit 625 generates an actuator control signal on the basis of the focus lens moving signal. The actuator control signal is amplified into a signal capable of driving the actuator by the drive circuit 626 to drive the actuator 623, thereby moving the optical member G3. Even while zooming is performed, therefore, an object image is formed on the solid-state image sensing element 2 without any image blur.

In performing exposure amount adjustment, the actuator 629 controls the stop unit G12 to change the aperture with respect to the photographing optical system 601. Generally, this exposure amount adjustment is automatically performed. A video signal from the process circuit 607 is input to the luminance information detection-circuit 615. The luminance information detection circuit 615 detects the brightness (to be referred to as luminance information hereinafter) of the object image from the input video signal. The current position of the stop unit G12 is detected by the position detector 630. The output signal from the position detector 630 is amplified by the amplifier 633 and input to the A/D converter 634. The output signal from the position detector 630, which is digitalized by the A/D converter 634, is input to the CPU 616 to obtain the stop position information of the stop unit G12. The CPU 616 calculates a proper exposure amount on the basis of the input luminance information of the object image, and also calculates a target stop position from the proper exposure amount and the current stop position information. The CPU 616 then outputs a stop moving signal to make the actual stop position follow the target stop position. The actuator control circuit 631 generates an actuator control signal on the basis of the stop moving signal. The actuator control signal is amplified into a signal capable of driving the actuator 629 by the drive circuit 632 to drive the actuator 629. As the actuator 629 is driven, the stop unit G12 is moved to perform luminous amount adjustment.

Figure 15:
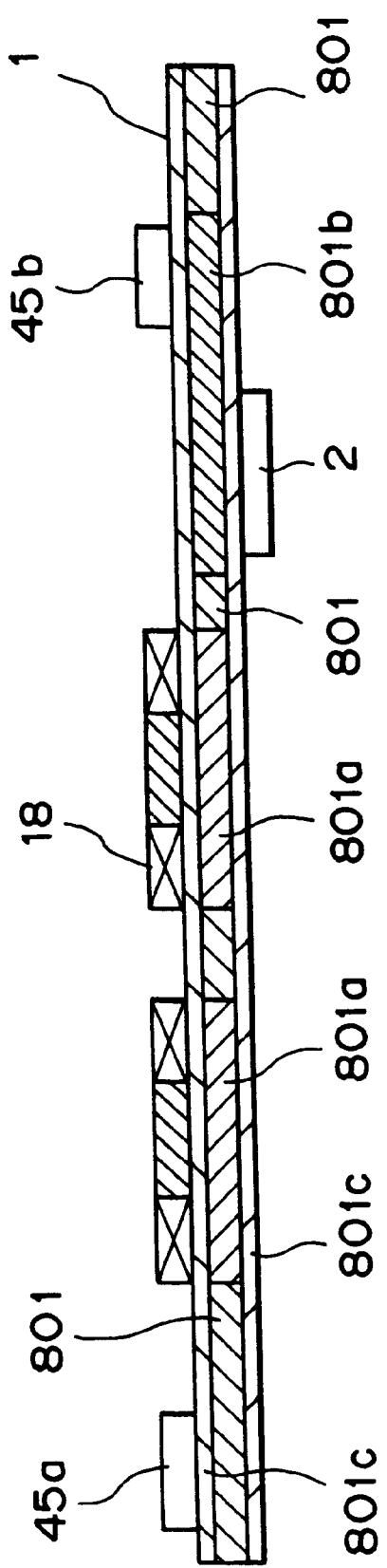
FIG. 15 is a longitudinal sectional view showing the arrangement of the board of the image sensing apparatus in FIG. 1.
Figure 16:
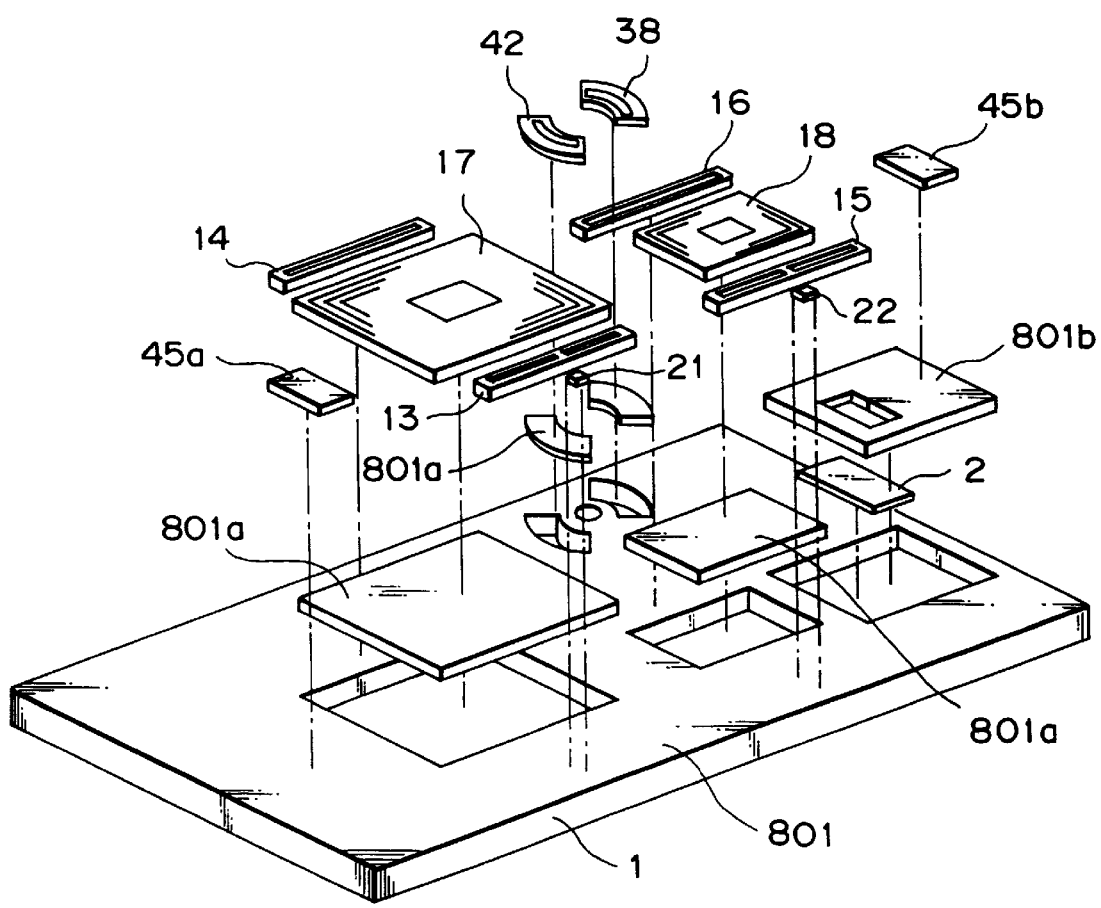
FIG. 16 is an exploded perspective view partly showing a process in a method of manufacturing the board of the image sensing apparatus in FIG. 1.

The arrangement of the board 1 and a manufacturing method therefor will be described next with reference to the accompanying drawings. FIG. 15 is a longitudinal sectional view showing the arrangement of the board of the optical apparatus in FIG. 1. FIG. 16 is an exploded perspective view partly showing a process in the method of manufacturing the board of the optical apparatus in FIG. 1.

As shown in FIG. 15, the board 1 comprises a ceramic base 801, iron bases 801a, and an aluminum base 801b. A ceramic material with excellent dimensional stability and heat dissipation property is used for the ceramic base 801. The ceramic base 801 is a base forming the frame of the board 1. Iron with a high permeability is used for the iron bases 801a. The iron bases 801a constitutes yokes (corresponding to the yokes 19 and 20 in FIG. 1 and the yokes 39 and 44 in FIG. 2) partly constituting an actuator. The aluminum base 801b constitutes an image sensing drive circuit or a video signal processing circuit. Aluminum with a high heat conductivity is used for this base. Materials for these bases 801, 801a, and 801b are not limited those described above. For example, a material with a high permeability, e.g., electromagnetic soft-iron or Permalloy, may be used for the iron bases 801a. A material with a high heat conductivity, e.g., copper, may be used for the aluminum base 801b. The bases 801, 801a, and 801b each have an insulating layer 801c formed on its upper surface.

A method of manufacturing the board 1 will be described next with reference to FIG. 16.

Referring to FIG. 16, the ceramic base 801 having holes in portions corresponding to the iron bases 801a and the aluminum base 801b, the iron bases 801a, and the aluminum base 801b are prepared.

The iron bases 801a and the aluminum base 801b are respectively fitted in the holes in the ceramic base 801. The iron bases 801a and the aluminum base 801b are fixed to the ceramic base 801 with an adhesive to form one base member.

Copper foils coated with a resin are stacked on the base member. As a result, the insulating layers 801c are formed on the surfaces of the ceramic base 801, the iron bases 801a, and the aluminum base 801b, as shown in FIG. 15. Instead of using this method, a method of coating a base member with a resin for forming insulating layers, and stacking copper foils on the resin may be used as a method of forming the insulating layers 801c. However, the former method is better because it allows a continuous process.

After the insulating layers 801c are formed, surface treatments are sequentially executed, e.g., etching the copper foils to form wiring patterns, coating of a solder resist, solder plating on the exposed copper foil surfaces, and a treatment using a solder leveler.

Subsequently, the solid-state image sensing element 2, the coils 17, 18, 38, and 42, the circuit elements 45a and 45b, and the position sensors 21 and 22 are electrically connected to the wiring patterns formed on the board 1 with a solder or the like. The coils 17, 18, 38, and 42 and the rail portions 13, 14, 15, and 16 are fixed to the board 1 with an adhesive.

As described above, one member is not used as the base member of the board 1, but materials having properties suitable for characteristics required by parts to be mounted on the board 1 are used for the base member. More specifically, a ceramic base member with excellent dimensional stability including high flatness is used as the frame of the board, iron base members with a high permeability are used for the portions where the actuators are formed, and an aluminum or copper base member is used for the portion where the image sensing element drive circuit or video signal processing circuit requiring heat dissipation of the electronic parts are mounted. In this manner, optimal materials are selected for the respective portions on the board 1 to manufacture a board which can make use of the merits of the respective base members. This structure is especially effective for heat dissipation of electronic parts, and hence board deformation caused by heat generated by the electronic parts can be prevented. Consequently, a relative positional offset between each optical member and the solid-state image sensing element 2, tilting of each optical member, and the like due to deformation of the board 1 can be suppressed. Deterioration in photographed images caused by deformation of the board 1 can therefore be prevented.

In this embodiment, sheet-like coils are used, and these coils are fixed on the board 1 with an adhesive. However, similar to the patterns on the board 1, coils can be formed by etching the copper foils. In this case, although the number of turns of each coil is limited, steps such as the step of fixing the sheet coils can be omitted because the coils can be formed in the same manner as the wiring patterns. In addition, positioning of the sheet coils on the board 1 need not be performed.

Figure 17:
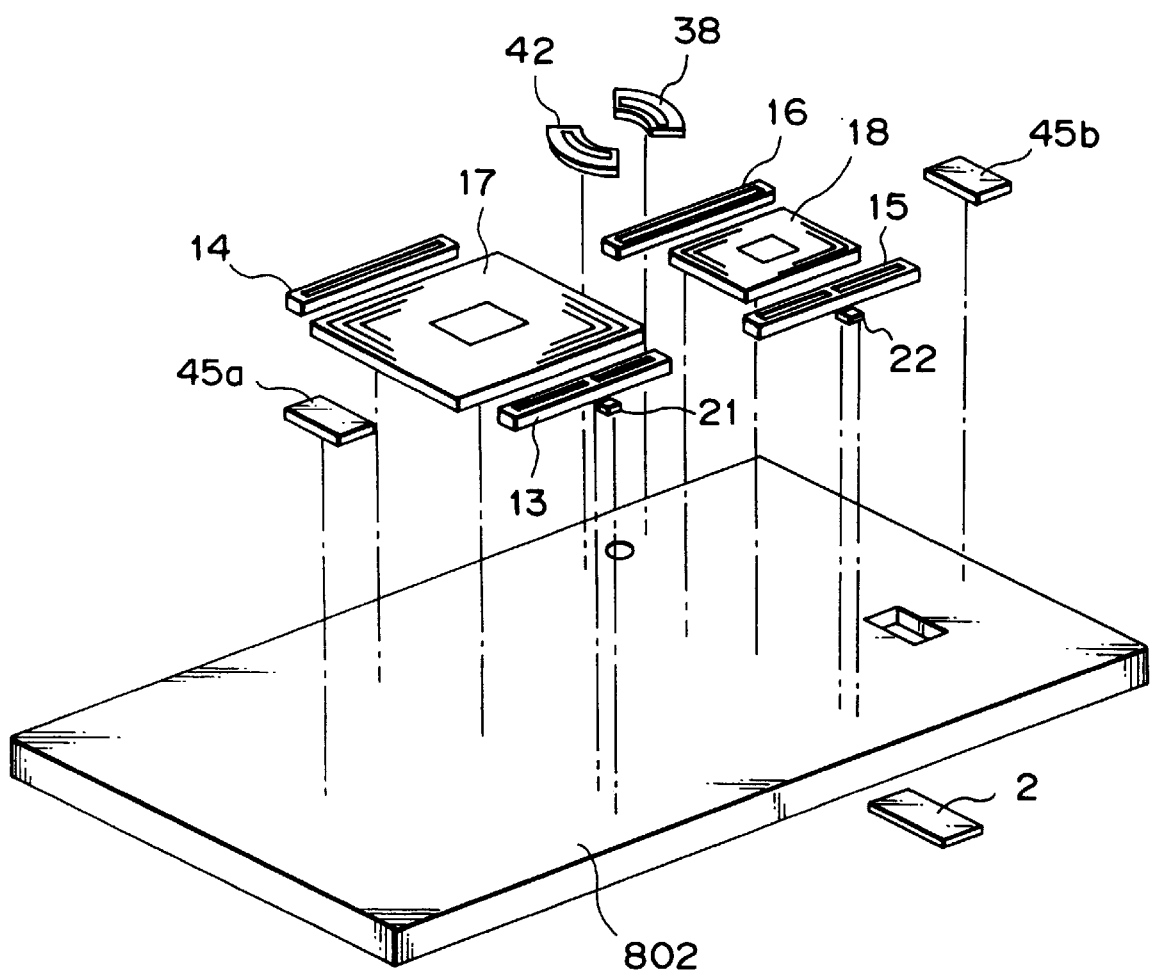
FIG. 17 is a perspective view showing another board used for the image sensing apparatus in FIG. 1.

A case wherein one member is used as the base member of a board will be described next with reference to FIG. 17. FIG. 17 is a perspective view showing another board used for the optical apparatus in FIG. 1.

A board 802 is made of a metal board having a wiring pattern formed on a metal plate through an insulating layer. The material used for the metal board is iron having a high permeability, or aluminum or copper having a good heat dissipation property, or the like. Since the insulating layer and the wiring patterns are formed in the same manner as described above, a description thereof will be omitted.

After the board 802 is prepared, the solid-state image sensing element 2 is electrically connected to the wiring pattern on the lower surface of the board 802, whereas the coils 17, 18, 38, and 42, the circuit elements 45a and 45b, and the position sensors 12 and 22 are electrically connected to the wiring patterns on the upper surface of the board 802. These wiring patterns are formed on the board 802 with a solder or the like. The coils 17, 18, 38, and 42 and the rail portions 13, . . . , 16 are fixed to the board 802 with an adhesive. According to this method, since a board can be formed by using one metal plate as a base, a board with high flatness can be formed at a low cost. In addition to these effect, the following effects (a) and (b) can be obtained in accordance with a material for a metal portion of the board.

(a) A material having a high permeability, e.g., iron:

When an optical system is to be driven by an electromagnetic drive scheme, since a portion of the board serves as a yoke, a yoke as a part need not be used. A reduction in cost can therefore be attained.

(b) A material having good heat dissipation property, e.g., aluminum:

Since heat generated around the image sensing element drive circuit, the video signal processing circuit, and the coils of the actuators can be efficiently dissipated, deformation such as warpage of the board can be prevented.

Figure 18:
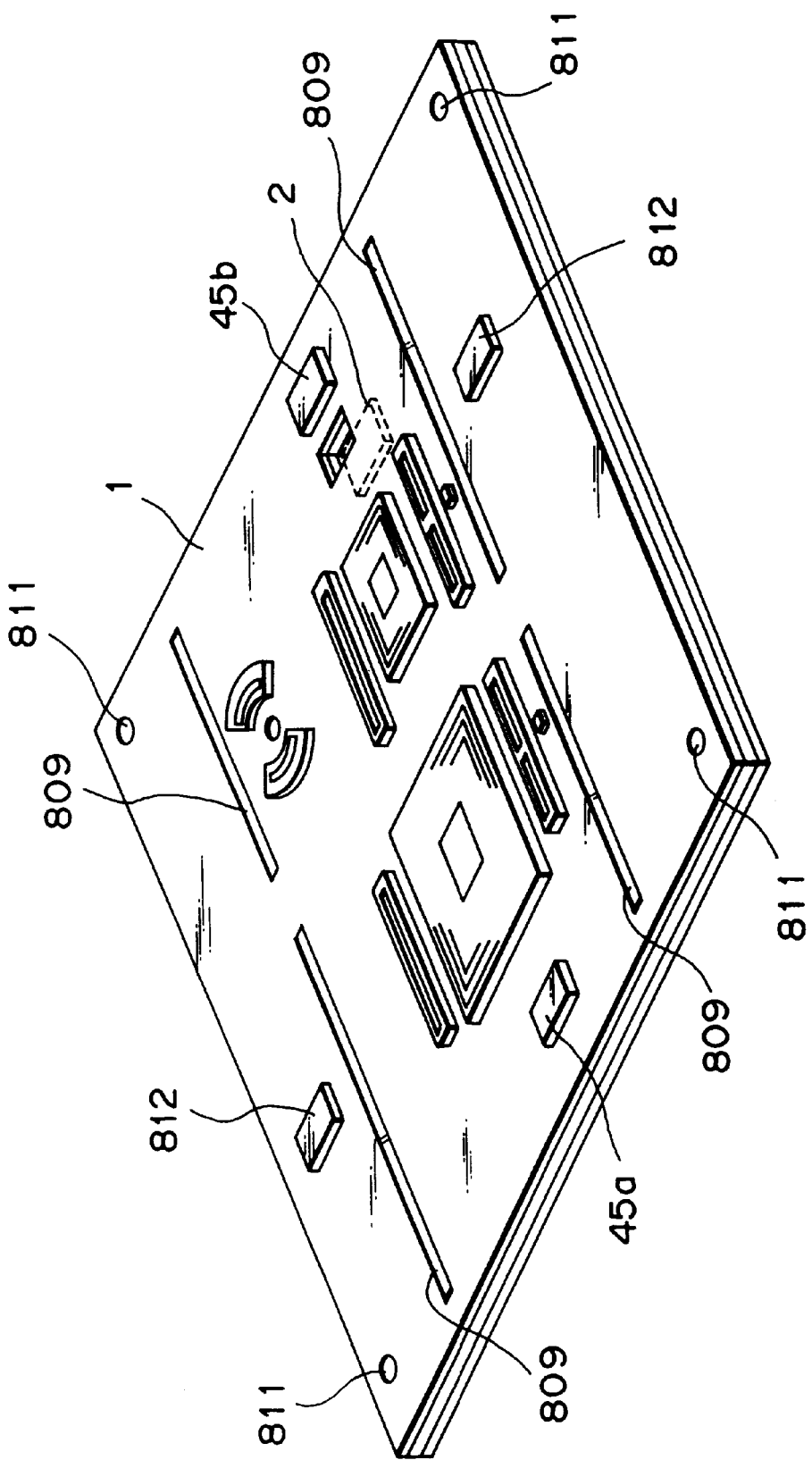
FIG. 18 is a perspective view showing still another board used for the image sensing apparatus in FIG. 1.
Figure 19:
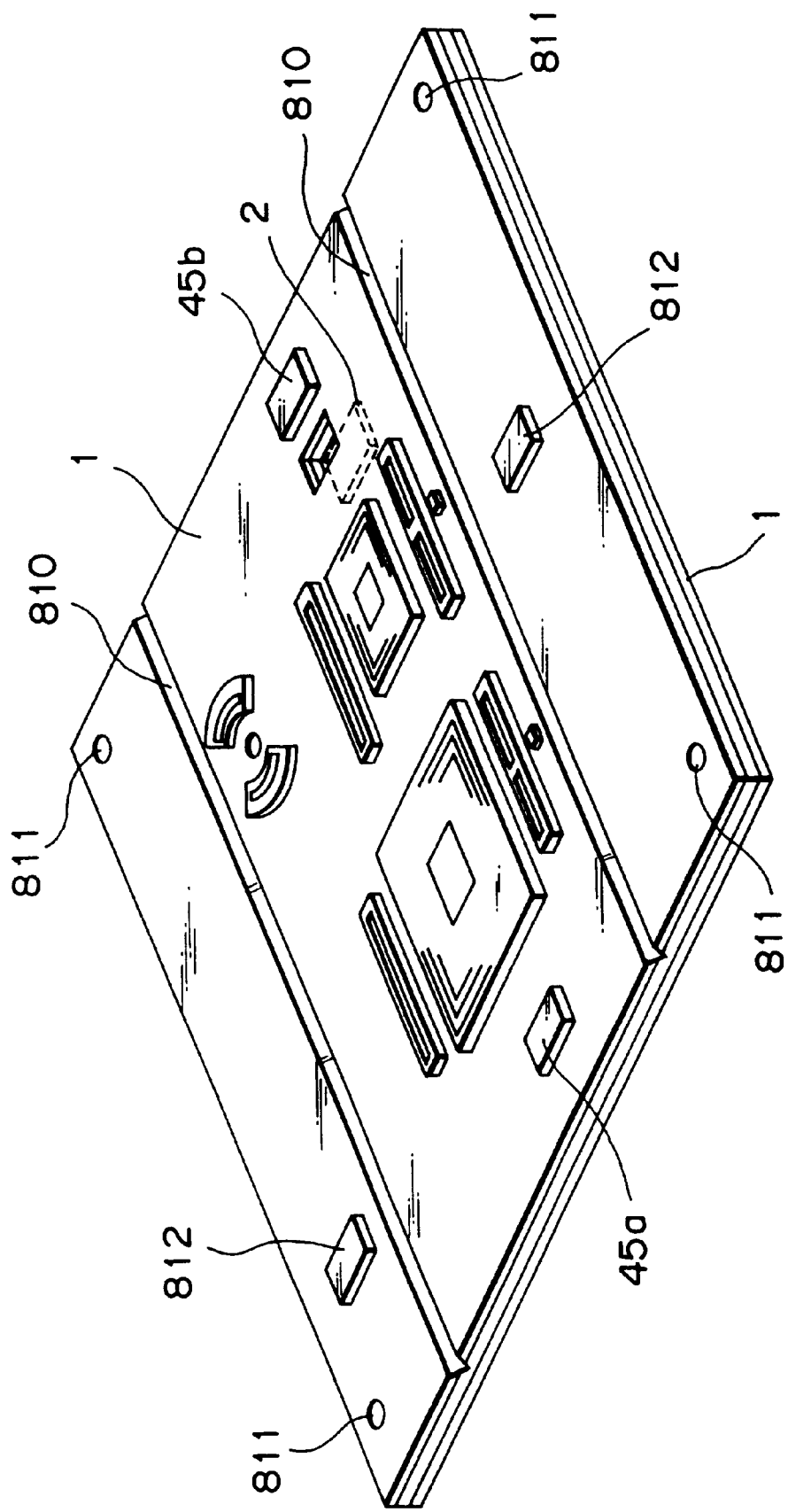
FIG. 19 is a perspective view showing still another board used for the image sensing apparatus in FIG. 1.
Figure 20:
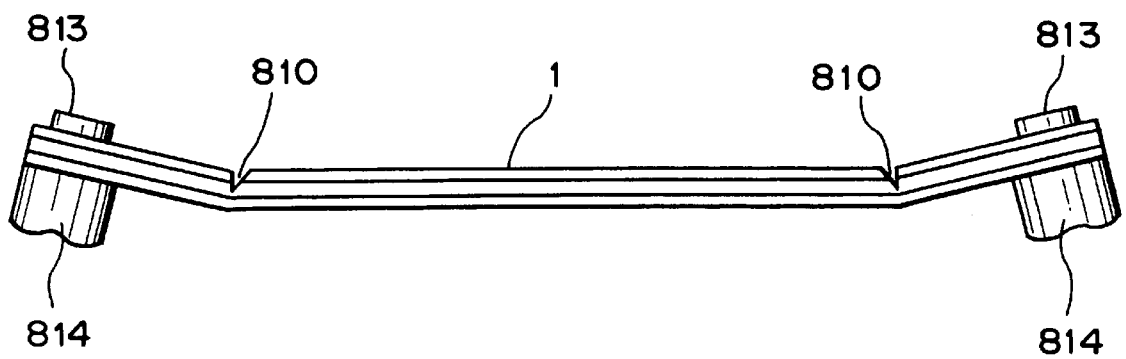
FIG. 20 is a view showing a mounted state of the board in FIG. 19.

A method of effectively preventing deformation of the board due to heat generated by electronic parts thereon and mechanical deformation of the board will be described next with reference to FIGS. 18 to 20. FIG. 18 is a perspective view showing another board used for the optical apparatus in FIG. 1. FIG. 19 is a perspective view showing still another board used for the optical apparatus in FIG. 1. FIG. 20 shows the mounted state of the board in FIG. 19.

This method includes a method of forming notched portions 809 around an electronic part 812 such as a CPU requiring heat dissipation, as shown in FIG. 18, and a method of forming V-shaped grooves 810 around the entire optical system for which the flatness of the board must be maintained, as shown in FIG. 19.

Methods of mounting the board 1 on an equipment on the basis of the above methods will be described with reference to FIGS. 18 to 20.

As shown in FIGS. 18 and 19, mounting holes 811 are formed in the four corners of the board 1 in the respective methods. A mounting area for an electronic part such as a CPU which generates a large quantity of heat on the board 1 is separated with the notched portions 809 or the V-shaped grooves 810.

These methods of mounting the board 1 will be described with reference to the board 1 shown in FIG. 19.

As shown in FIG. 20, the board 1 is fixed to a board mounting portion 814 in the equipment with screws 813 extending through the mounting holes 811.

When the board mounting portion 814 is deformed by a force outside the equipment or owing to a process precision, an external force acts on the board 1. However, only the V-shaped grooves 810 are deformed by this external force, and the remaining portion of the board 1 maintains its flatness.

The board 1 having the notched portions 809 in FIG. 18 also exhibits the same effect as described above.

A structure for absorbing thermal deformation of the board 1 in FIG. 18 will be describe next.

More specifically, when the electronic part 812 is placed in an area between the notched portion 809 and the edge portion, thermal deformation such as warpage of a portion of the board 1 around the electronic part 812, caused by heat generated by the electronic part 812, is absorbed by the notched portion 809 as in the case wherein the above mechanical deformation is absorbed by the V-shaped groove 810. An area extending inward from the notched portion 809 can maintain its flatness.

Figure 21:
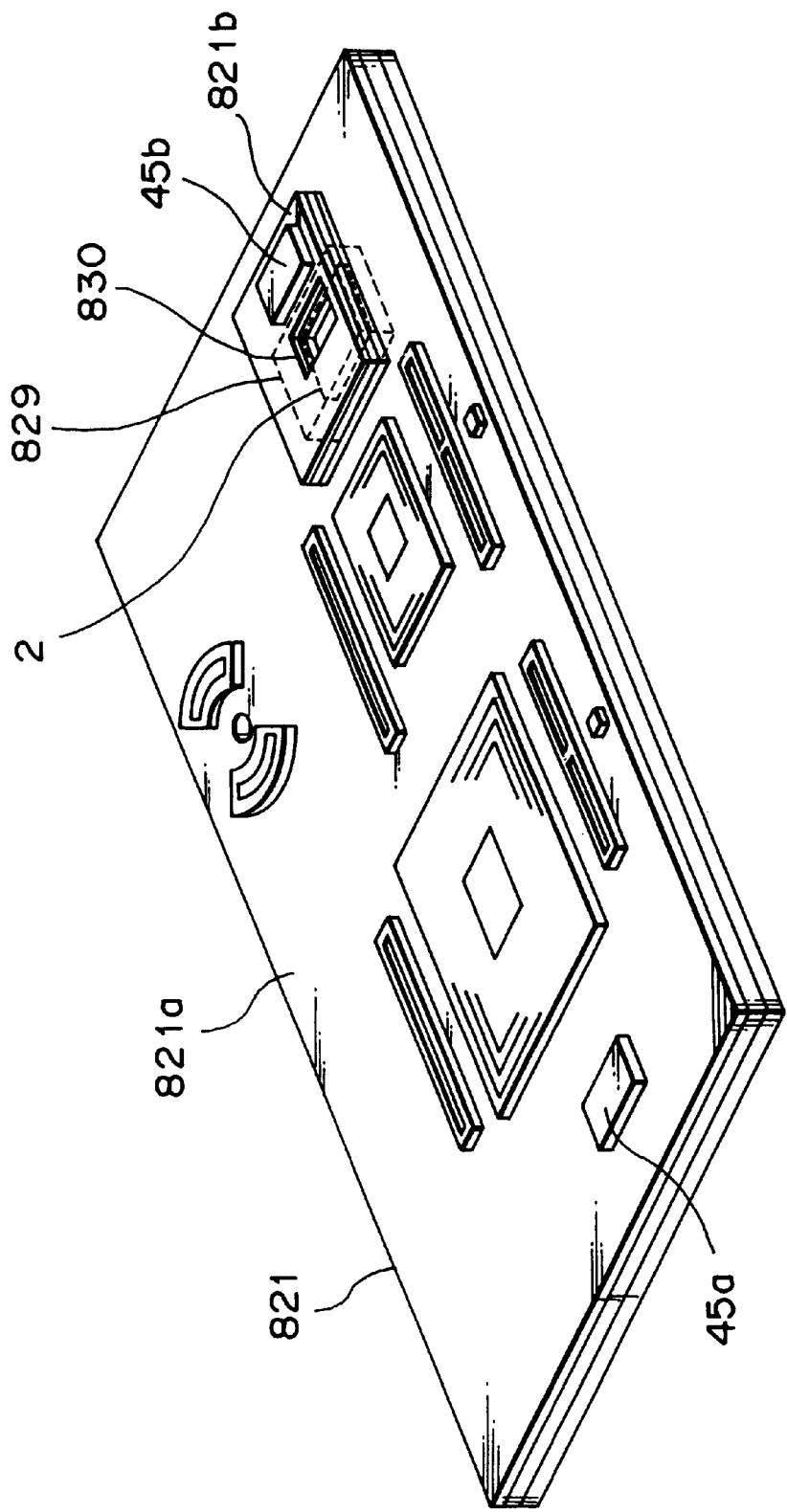
FIG. 21 is a perspective view showing still another board used for the image sensing apparatus in FIG. 1.
Figure 22:
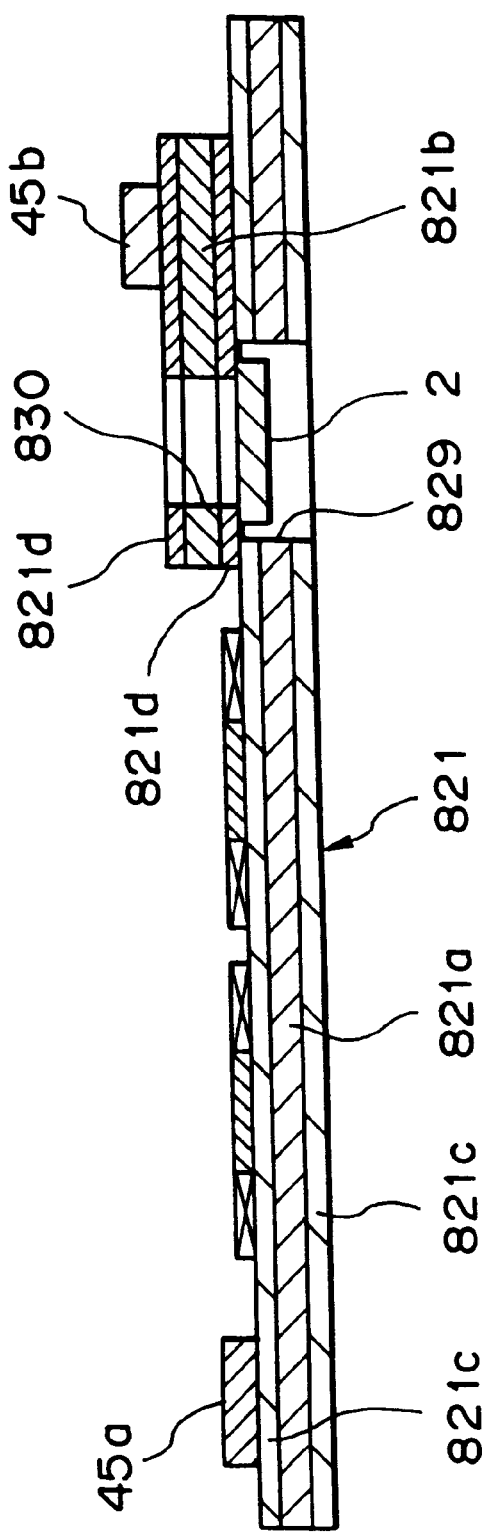
FIG. 22 is a longitudinal sectional view showing the board in FIG. 21.

Still another board arrangement will be described next with reference to FIGS. 21 and 22. FIG. 21 is a perspective view showing still another board used for the optical apparatus in FIG. 21. FIG. 22 is a longitudinal sectional view showing the board in FIG. 21.

Referring to FIGS. 21 and 22, a board 821 is constituted by two sub-boards 821a and 821b having wiring patterns formed on metal plates through insulating layers.

An iron base having a high permeability is used for the sub-board 821a on which an actuator is formed, whereas an aluminum base or the like having a high heat conductivity is used for the sub-board 821b on which an image sensing drive or a video signal processing circuit is formed. Insulating layers 821c and 821d are respectively formed on the upper surfaces of the sub-boards 821a and 821b. An coaxially extending opening portion 829 is formed in the sub-board 821a and the insulating layer 821c. An coaxially extending opening portion 830 is formed in the sub-board 821b an the insulating layer 821d. The solid-state image sensing element 2 is inserted into the opening portion 830. The solid-state image sensing element 2 is mounted on the lower surface of the sub-board 821b. Object light is incident on the solid-state image sensing element 2 through the opening portion 830.

A method of manufacturing the board 821 will be described next.

First of all, an iron base as the sub-board 821a on which an actuator is formed, and a copper or aluminum base as the sub-board 821b are prepared.

Copper foils are coated with a resin and are respectively stacked on the base members to form the insulating layers 821c and 821d on the upper surfaces of the sub-boards 821a and 821b.

After the insulating layers 821c and 821d are formed, the foils are etched to form a wiring pattern for an actuator circuit on the sub-board 821a, and a wiring pattern for an image sensing element drive circuit or video signal processing circuit on the sub-board 821b.

Subsequently, surface treatments are sequentially performed, e.g., coating of a solder resist, solder plating for the exposed copper foil surfaces, and a treatment using a solder leveler.

The sub-boards 821*a* and 821*b* are stacked through an insulating adhesive.

With the use of this board 821, the same effects as those of the board in FIG. 15 can be obtained. In addition, the sub-board 821*a* on which the actuator drive system serving as a noise source, i.e., the circuit element 45*a* and the actuator, is formed, and the sub-board 821*b* on which the circuit element 45*b* for the image sensing driving circuit or video signal processing circuit susceptible to noise and the image sensing element drive circuit or video signal processing circuit are formed can be formed on different layers on the board 821 so that the influences of noise in the board 821 can be minimized. Note that the above video signal processing circuit is equivalent to the video signal processing circuit 637 in FIG. 12, but its inner arrangement is not limited.

In manufacturing the board 821, two bases can be independently manufactured by a conventional forming method, unlike the case of the board 1 in FIG. 16 in which bases are fitted in holes formed in a base in advance to form one base. The manufacturing process can therefore be simplified, and a reduction in manufacturing cost can be attained.

(Second Embodiment)

Figure 23:
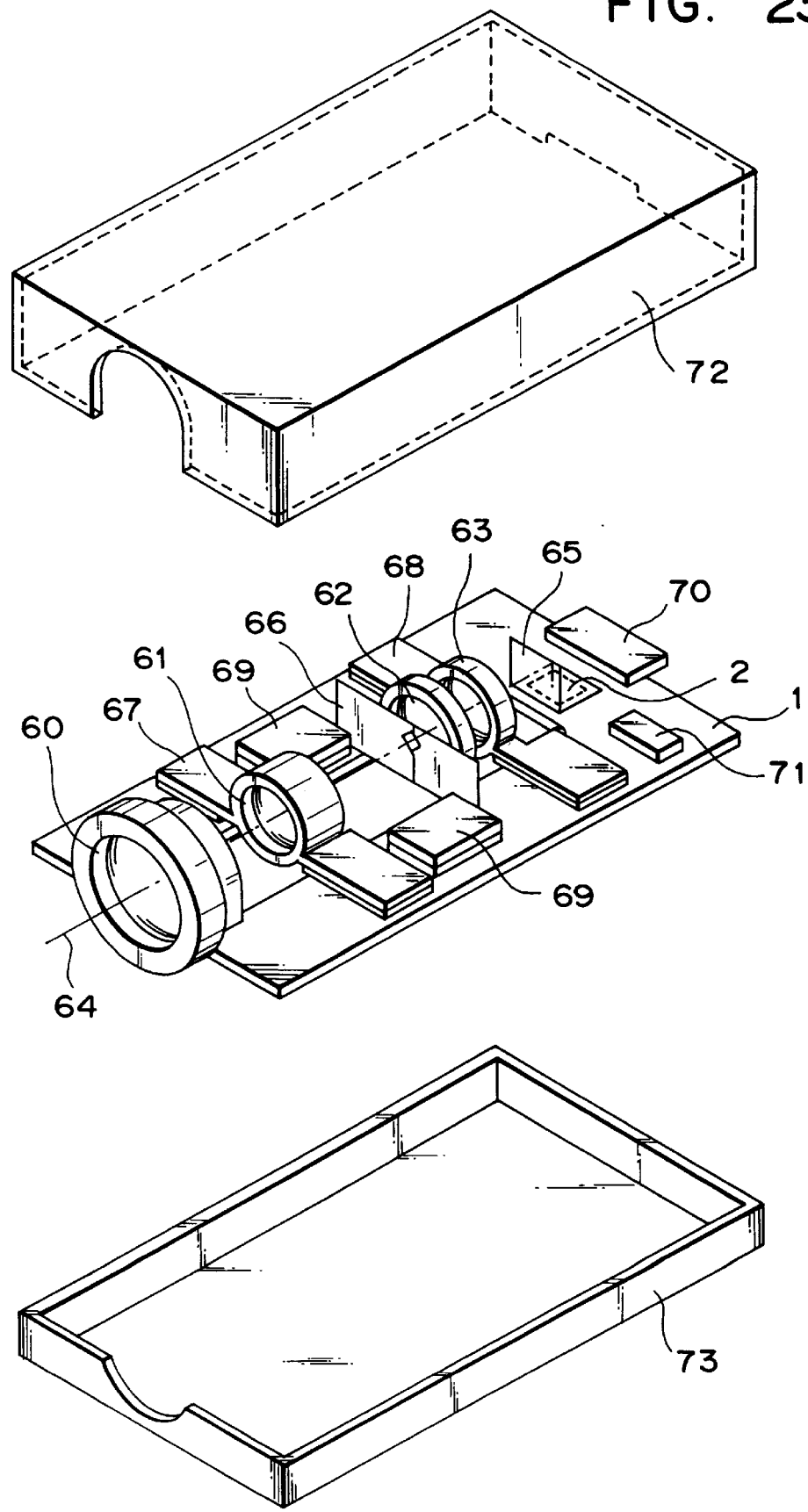
FIG. 23 is an exploded perspective view showing the arrangement of an image sensing apparatus according to the second embodiment of the present invention.
Figure 24:
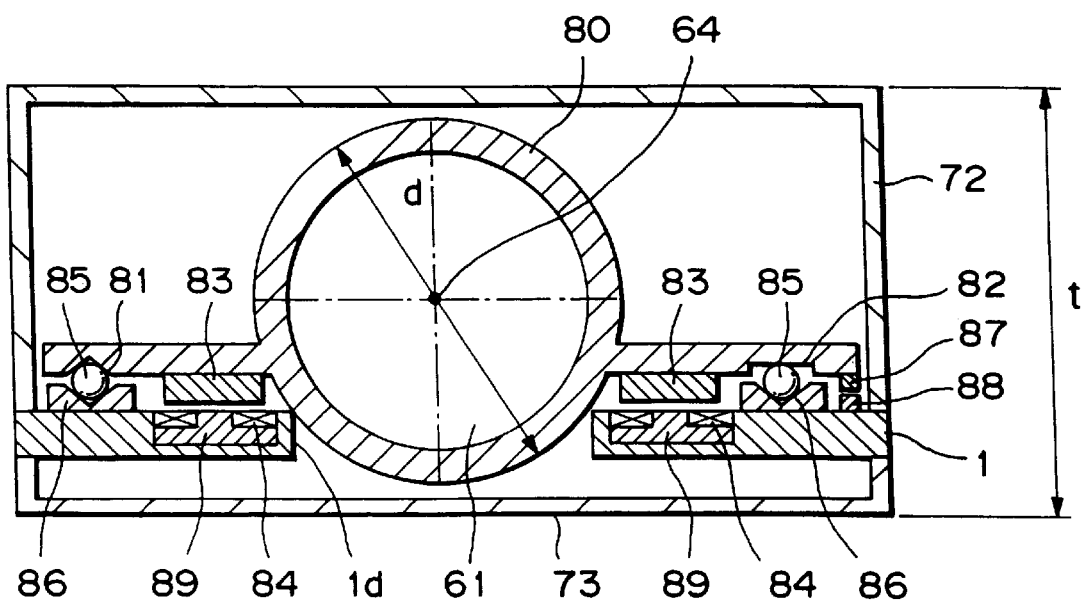
FIG. 24 is a longitudinal sectional view showing the arrangement of a drive control unit for the second optical member of the image sensing apparatus in FIG. 23.
Figure 25:
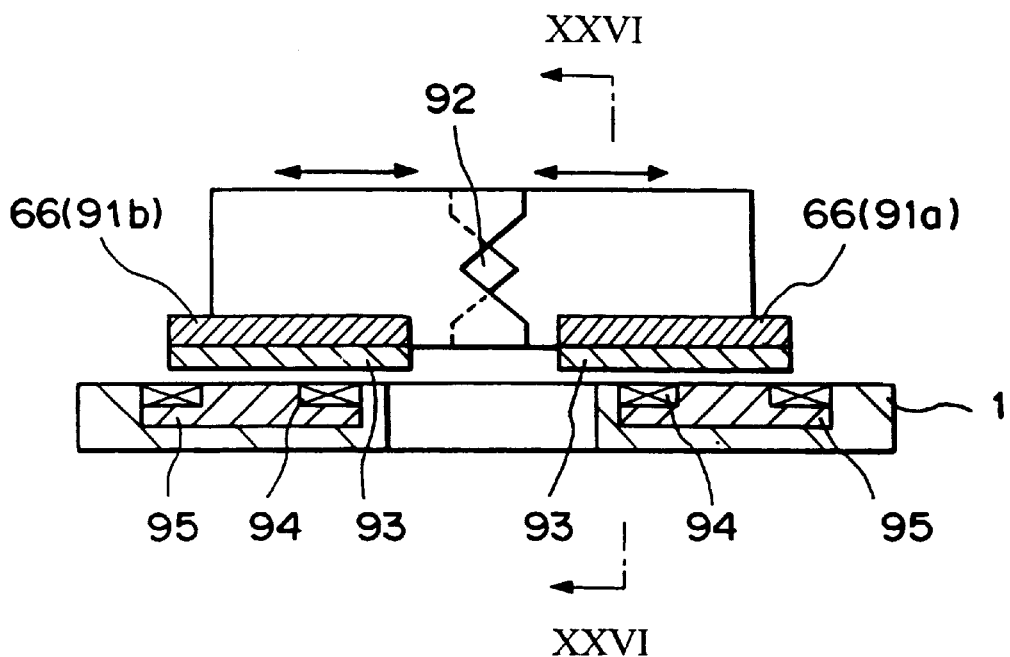
FIG. 25 is a longitudinal sectional view showing the arrangement of a drive control unit for the aperture blades of the image sensing apparatus in FIG. 23.
Figure 26:
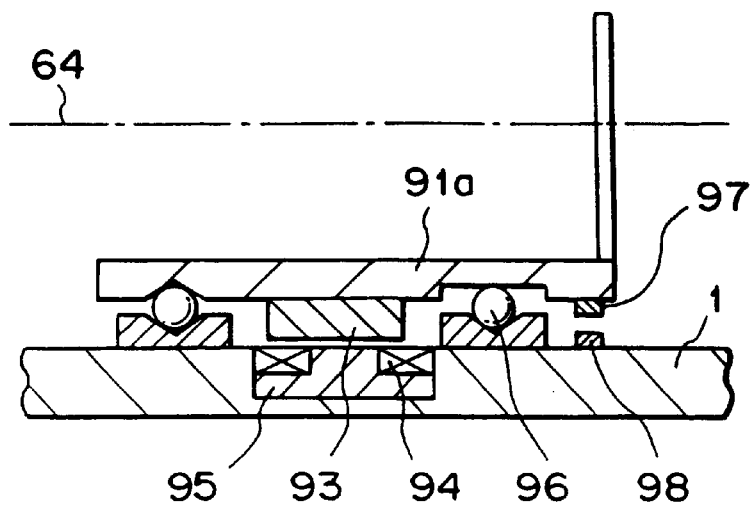
FIG. 26 is a sectional view taken along a line XXVI—XXVI in FIG. 25.

The second embodiment of the present invention will be described next with reference to FIGS. 23 to 26. FIG. 23 is an exploded perspective view showing the arrangement of an optical apparatus according to the second embodiment of the present invention. FIG. 24 is a longitudinal sectional view showing the arrangement of a drive control unit for the second optical member of the optical apparatus in FIG. 23. FIG. 25 is a longitudinal sectional view showing the arrangement of a drive control unit for the aperture blades of the optical apparatus in FIG. 23. FIG. 26 is a sectional view taken along a line XXVI—XXVI in FIG. 25.

This embodiment is an optical apparatus having a zoom lens mechanism using a refraction optical system.

As shown in FIG. 23, the optical apparatus includes a board 1 on which a solid-state image sensing element 2 is mounted. Note that the board 1 is constituted by a plurality of base members consisting of different materials, similar to the arrangement of the board in the first embodiment, and a description thereof will be omitted.

First to fourth lens groups 60 to 63 are mounted on the board 1.

The first lens group 60 is fixed to the board 1 with an adhesive. The second lens group 61 is constituted by a lens group for performing a zooming operation. This lens group is mounted on the board 1 to be movable along an optical axis 64 within a predetermined range. The third lens group 62 is fixed to the board 1 with an adhesive or the like, similar to the first lens group 60. The fourth lens group 63 is constituted by a lens group for performing a focusing operation. This lens group is mounted on the board 1 to be movable along the optical axis 64 within a predetermined range. The optical axis 64 is set to be parallel to the upper surface of the board 1. That is, since the moving directions of the second and fourth lens groups 61 and 63 are set to be parallel to the upper surface of the board 1, even if the movable ranges are long, a zoom mechanism can be realized without increasing the size in a direction perpendicular to the upper surface of the board 1.

An optical member 65 such as a triangular prism is disposed behind the fourth lens group 63. The optical member 65 serves to bend the optical axis in a direction perpendicular to the board 1 so as to form an object image on the image sensing element 2. Note that the structure for mounting the solid-state image sensing element 2 on the board 1 is the same as that in the first embodiment, and a description thereof will be omitted.

Aperture blades 66 are disposed between the second and third lens groups 61 and 62. Each aperture blade 66 is driven in a direction perpendicular to the optical axis 64 to change the aperture. With this change in aperture, the amount of object image light is adjusted.

The second lens group 61, the fourth lens group 63, and the aperture blades 66 are respectively driven and controlled by drive control units 67, 68, and 69. Each of the drive control units 67, 68, and 69 is constituted by an actuator, a position sensor, and the like.

Electronic parts 71 and connector portions 70 for connection with external circuits are mounted on the board 1. The electronic parts 71 include circuit elements for controlling the drive control units 67, 68, and 69, a circuit element for driving the solid-state image sensing element 2, a circuit element for processing a signal from the solid-state image sensing element 2, and the like.

The board 1 is stored in a box-like shield case constituted by a pair of case portions 72 and 73. For example, the case portions 72 and 73 are constituted by iron plates whose inner surfaces are painted in black to block electromagnetism and external light, suppress inner surface reflection, and prevent entrance of external dust. The case portions 72 and 73 are fixed to each other by soldering their corresponding portions to ground patterns on the board 1.

Since the box-like shield case constituted by the case portions 72 and 73 shields the parts mounted on the board 1 against light and electromagnetism in this manner, a reduction in the size and cost of the apparatus can be attained. In addition, since the shield case has the box-like shape, an increase in the size of the board 1 in the direction of thickness can be minimized.

The arrangement of the drive control unit 67 of the second lens group 61 will be described next with reference to FIG. 24.

As shown in FIG. 24, the second lens group 61 is held by an optical holding member 80. The optical holding member 80 is constituted by a frame member for supporting the second lens group 61, and a pair of plate-like support portions extending from the frame portion to be parallel to the board 1 in a direction perpendicular to the optical axis 64. A V-shaped groove 81 extending along the optical axis 64 is formed in the surface, of one support portion, which opposes the board 1, and a groove 82 having a recess-like cross-section and extending along the optical axis 64 is formed in the surface, of the other support portion, which opposes the board 1. In addition, a magnetic scale 87 extending along the optical axis 64 is mounted on the optical holding member 80. A permanent magnet 83 is mounted on the surface, of each support portion, which opposes the board 1.

An opening portion 1*d* is formed in the board 1 to prevent interference between the board 1 and the optical holding member 80. A portion of the optical holding member 80 is inserted into the opening portion 1*d* such that the optical holding member 80 is movable.

A pair of rail portions 86 in which V-shaped grooves extending along the optical axis 64 are formed, and a position sensor 88 are mounted on the board 1.

The V-shaped groove of one rail portion 86 opposes the V-shaped groove 81 of the optical holding member 80. The V-shaped groove of the other rail portion 86 opposes the groove 82 of the other rail portion 86. Balls 85 are respectively interposed between the V-shaped groove of one rail portion 86 and the V-shaped groove 81 and between the V-shaped groove of the other rail portion 86 and the groove 82.

The position sensor 88 is constituted by a sensor for detecting a magnetic force from the magnetic scale 87.

The optical holding member 80, and the permanent magnet 83 and the magnetic scale 87 which are mounted on the optical holding member 80 constitute the drive control unit 67, together with coils 84, yokes 89, the rail portions 86, the position sensor 88, and the balls 85 which are mounted on the board 1. A portion of the coil 84 and the yoke 89 are fitted in a recess portion 1f formed in the board 1.

The basic driving principle of the drive control unit 67 is the same as that in the first embodiment, and a description thereof will be omitted.

The arrangement of the drive control units 69 for the aperture blades 66 will be described next with reference to FIGS. 25 and 26.

As shown in FIG. 25, each aperture blade 66 is constituted by a corresponding one of blades 91a and 91b which are movable in directions (indicated by the arrows in FIG. 25) perpendicular to the optical axis. The blades 91a and 91b respectively have V-shaped notches. The blades 91a and 91b are disposed such that their notched portions overlap. These blades 91a and 91b cooperate to form an aperture 92. The opening area of the aperture 92 is determined by the moving amounts of the blades 91a and 91b.

As shown in FIG. 26, a V-shaped groove and a groove having a recess-like cross-section are formed in the surface, of the blade 91a, which opposes the board 1. These grooves extend in a direction perpendicular to the optical axis 64. In addition, a magnetic scale 97 extending along a direction perpendicular to the optical axis 64 is mounted on this surface. A permanent magnet 93 is mounted on the surface, of each of the blades 91a and 91b, which opposes the board 1.

A pair of coils 94 are mounted on the board 1. Each coil 94 is disposed on the board 1 to oppose a corresponding one of the permanent magnets 93. A yoke 95 is disposed below each coil 94.

A pair of rail portions in which V-shaped grooves extending in a direction perpendicular to the optical axis 64 are formed, and a position sensor 98 are mounted on the board 1.

One rail portion is disposed such that its V-shaped groove opposes the V-shaped groove of the blade 91a. The other rail portion is disposed such that its V-shaped portion opposes the groove, of the blade 91a, which has the recess-like cross-section. Balls 96 are respectively interposed between the V-shaped groove of one rail portion and the V-shaped groove of the blade 91a and between the V-shaped groove of the other rail portion and the groove, of the blade 91a, which has the recess-like cross-section.

The position sensor 98 is constituted by a sensor for detecting a magnetic force from the magnetic scale 97.

The blades 91a and 91b, and the permanent magnets 93 and the magnetic scales 97 which are mounted on the blades 91a and 91b constitute the drive control units 69 for the aperture blades 66, together with the coils 94, the yokes 95, the rail portions, the position sensor, and the balls which are mounted on the board 1.

When the aperture blades 66 are driven by the drive control units 69, since the blades 91a and 91b are much lighter than the permanent magnets 93, the center of gravity of the movable portion constituted by the permanent magnets 93 and the blades 91a and 91b is near the permanent magnets 93, and a driving force from the actuator acts on the center of gravity. The blades 91a and 91b can therefore be driven in a stable state.

As described above, in the second embodiment, since the actuator portion and the board 1 are arranged so as not to overlap the optical system in the direction of thickness, a thickness d of the optical holding member 80 or the second lens group 61 as an optical system (in this case, the thickness d corresponds to the diameter of the optical holding member 80) determines an overall thickness t of the optical apparatus. That is, the thickness of the optical apparatus can be decreased. A portion of the optical holding member 80 is movably inserted into the opening portion 1d of the board 1, and the yoke 89 and the like are fitted in the recess portion 1f of the board 1. With this arrangement, an increase in the overall thickness t of the optical apparatus due to the optical holding member 80, the yoke 89, and the like can be suppressed, and the thickness of the optical apparatus can be further decreased.

In addition, since the optical members, the mechanical members such as actuators and drive circuits therefor, and the electric members are arranged on the board 1 on which the solid-state image sensing element 2 is mounted, a complicated, expensive part called a lens barrel for holding optical systems such as lenses as in the prior art need not be used, and the assembly process can be simplified, thereby providing a low-cost optical apparatus.

Since the mechanical members, the optical members, and the electrical members are arranged on the board 1 which extends two-dimensionally, the positions and postures of the respective parts can be easily determined such that an increase in the size of the board 1 in the direction of thickness is minimized. A low-profile optical apparatus can therefore be provided.

Furthermore, when the respective optical members for the solid-state image sensing element 2, the regulation units for the optical members, and the stop unit are arranged on the board, the position precision of each component can be improved.

In each embodiment described above, one substrate is used. However, a plurality of divided substrates arranged on the same plane may be used. This applies to the third to fifth embodiments to be described below.

(Third Embodiment)

Figure 27:
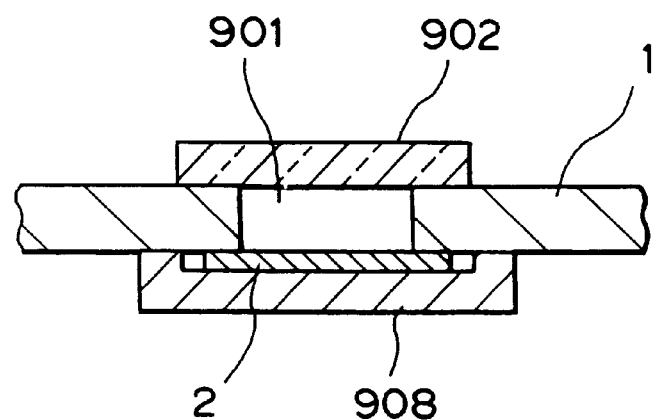
FIG. 27 is a longitudinal sectional view showing portions around the solid-state image sensing element of an image sensing apparatus according to the third embodiment of the present invention.

The third embodiment of the present invention will be described next with reference to FIG. 27. FIG. 27 is a longitudinal sectional view showing portions around a solid-state image sensing element in an image sensing apparatus according to the third embodiment of the present invention.

In this embodiment, as shown in FIG. 27, a solid-state image sensing element 2 is mounted on a ceramic base 908 in the form of a case. The base 908 also serves as a means for sealing the solid-state image sensing element 2. The base 908 is mounted on the lower surface of a board 1 such that the optical axis of the solid-state image sensing element 2 coincides with the axis of an opening portion 901 of the board 1. The base 908 is physically connected to the lower surface of the board 1. Terminals formed on the image sensing surface side of the solid-state image sensing element 2 is directly connected to terminals formed on the lower surface of the board 1.

With this arrangement, the solid-state image sensing element 2 can be sealed while a high mechanical strength is maintained.

(Fourth Embodiment)

Figure 28:
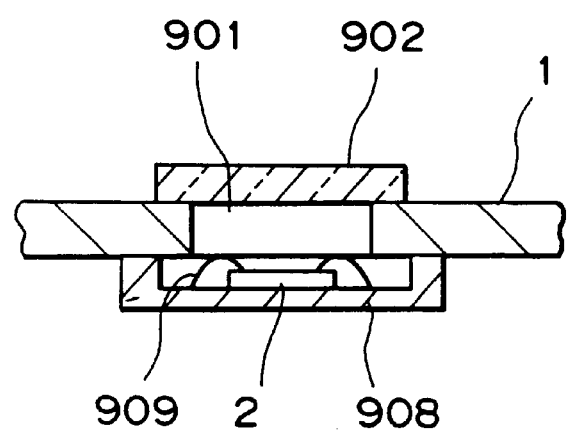
FIG. 28 is a longitudinal sectional view showing portions around the solid-state image sensing element of an image sensing apparatus according to the fourth embodiment of the present invention.
Figure 29:
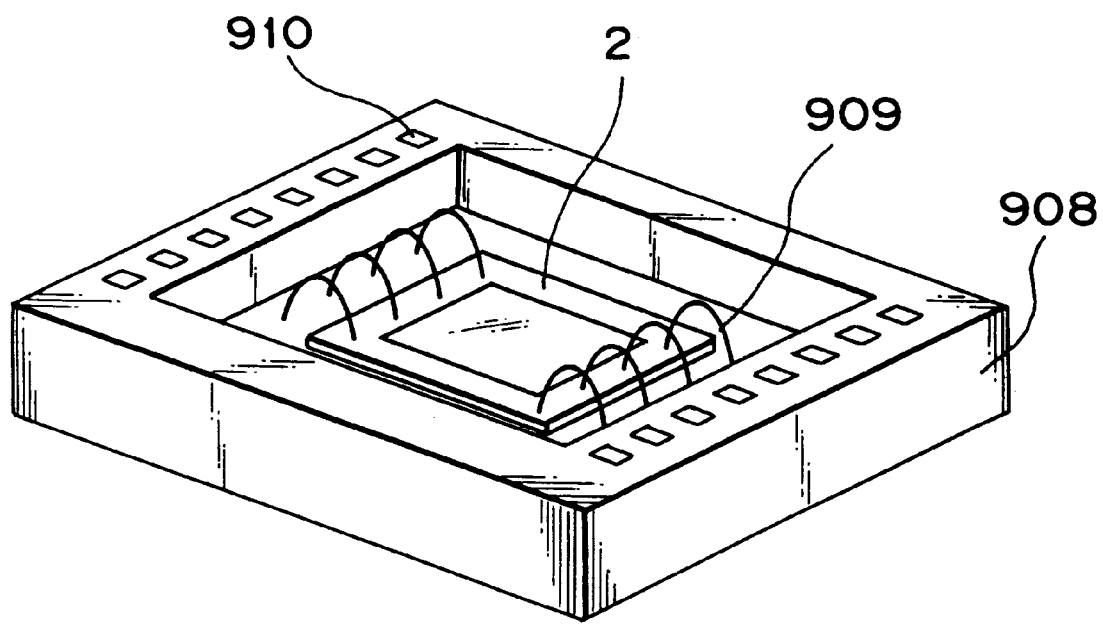
FIG. 29 is a perspective view showing the solid-state image sensing element of the image sensing apparatus according to the fourth embodiment of the present invention and a base member on which the element is mounted.
Figure 30:
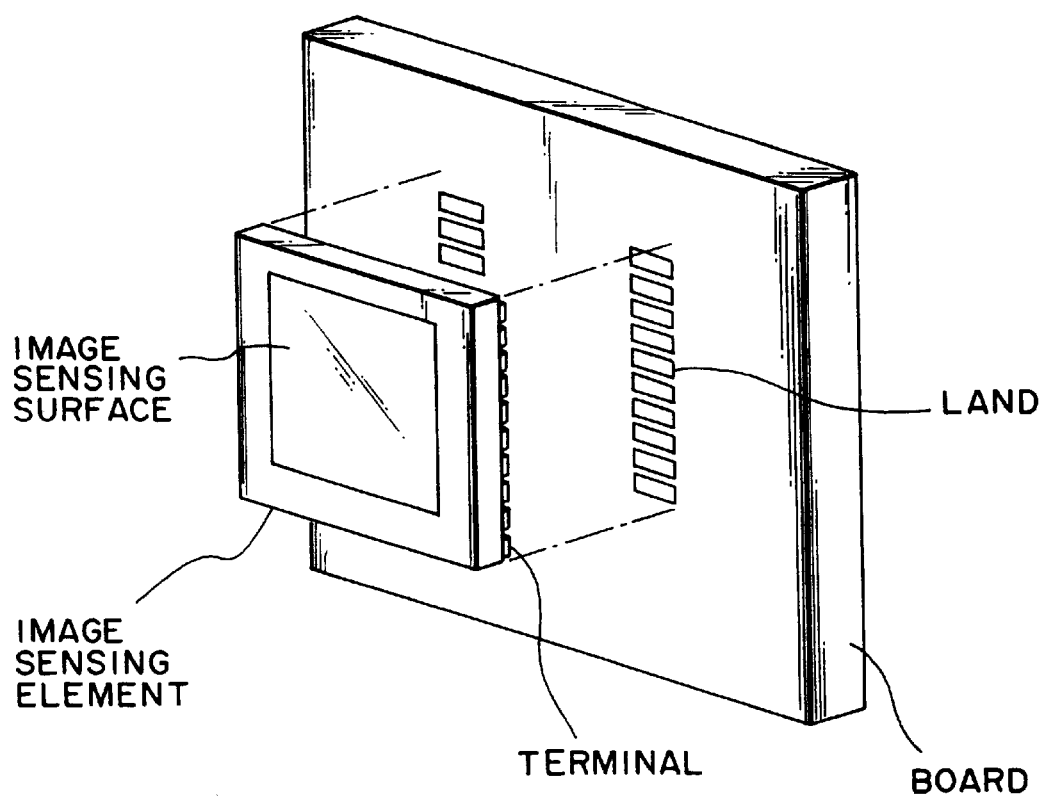
FIG. 30 is a perspective view showing a method of mounting a conventional solid-state image sensing element.
Figure 31:
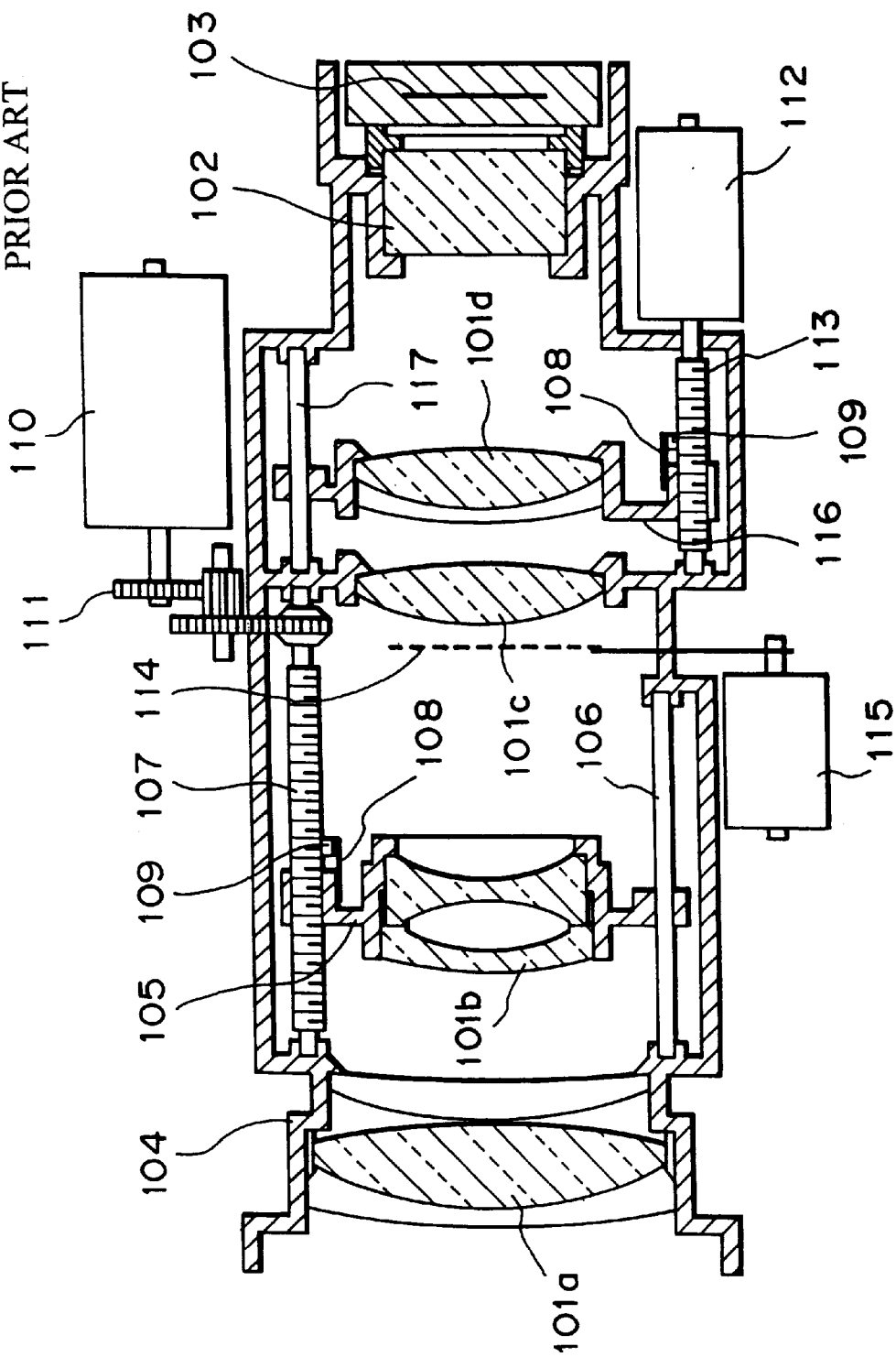
FIG. 31 is a longitudinal sectional view showing the arrangement of an image sensing apparatus using the conventional solid-state image sensing element.

The fourth embodiment of the present invention will be described next with reference to FIGS. 28 and 29. FIG. 28 is a longitudinal sectional view showing portions around a solid-state image sensing element in an image sensing apparatus according to the fourth embodiment of the present invention. FIG. 29 is a perspective view showing the solid-state image sensing element and a base member on which the element is mounted in the image sensing apparatus according to the fourth embodiment of the present invention.

In this embodiment, as shown in FIGS. 28 and 29, a solid-state image sensing element 2 is mounted on a ceramic base 908 in the form of a case. The base 908 also serves as a means for sealing the solid-state image sensing element 2. The base 908 has a plurality of terminals 910 connected to terminals formed on the image sensing surface side of the solid-state image sensing element 2 through bonding wires 909. The terminals 910 are arranged on the edge portion of the upper surface of the base 908. The base 908 is mounted on the lower surface of a board 1 such that the optical axis coincides with the axis of an opening portion 901 of the board 1. The terminals 910 are connected to terminals formed on the lower surface of the board 1.

With this arrangement, the solid-state image sensing element 2 can be easily mounted on the board 1, and the solid-state image sensing element 2 can be sealed while a high mechanical strength is maintained.

As described above, a complicated, expensive part called a housing for holding an optical system such as lenses as in the prior art need not be used, and the assembly process can be simplified, thereby providing a low-cost photographing optical system.

Since the above members and parts are arranged on the flat board 1, the positions and postures of the respective parts can be easily determined such that an increase in the size of the board 1 in the direction of thickness is minimized. As a result, a low-profile optical apparatus can be provided.

When yokes 19 and 20, yokes 39 and 43 of a stop unit 30, and the like are fitted in recess portions formed in the board 1, an increase in the size of the board 1 in the direction of thickness due to the yokes 19 and 20, the yokes 39 and 43 of the stop unit 30, and the like can be suppressed, thereby realizing a lowerprofile optical apparatus.

Since the optical members, the regulation units for the optical members, the stop unit 30, and the position sensors are arranged on the board 1 on which the solid-state image sensing element 2 is mounted, the position precision of each component can be improved.

This embodiment exemplifies the photographing optical system constituted by optical members G1, G2, G3, and G4. However, in a photographing optical system constituted by a lens group of refraction optical systems, or a photographing optical system additionally including a lens group of refraction optical systems, the optical systems can be arranged directly on the board or on moving bases to be movable.

(Fifth Embodiment)

Figure 32:
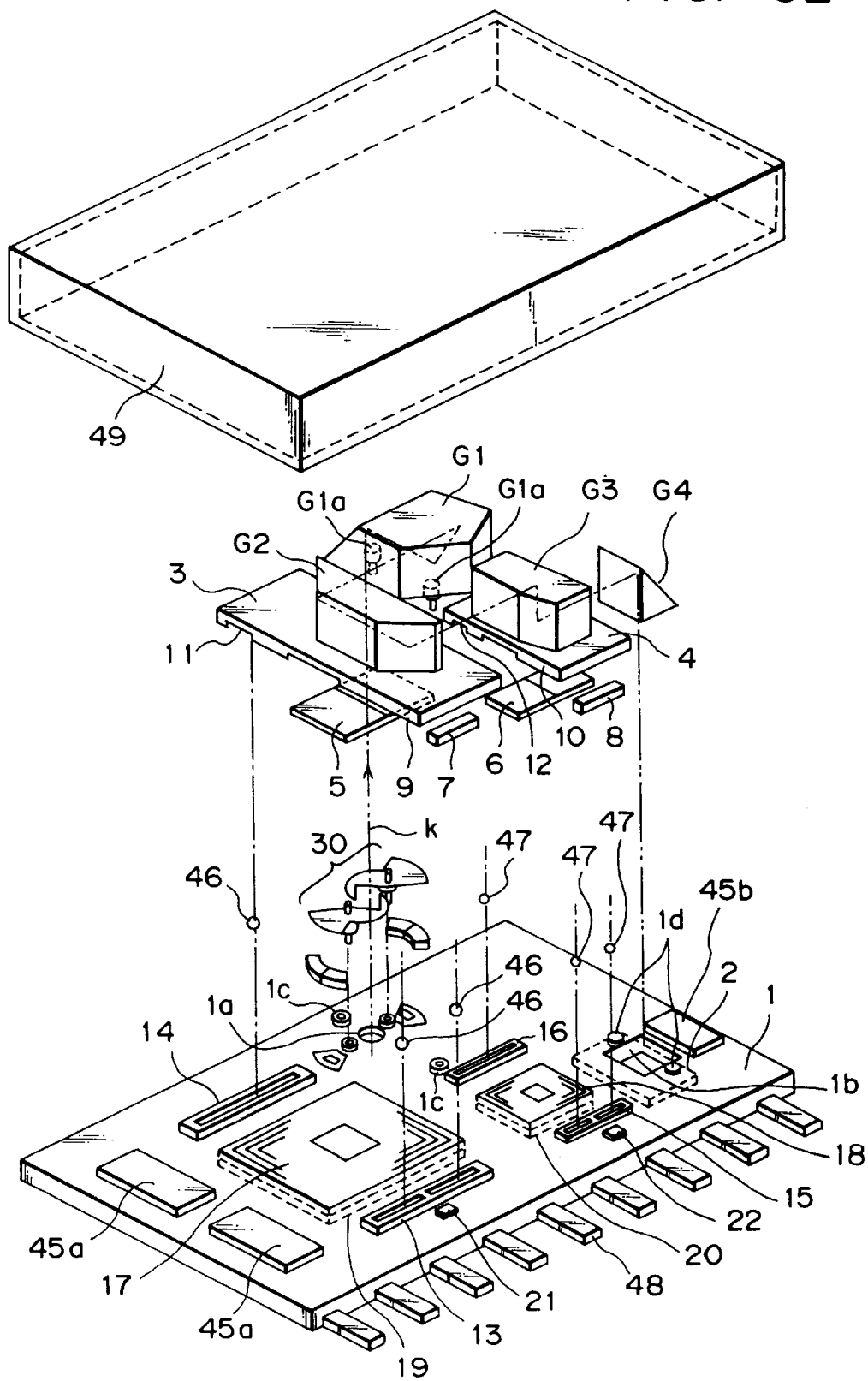
FIG. 32 is an exploded perspective view showing the arrangement of an optical apparatus according to the fifth embodiment of the present invention.
Figure 33:
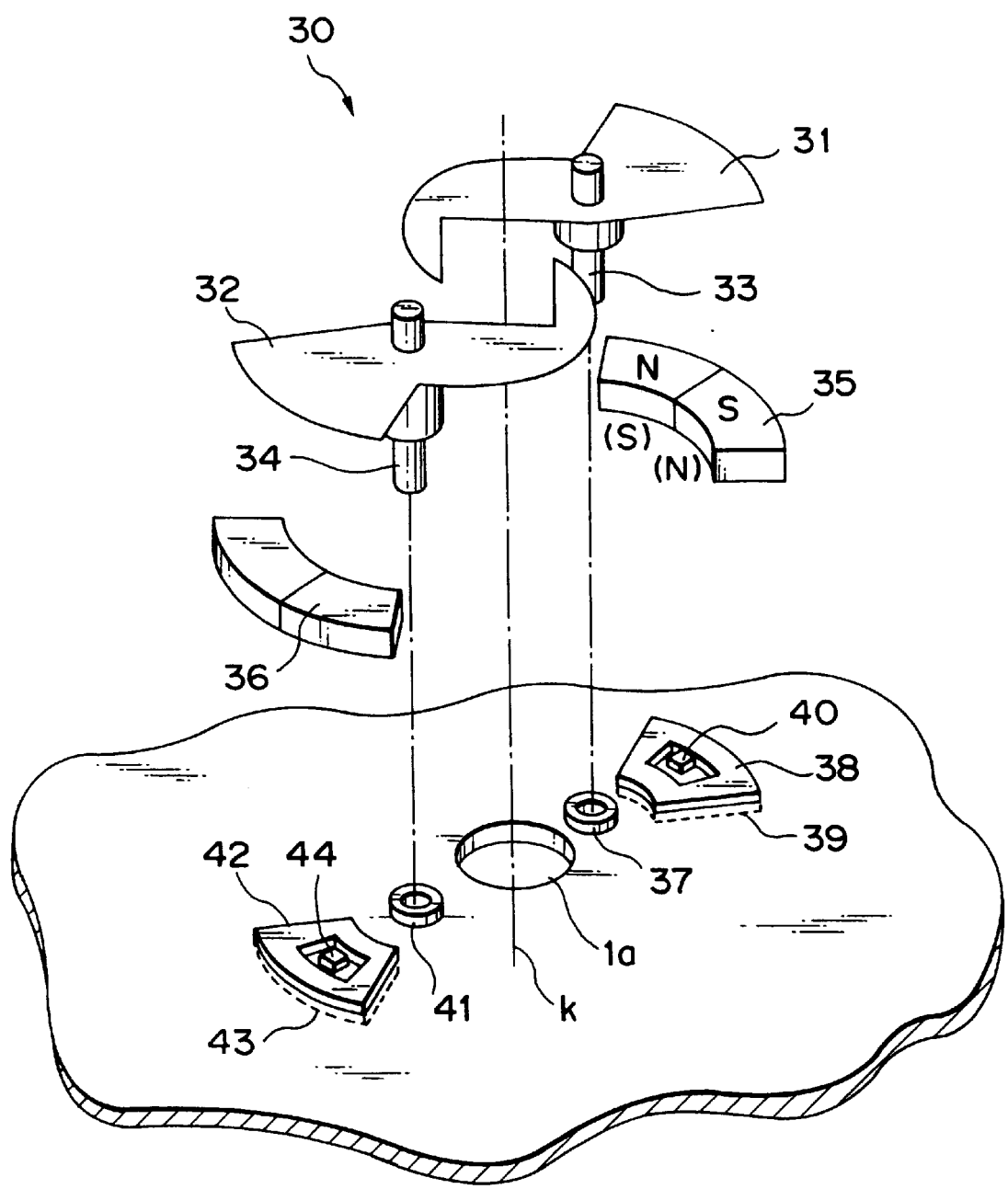
FIG. 33 is an exploded perspective view showing the arrangement of the stop unit of the optical apparatus in FIG. 32.
Figure 34:
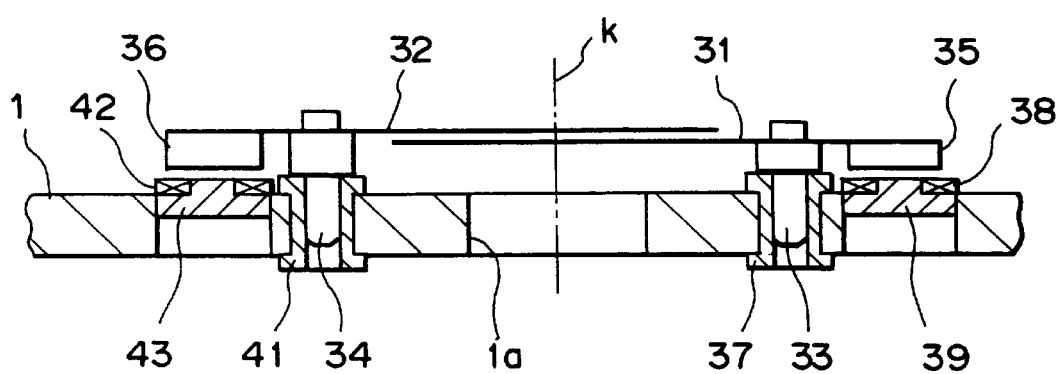
FIG. 34 is an exploded perspective view showing portions around the stop unit of the optical apparatus in FIG. 32.
Figure 35:
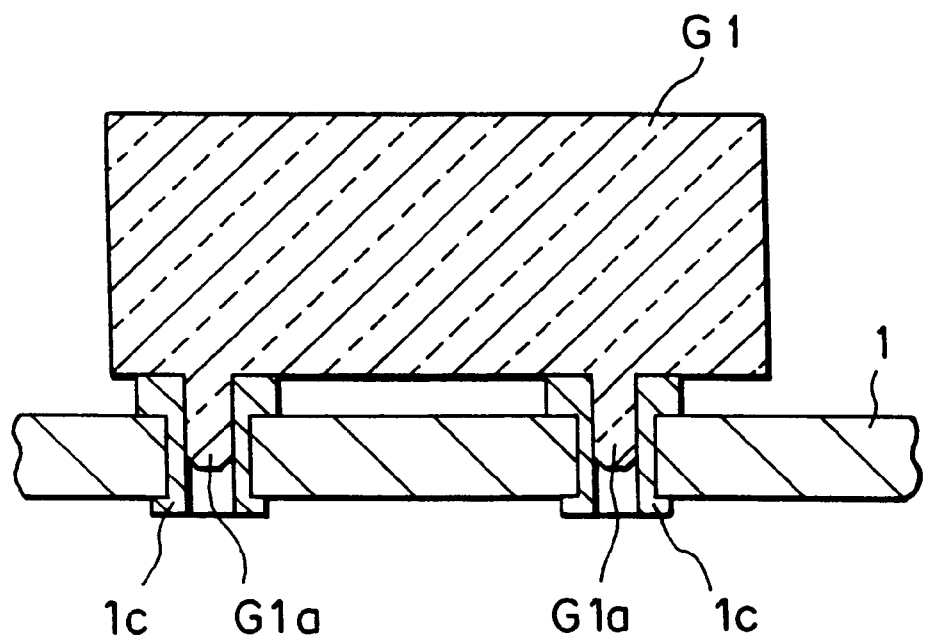
FIG. 35 is a longitudinal sectional view showing portions around an optical member Gl of the optical apparatus in FIG. 32.
Figure 36:
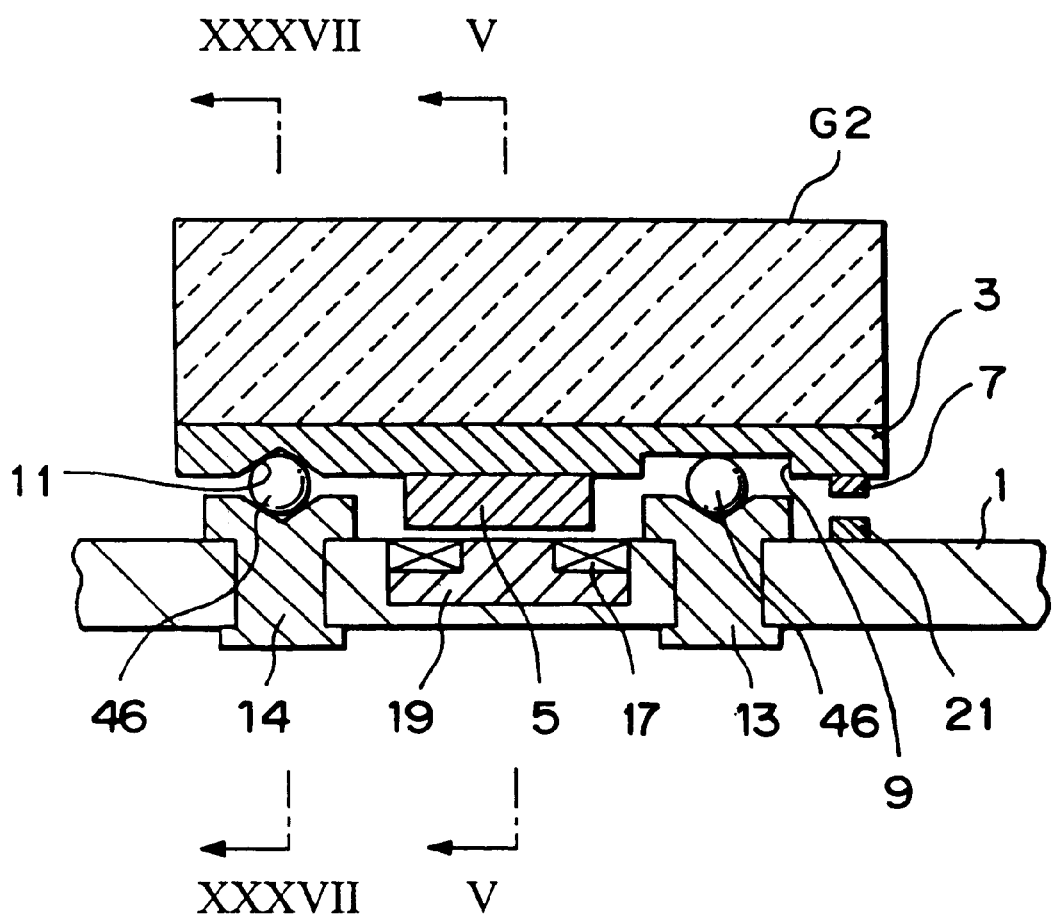
FIG. 36 is a longitudinal sectional view showing the arrangement of an actuator for an optical member G2 of the optical apparatus in FIG. 32.
Figure 37A:
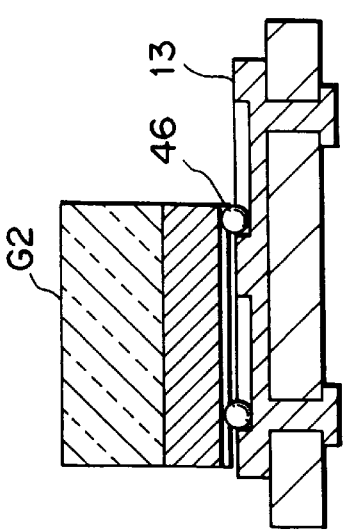
FIGS. 37A to 37C are sectional views taken along a line XXXVII—XXXVII in FIG. 36.

FIG. 32 is an exploded perspective view showing the arrangement of an optical apparatus according to the fifth embodiment of the present invention. FIG. 33 is an exploded perspective view showing the arrangement of a stop unit of the optical apparatus in FIG. 32. FIG. 34 is a longitudinal sectional view showing portions around the stop unit of the optical apparatus in FIG. 32. FIG. 35 is a longitudinal sectional view showing portions around an optical member G1 of the optical apparatus in FIG. 32. FIG. 36 is a longitudinal sectional view showing the arrangement of an actuator for an optical member G2 of the optical apparatus in FIG. 32. FIG. 37 is a sectional view taken along a line XXXVII—XXXVII in FIG. 36. FIG. 38 is a longitudinal sectional view showing portions around a solid-state image sensing element of the optical apparatus in FIG. 32. Note that a sectional view taken along a line V—V in FIG. 36 is similar to each of FIGS. 5A to 5C.

The same reference numerals denote the same parts or members in the first to fourth embodiments.

As shown in FIG. 32, the optical apparatus includes a board 1 having an upper surface on which a photographing optical system and a mechanical system are mounted. The board 1 has a plurality of opening portions 1a and 1b and a plurality of position regulation portions 1c and 1d. The opening portion 1a is sealed with a sealing member such as a glass member to allow light beams to pass therethrough and prevent dust and the like from entering a part storage space formed between the board 1 and a board 1 shield case 49. The position regulation portions 1c and 1d are integrally formed with the board 1. Each position regulation portion 1c has a cylindrical shape. Each position regulation portion 1d has a rod-like shape extending to the lower surface side of the board 1.

The photographing optical system mounted on the board 1 includes a stop unit 30 for adjusting the light amount of an object image which is guided through the opening portion 1a, the optical members G1 and G2 and a plurality of prism-like optical members G3 and G4 made of a plastic material, and the solid-state imaging sensing element 2 for receiving light emerging from the optical member G4 and converting it into an electrical signal.

As shown in FIGS. 33 and 34, the stop unit 30 includes two aperture blades 31 and 32 which are arranged to be point symmetrical with an optical axis K coinciding with the axis of the opening portion 1a. The aperture blades 31 and 32 are designed to rotate about shafts 33 and 34. The shaft 33 of the aperture blade 31 is rotatably inserted into a hole of a position regulation portion 37 integrally formed with the board 1. The shaft 34 of the aperture blade 32 is rotatably inserted into a hole of a position regulation portion 41 integrally formed with the board 1. When the shafts 33 and 34 are respectively inserted into the position regulation portions 37 and 41, the aperture blades 31 and 32 are positioned such that the central position of the aperture regulated by rotation of the aperture blades 31 and 32 coincides with the optical axis K. As the aperture blades 31 and 32 rotate, the aperture changes to perform light amount adjustment.

The aperture blades 31 and 32 respectively have permanent magnets 35 and 36 each serving as a portion of an actuator. The permanent magnets 35 and 36 are also used as magnetic scales for detecting the positions of the aperture blades 31 and 32. The permanent magnets 35 and 36 are magnetized such that their magnetic poles are arranged in a direction perpendicular to the rotational direction of the aperture blades 31 and 32 and perpendicular to the board 1.

A coil 38, a yoke 39, and a position sensor 40 are arranged on the board 1 to oppose the permanent magnet 35. A coil 42, a yoke 43, and a position sensor 44 are arranged on the board 1 to oppose the permanent magnet 36. The yokes 39 and 43 are fitted in opening portions formed in the board 1.

The permanent magnet 35, the coil 38, and the yoke 39 constitute an actuator for driving the aperture blade 31. When a current is supplied to the coil 38 while a magnetic flux is passing between the permanent magnet 35 and the yoke 39, this actuator rotates the permanent magnet 35, i.e., the aperture blade 31, about the shaft 33 owing to the interaction between the magnetic flux and the current. The position sensor 40 is constituted by a Hall sensor. This Hall sensor detects a change in the magnetic field formed by the permanent magnet 35 upon rotation of the aperture blade 31. The detection value obtained by the position sensor 40 is used as a controlled variable for controlling the rotational amount of the aperture blade 31 to obtain a predetermined f-number.

The permanent magnet 36, the coil 42, and the yoke 43 cooperate to constitute an actuator for driving the aperture blade 32. Similar to the coil 42, the position sensor 44 is constituted by a Hall sensor for detecting a change in the magnetic field of the permanent magnet 36 upon rotation of the aperture blade 32.

Note that the permanent magnets 35 and 36 may be constituted by plastic magnets, and the plastic magnets may be integrally formed as portions of the aperture blades 31 and 32.

The optical members G1, G2, G3, and G4 have the same function as that of a lens group formed by combining a plurality of spherical lenses such that, for example, light incident through the opening portion 1*a* and the stop unit 30 is reflected a plurality of number of times within the optical member G1 and guided into the optical member G2.

The optical member G1 is fixed on the board 1. As shown in FIGS. 32 and 35, the optical member G1 has a pair of shafts G1*a* for positioning with respect to the board 1. By fitting the shafts G1*a* in the corresponding holes of the position regulation portions 1*c*, the optical member G1 is positioned/fixed on the board 1.

The optical members G2 and G3 are optical members which are moved parallel to the upper surface of the board 1 in a predetermined direction (the longitudinal direction of the board 1) to perform a zooming (focal length adjustment) operation and a focusing (focus adjustment) operation.

The optical member G2 is fixed to a moving base 3 with an adhesive. The moving base 3 is made of a high-permeability material such as iron in a flat form. As shown in FIGS. 32, 36, 37, and 5, the moving base 3 has a permanent magnet 5 as a portion of an actuator, a magnetic scale 7 as a position detection unit, a groove portion 9 having a V-shaped cross-section within a plane perpendicular to the moving direction, and a recess-like groove portion 11. The permanent magnet 5 is constituted by two pairs of magnets magnetized in a direction perpendicular to the moving direction of the optical member G2. These magnets are arranged in a direction parallel to the board 1.

A coil 17 and a yoke 19, which constitute an actuator together with the moving base 3 and the permanent magnet 5, are disposed on the board 1. As shown in FIG. 36, a portion of the coil and the yoke 19 are fitted in an opening portion formed in the board 1.

A magnetic force from the magnetic scale 7 is detected by a position sensor 21 constituted by an MR sensor or a Hall sensor. This position sensor 21 is disposed on the board 1 to oppose the magnetic scale 7.

Position regulation portions 13 and 14 for guiding the moving direction of the moving base 3 and regulating its moving position are disposed at positions on the board 1 to oppose the groove portions 9 and 11 of the moving base 3, respectively. The position regulation portions 13 and 14 are integrally formed with the board 1. Grooves each having a V-shaped cross-section within a plane perpendicular to the moving direction of the moving base 3 are formed in the position regulation portions 13 and 14. Balls 46 are inserted between the groove portions 9 and 11 and the corresponding position regulation portions 13 and 14.

In the actuator constituted by the moving base 3, the permanent magnet 5, the coil 17, and the yoke 19, when a current is supplied to the coil 17, a driving force is generated owing to the interaction between a magnetic circuit (to be described later) and the current, and the moving base 3, i.e., the optical member G2, is moved along the optical axis (in a direction perpendicular to the drawing surface in FIG. 34) by this driving force. More specifically, as shown in FIG. 5B, the magnetic path indicated by the dotted line is formed between the permanent magnet 5, the moving base 3 having a permeability, and the yoke 19. When a current is supplied to the coil 17 in the magnetic path between the permanent magnet 5 and the yoke 19, the moving base 3, i.e., the optical member G2, is moved in the direction indicated by the arrow in FIG. 5B by a driving force generated by the interaction between the magnetic force and the current. By changing the flowing direction of the current, the moving direction of the moving base 3 is changed. For example, the moving base 3 can be moved from the position indicated in FIG. 5B to the position indicated in FIG. 5A and to the position indicated in FIG. 5C.

Figure 37B:
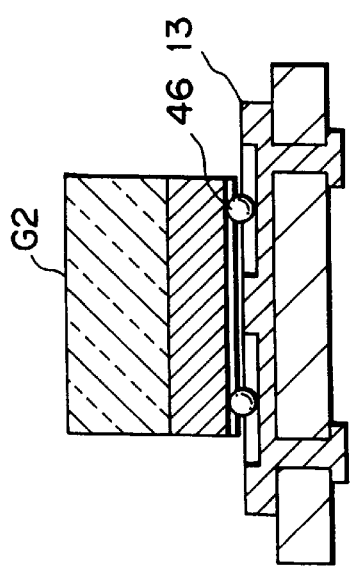
Figure 37C:
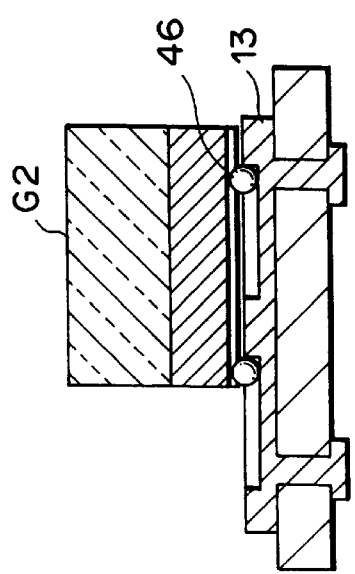
Figure 38:
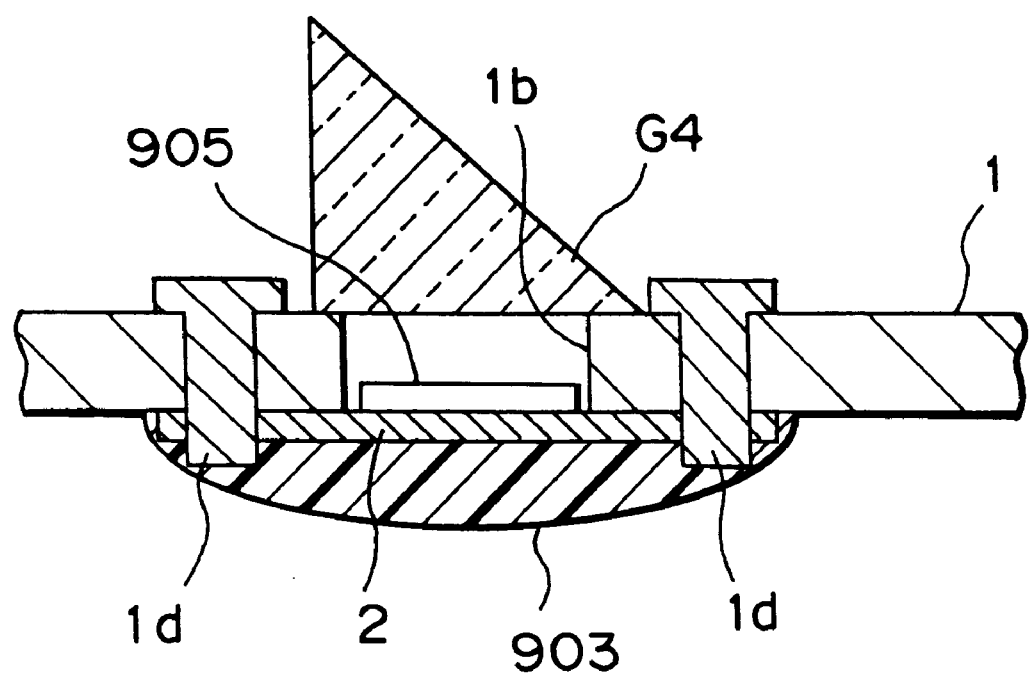
FIG. 38 is a longitudinal sectional view showing portions around the solid-state image sensing element of the optical apparatus in FIG. 32.

While the moving base 3 is moving, an attracting force based on the magnetic force is acting between the permanent magnet 5 and the yoke 19, as shown in FIG. 37B. The moving base 3 and the balls 46 are therefore in tight contact without any backlash. When the moving base 3 moves in the direction indicated in FIG. 37A, the balls 46 rotate clockwise. When the moving base 3 moves in the direction indicated in FIG. 37C, the balls 46 rotate counterclockwise. During this movement, the posture of the moving base 3 is stably held with respect to the position regulation portion 13 through the balls 46. In addition, since the balls 46 rotate while the moving base 3 is moving, the rolling friction acting on the contact surfaces between the balls 46 and the moving base 3 and the position regulation portion 13 is negligibly small as compared with the sliding friction acting on the contact portions between the guide pins and the lens holding members in the prior art. The load based on friction during movement of the optical member G2 can be reduced. As the moving base 3 moves, the magnetic field of the magnetic scale 7 changes. This change is read by the position sensor 21. The detection value from the position sensor 21 is used to control the movement of the moving base 3.

Similarly, the optical member G3 is fixed to a moving base 4 with an adhesive. The moving base 4 has the same arrangement as that of the moving base 3. A permanent magnet 6 as a portion of an actuator, a magnetic scale 8 as a position detection unit, and a groove portion 10 having a V-shaped cross-section within a plane perpendicular to the moving direction of the moving base 4 and a groove portion 12 in the form of a recess, which constitute a position regulation unit, are disposed on the moving base 4.

A coil 18 and a yoke 20 which constitute an actuator together with the moving base 4 and the permanent magnet 6 are disposed on the board 1. The yoke 20 is constituted by an iron base which is fitted in an opening portion (not shown) formed in the board 1 to be integrated with the board 1.

The actuator constituted by the moving base 4, the permanent magnet 6, the coil 18, and the yoke 20 performs the same operation as that performed by the actuator constituted by the permanent magnet 5, the coil 17, and the yoke 19.

The magnetic force of the groove portion 9 is detected by a position sensor 22 constituted by an MR sensor, a Hall sensor, or the like. This position sensor 22 is disposed on the board 1 to oppose the groove portion 9.

Position regulation portions 15 and 16 for guiding the moving direction of the moving base 4 and regulating its moving position are disposed at positions on the board 1 to oppose the groove portions 10 and 12, respectively. Grooves each having a V-shaped cross-section within a plane perpendicular to the moving direction of the moving base 4 are formed in the position regulation portions 15 and 16. Balls 47 are inserted between the groove portions 10 and 20 and the corresponding position regulation portions 15 and 16. As the moving base 4 moves, the optical member G3 moves in a predetermined direction. The frictional forces generated between the groove portions 10 and 12 and the corresponding position regulation portions 15 and 16 during movement of the moving base 4 are reduced owing to the rolling movement of the balls 47.

In this embodiment, the optical members G2 and G3 and the moving bases 3 and 4 are fixed to each other with an adhesive. However, the optical members G2 and G3 may be formed by insert molding or outsert molding with respect to the moving bases 3 and 4 such that the optical members G2 and G3 are integrally formed with the moving bases 3 and 4.

The optical member G4 is fixed to the board 1 with an adhesive. The optical member G4 is disposed on the board 1 such that the optical axis of light emerging from the member coincides with the axis of the opening portion 1c of the board 1. An optical filter (not shown) for removing unnecessary high-frequency components and infrared rays contained in an object image is bonded to the optical member G4. Note that this optical filter may be integrally formed with the optical member G4 by deposition.

In the optical system constituted by the optical members G1, G2, G3, and G4, light incident through the opening portion 1a of the board 1 and the stop unit 30 is reflected by the optical member G1 in a direction parallel to the upper surface of the board 1, the reflected light is guided to the optical member G4 by the optical members G2 and G3, and the light then emerges from the optical member G4 in a direction perpendicular to the upper surface of the board 1.

The light emerging from the optical member G4 is guided to the solid-state image sensing element 2 through the opening portion 1b of the board 1.

As shown in FIG. 32 and 38, the solid-state imaging sensing element 2 is mounted on the lower surface of the board 1. As shown in FIG. 38, the solid-state imaging sensing element 2 has input/output terminals (not shown) for signals, and two holes. The input/output terminals are arranged on the image sensing place 905 side of the solid-state imaging sensing element 2 and are directly connected to terminals (not shown) on the lower surface of the board 1 by soldering. The position regulation portions 1d are fitted in the respective holes to fix the solid-state imaging sensing element 2 to the board 1. The solid-state imaging sensing element 2 is disposed on the lower surface of the board 1 such that the optical axis of an image sensing place 905 coincides with the axis of opening portion 1b of the board 1.

The solid-state image sensing element 2 is sealed from the lower surface side with a resin member 903. With this resin member 903, the solid-state image sensing element 2 is protected, and its mounting strength with respect to the board 1 increases.

The opening portion 1c of the board 1 is covered with the optical member G4. The optical member G4 protects the image sensing surface 905 of the solid-state image sensing element 2.

As shown in FIG. 32, a plurality of circuit elements 45a and 45b are mounted on the board 1 in addition to the above parts constituting the photographing optical system. The circuit elements 45a include elements constituting drive circuits for the actuators for the moving bases 3 and 4 on which the optical members G2 and G3 are mounted, the actuator for the stop unit 30, and the respective positions sensors. The circuit elements 45b include elements constituting a drive circuit for the solid-state image sensing element 2 and a video signal processing circuit.

The board 1 has connectors 48 for connecting the circuit elements 45a and 45b to external circuits.

A shield case 49 is mounted on the board 1 to shield the parts mounted on the board 1 against magnetism and external light, suppress inner surface reflection, and prevent entrance of external dust. The shield case 49 is made of an iron plate whose inner surface is painted in black.

A procedure for assembling the optical apparatus of this embodiment will be described next.

In the first step, parts to be fixed are disposed on the board 1. The parts to be fixed include the solid-state image sensing element 2, the optical members G1 and G4, the coils 17 and 18 and the yokes 19 and 20 which constitute the actuators for the optical members G2 and G3, the position regulation portions 13, 14, 15, and 16, the position sensors 21 and 22, the coils 38 and 42 and the yokes 39 and 43 of the stop unit 30, the position sensors 40 and 44, and the circuit elements 45a and 45b.

The position regulation portions 1d of the board 1 are fitted in the corresponding holes of the solid-state imaging sensing element 2. The solid-state imaging sensing element 2 is then fixed to the lower surface of the board 1 with a solder or adhesive. The input/output terminals of the solid-state imaging sensing element 2 are electrically connected to terminals 907 of the board 1.

After the solid-state imaging sensing element 2 is mounted, the optical member (glass member) G4 is fixed to the upper surface of the board 1 to cover the opening portion 1b. The optical member G4 is fixed to the board 1 with an adhesive.

After the optical member G4 is mounted, the shafts G1a of the optical member G1 are fitted in the corresponding position regulation portions 1c . As a result, the optical member G1 is positioned on the board 1.

Subsequently, other parts to be fixed are sequentially positioned and fixed to the board 1 with a solder, an adhesive, or the like. The coils 17 and 18, the yokes 19 and 20, the position sensors 21 and 22, the coils 38 and 42, the yokes 39 and 43, the position sensors 40 and 44, and the circuit elements 45a and 45b are connected to a wiring pattern formed on the board 1.

Upon completion of the first step, mounting of the parts on the board 1 and electrical connection of the coils, the position sensors, and the like for drive control on movable members such as the aperture blades 31 and 32 of the stop unit 30, the moving bases 3 and 4 on which the optical members G2 and G3 are mounted, and the like are completed. As described above, since the parts to be fixed, including the solid-state image sensing element 2, which need to be electrically connected to the board 1, are electrically connected to the board 1 with a solder or the like without the mediacy of lead wires and a flexible printed board, the assembly step required for electric wiring can be omitted, resulting in a reduction in cost.

The second step is then executed. In the second step, the aperture blades 31 and 32 as movable members are mounted on the board 1. More specifically, the shaft 33 of the aperture blade 31 is inserted into the hole of the position regulation portion 37 of the board 1. Similarly, the shaft 34 of the aperture blade 32 is inserted into the hole of the position regulation portion 41 of the board 1. When the shafts 33 and 34 of the aperture blades 31 and 32 are respectively inserted into the holes of the position regulation portions 37 and 41, the aperture blades 31 and 32 are positioned on the board 1, and the center of the aperture formed by the aperture blades 31 and 32 coincides with the optical axis.

The third step is executed. In the third step, the optical members G2 and G3 constituting the photographing optical system and the movable members constituting the actuators for the optical members are mounted. The moving bases 3 and 4 are mounted on the position regulation portions 13, . . . , 16 through the balls 46 and 47. The optical members G2 and G3 are positioned on the moving bases 3 and 4.

The fourth step is executed. In the fourth step, the shield case 49 is mounted. The shield case 49 is placed on the board 1 to cover its upper surface, and is fixed by soldering corresponding portions to ground patterns on the board 1.

Upon completion of the fourth step, all the parts are mounted on the board 1.

As described above, the assembly process can be simplified without using any complicated, expensive part called a housing for holding an optical system such as lenses in the prior art. A low-cost photographing optical system can therefore be provided.

In addition, since the above members and parts are arranged on the flat board 1, the positions and postures of the respective parts can be easily determined such that an increase in the dimension of the board 1 in the direction of thickness is minimized. Consequently, a low-profile optical apparatus can be easily obtained.

Since the position regulation portions 1d for the solid-state imaging sensing element 2, the position regulation portions 1c, 13, 14, 15, and 16 for the optical members G3 and G4, and the position regulation portions 37 and 41 for the stop unit 30 are integrally formed with the board 1, the solid-state imaging sensing element 2, the optical members G3 and G4, and the stop unit 30 can be easily positioned with a high precision.

This embodiment exemplifies the photographing optical system constituted by optical members G1, G2, G3, and G4. However, in a photographing optical system constituted by a lens group of refraction optical systems, or a photographing optical system additionally including a lens group of refraction optical systems, as in the prior art, the optical systems can be arranged directly on the board or on moving bases to be movable.

Figure 39:
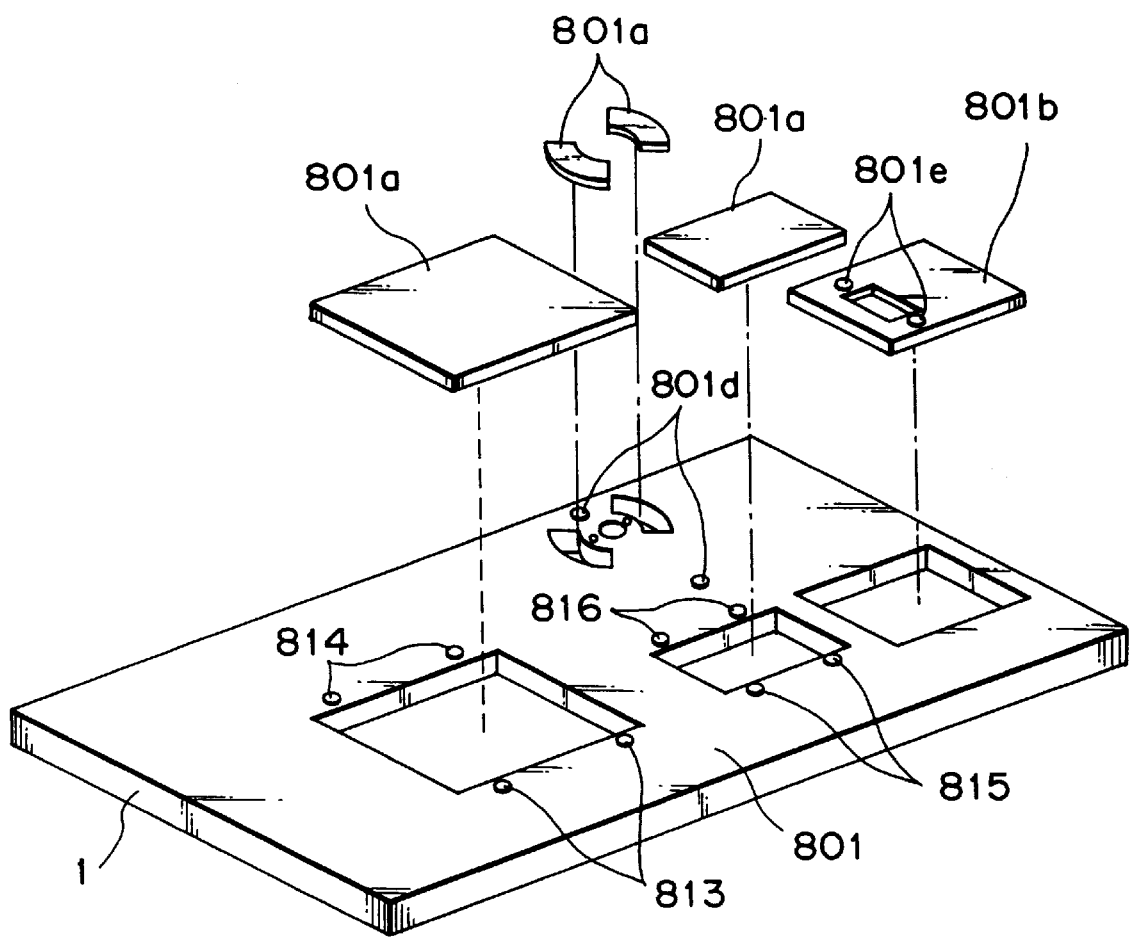
FIG. 39 is an exploded perspective view showing a process in a method of manufacturing a board for the optical apparatus in FIG. 32.
Figure 40:
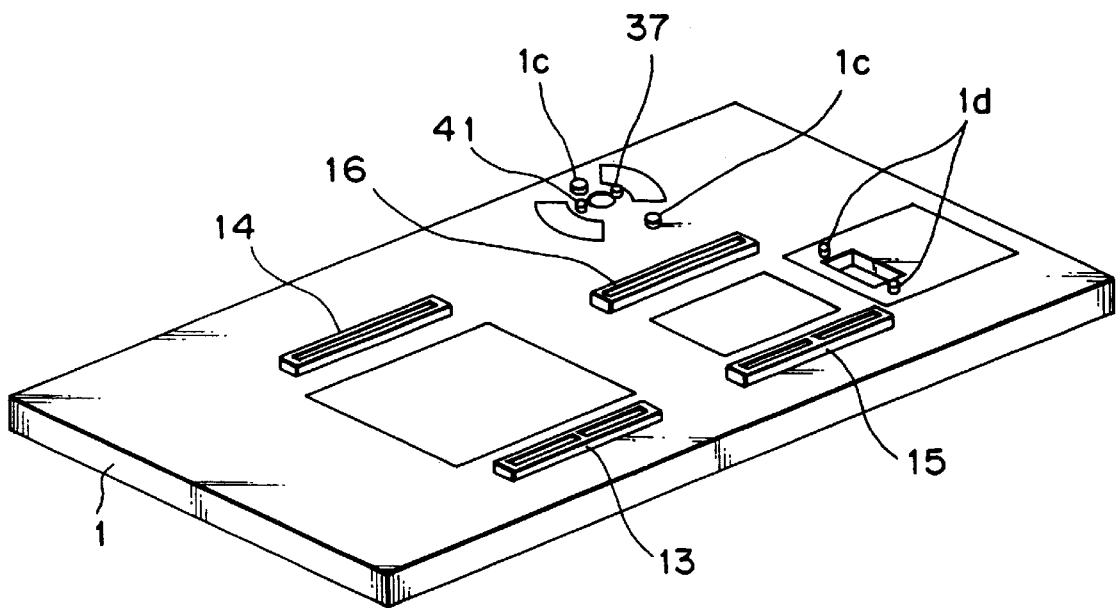
FIG. 40 is an exploded perspective view showing a process in the method of manufacturing the board for the optical apparatus in FIG. 32.
Figure 41:
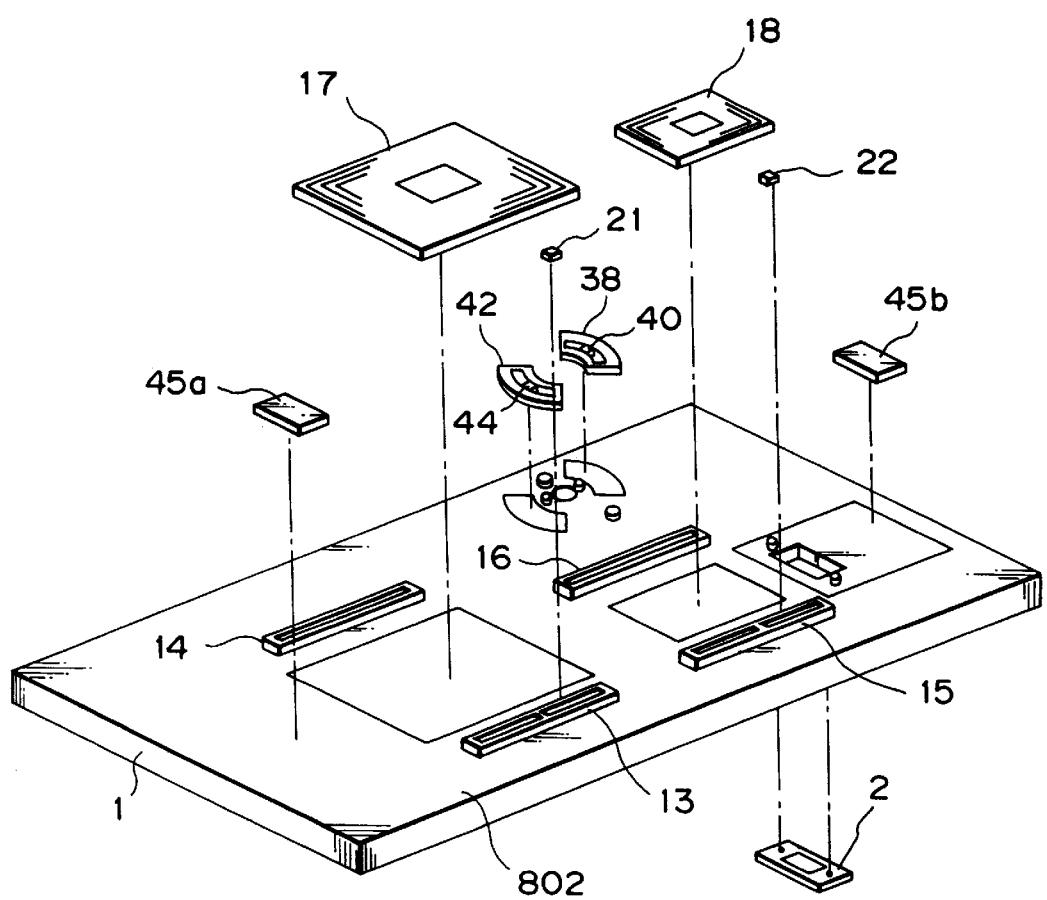
FIG. 41 is an exploded perspective view showing a process in the method of manufacturing the board for the optical apparatus in FIG. 32.

The arrangement of the board 1 and a manufacturing method therefor will be described next with reference to the accompanying drawings. FIGS. 39 to 41 are exploded perspective views showing the steps in the method of manufacturing the board of the optical apparatus in FIG. 32. Note that a longitudinal sectional view of the board 1 of the optical apparatus in FIG. 32 is equivalent to FIG. 15. Since the arrangement of the board 1 is the same as that in the first embodiment, a description thereof will be omitted.

The method of manufacturing the board 1 will be described next with reference to FIGS. 39 to 41.

Referring to FIG. 39, a ceramic base 801 having holes in portions corresponding to iron bases 801a and aluminum base 801b, the iron bases 801a, and the aluminum base 801b are prepared.

The iron bases 801a and the aluminum base 801b are respectively fitted in the holes in the ceramic base 801. The iron bases 801a and the aluminum base 801b are fixed to the ceramic base 801 with an adhesive to form one base member.

Copper foils coated with a resin are stacked on the base member. As a result, insulating layers 801c are formed on the surfaces of the ceramic base 801, the iron bases 801a, and the aluminum base 801b, as shown in FIG. 15. Instead of using this method, a method of coating a base member with a resin for forming insulating layers, and stacking copper foils on the resin may be used as a method of forming the insulating layers 801c. However, the former method is better because it allows a continuous process.

After the insulating layers 801c are formed, surface treatments are sequentially executed, e.g., etching the copper foils to form wiring patterns, coating of a solder resist, solder plating on the exposed copper foil surfaces, and a treatment using a solder leveler.

A plurality of holes 801d, 801e, 813, 814, 815 and 816 are formed in the base, on which the insulating layers 801c are formed, to serve as removal prevention holes in a molding process for the position regulation portions 1c for the optical member G1, the position regulation portions 1d for the solid-state imaging sensing element 2, the position regulation portions 13, 14, 15, and 16 for the optical members G3 and G4, and the position regulation portions 37 and 41 for the aperture blades 31 and 32.

The base is then inserted into the mold to undergo outsert molding, thereby obtaining the board 1 on which the position regulation portions 1c for the optical member G1, the position regulation portions 1d for the solid-state imaging sensing element 2, the position regulation portions 13, 14, 15, and 16 for the optical members G3 and G4, and the position regulation portions 37 and 41 for the aperture blades 31 and 32 are formed, as shown in FIG. 40.

As described above, since each position regulation portion is formed by a mold processed into a predetermined shape with a high precision, each position regulation portion has a high-precision shape. By mounting members and parts on such position regulation portions, the assembly process for the members and the parts is simplified. As a result, the assembly time can be greatly shortened as compared with the time required for assembly of parts with screws and an adhesive as in the prior art. The cost required for the assembly process can therefore be reduced.

Since each position regulation portion is formed at a predetermined position on the board 1 with a high precision, each position regulation portion is finished to have a predetermined size. For this reason, the dimensional precision between members and parts mounted on the respective position regulation portions and the mounting precision of the members and the parts with respect to the board can be improved, thereby preventing deterioration in image quality such as blurring and fluctuations of photographed images due to dimensional errors between the respective members and parts and mounting errors of the respective members and parts.

In addition, since the position regulation portions are formed on the flat board 1, a mold can be processed with a high precision. With the improvement in the process precision of the mold, the molding precision of each position regulation portion can be further improved.

Subsequently, as shown in FIG. 41, the solid-state imaging sensing element 2, the coils 17, 18, 38, and 42, the circuit elements 45a and 45b, and the position sensors 21, 22, 40, and 44 are electrically connected to the wiring patterns formed on the board 1 with a solder or the like. The coils 17, 18, 38, and 42 are fixed to the board 1 with an adhesive.

In this embodiment, one member is not used as the base member of the board 1, but materials having properties suitable for characteristics required by parts to be mounted on the board 1 are used for the base member. More specifically, a ceramic base member with excellent dimensional stability including high flatness is used as the frame of the board, iron base members with a high permeability are used for the portions where the actuators are formed, and an aluminum or copper base member is used for the portion where the image sensing element drive circuit or video signal processing circuit requiring heat dissipation of the electronic parts is mounted. In this manner, optimal materials are selected for the respective portions on the board 1 to manufacture a board which can make use of the merits of the respective base members. This structure is especially effective for heat dissipation of electronic parts, and hence deformation of the board due to heat generated by the electronic parts can be prevented. Consequently, a relative positional offset between each optical member and the solid-state image sensing element 2, tilting of each optical member, and the like due to deformation of the board 1 can be suppressed. Deterioration in photographed images caused by deformation of the board 1 can therefore be prevented.

In addition, in this embodiment, sheet-like coils are used, and these coils are fixed on the board 1 with an adhesive. However, similar to the patterns on the board 1, coils can be formed by etching the copper foils. In this case, although the number of turns of each coil is limited, steps such as the step of fixing the sheet coils can be omitted because the coils can be formed in the same manner as the wiring patterns. In addition, positioning of the sheet coils on the board 1 need not be performed.

As has been described above, according to the optical apparatus of the present invention, since the optical members constituting the photographing optical system and the solid-state image sensing element are mounted on the same board, no housing for holding a photographing optical system as in the prior art needs to be used. Therefore, excellent assembly performance can be obtained, and the cost can be suppressed. In addition, a decrease in the thickness of the apparatus can be attained.

The optical members constituting the photographing optical system and the solid-state image sensing element can be two-dimensionally positioned on the board to prevent photographed images from being deteriorated by a relative positional offset between each optical member and the solid-state image sensing element.

Since the photographing optical system has a fixed focal length with respect to the solid-state image sensing element, the arrangement of the apparatus can be simplified.

Since the photographing optical system is constituted by the optical members fixed to the board, relative positioning between the optical members and the solid-state image sensing element can be easily performed.

Since the photographing optical system has a focus adjustment function with respect to the solid-state image sensing element, a proper object image can be formed on the solid-state image sensing element in accordance with the distance to the object.

The photographing optical system is constituted by the movable optical members movably mounted on the board and the fixed optical members fixed to the board. Focus adjustment with respect to the solid-state image sensing element is performed by moving the movable optical members. For this reason, the focus adjustment function can be realized with a simple arrangement.

Since the photographing optical system has the focal length changing function with respect to the solid-state image sensing element, the degree in photographing an object can be increased.

The photographing optical system is constituted by the plurality of movable optical members movably mounted on the board and the fixed optical members fixed to the board. Focus adjustment of the photographing optical system is performed by moving at least one of the movable optical members, whereas the focal length of the photographing optical system is changed by moving other movable optical members. The degree in photographing an object can be increased while a proper object image is formed on the solid-state image sensing element.

The board has the guide means for guiding the movable optical members in their moving directions. The movable optical members can therefore be moved accurately and stably in their moving directions, thereby preventing blurring, fluctuations, and the like of photographed images due to fluctuations and the like of the movable optical members during movement thereof.

Since the moving direction of each movable optical member is parallel to the board surface, an increase in the thickness of the photographing optical system can be suppressed with the moving distance of the movable optical member having no influence on the size of the photographing optical system in the direction of thickness.

The image sensing surface of the solid-state image sensing element is parallel to the board, and the photographing optical system includes a portion for guiding an incident light beam along the board and a portion for guiding the incident light beam in a direction perpendicular to the image sensing surface. With this arrangement of the photographing optical system, an increase in the size of the board in the direction of thickness can be prevented.

The optical apparatus according to another aspect of the present invention has the board on which the photographing optical system and/or the solid-state image sensing element is mounted, and the light-shielding means for shielding the photographing optical system and/or the solid-state image sensing element against light is disposed on the board. With this arrangement, an increase in the size of the board in the direction of thickness can be suppressed, and an increase in the size of the light-shielding means in the direction of the thickness of the board can be suppressed. Consequently, the overall thickness of the apparatus can be decreased, and the light-shielding means does not interfere with a decrease in the thickness of the apparatus.

Since the light-shielding means is constituted by a box-like member which covers at least one surface of the board, an increase in the size of the board due to the light-shielding means can be minimized.

In addition, the apparatus includes the board on which the photographing optical system and/or the solid-state image sensing element is mounted, and the shielding means for shielding the photographing optical system and/or the solid-state image sensing element against electromagnetism is disposed on the board. Therefore, an increase in the size of the board in the direction of thickness can be suppressed, and the shielding means can be designed so as not to increase the size of the board in the direction of thickness. The overall thickness of the apparatus can be decreased, and the shielding means does not interfere with a decrease in the thickness of the apparatus.

Since the light-shielding means is constituted by a box-like member which covers at least one surface of the board, an increase in the size of the board due to the light-shielding means can be minimized.

Furthermore, the apparatus has the board on which the photographing optical system and/or the solid-state image sensing element is mounted, and the light-shielding means for shielding the photographing optical system and/or the solid-state image sensing element against light and the shielding means for shielding the photographing optical system and/or the solid-state image sensing element against electromagnetism are disposed on the board. Therefore, an increase in the size of the board in the direction of thickness can be suppressed, and the light-shielding and shielding means can be designed so as not to increase the size of the board in the direction of thickness. The overall thickness of the apparatus can be decreased, and the light-shielding and shielding means do not interfere with a decrease in the thickness of the apparatus.

Since the light-shielding means also serves as the shielding means, a reduction in cost can be attained, and the size of the apparatus can be further decreased.

Since the light-shielding means also serves as the shielding means, and the light-shielding means is constituted by a box-like member formed to cover at least one surface of the board, an increase in the size of the board in the direction of thickness due to the light-shielding and shielding means can be minimized.

According to the image sensing apparatus according to still another aspect of the present invention, the solid-state image sensing element is mounted on one surface of the board such that the input and output terminals of the element are directly connected to the corresponding electrical connection portions of the board, and the image sensing surface is exposed to the other surface of the board through the opening portion of the board. With this arrangement, the input and output terminals of the solid-state image sensing element need not be connected to the electrical connection portions of the board by using connection means such as lead wires an a flexible board. In addition, the solid-state image sensing element can be mounted on the board without using any board for mounting the solid-state image sensing element, thereby suppressing an increase in the size of the board, on which the solid-state image sensing element is mounted, in the direction of thickness. Therefore, the assembly process can be simplified, and a decrease in the thickness of the apparatus can be attained.

Since the solid-state image sensing element is sealed by the sealing means from one surface side of the board, the solid-state image sensing element can be protected, and the mounting strength of the solid-state image sensing element with respect to the board can be increased.

Since a light-transmitting cover member is mounted on the board to cover the image sensing surface of the solid-state image sensing element, the image sensing surface of the solid-state image sensing element can be protected.

In addition, the base member is mounted on one surface of the board such that the input and output terminals of the solid-state image sensing element are directly connected to the corresponding electrical connection portions of the board, and the image sensing surface of the solid-state image sensing element is exposed to the other surface of the board through the opening portion of the board. With this arrangement, the input and output terminals of the solid-state image sensing element need not be connected to the electrical connection portions of the board by using connection means such as lead wires an a flexible board. In addition, the solid-state image sensing element can be mounted on the board without using any board for mounting the solid-state image sensing element, thereby suppressing an increase in the size of the board, on which the solid-state image sensing element is mounted, in the direction of thickness. Therefore, the assembly process can be simplified, and a decrease in the thickness of the apparatus can be attained.

Since the solid-state image sensing element is sealed by the sealing means from one surface side of the board, the solid-state image sensing element can be protected, and the mounting strength of the solid-state image sensing element with respect to the board can be increased.

Since a light-transmitting cover member is mounted on the board to cover the image sensing surface of the solid-state image sensing element, the image sensing surface of the solid-state image sensing element can be protected.

Since the base member also serves as a sealing means, an increase in cost due to an increase in the number of parts can be suppressed.

In addition, the base member is mounted on one surface of the board such that the terminals of the base member are directly connected to the corresponding electrical connection portions of the board, and the image sensing surface of the solid-state image sensing element is exposed to the other surface of the board through the opening portion of the board. With this arrangement, the input and output terminals of the solid-state image sensing element need not be connected to the electrical connection portions of the board by using connection means such as lead wires an a flexible board. In addition, the solid-state image sensing element can be mounted on the board without using any board for mounting the solid-state image sensing element, thereby suppressing an increase in the size of the board, on which the solid-state image sensing element is mounted, in the direction of thickness. Therefore, the assembly process can be simplified, and a decrease in the thickness of the apparatus can be attained.

Since the solid-state image sensing element is sealed by the sealing means from one surface side of the board, the solid-state image sensing element can be protected, and the mounting strength of the solid-state image sensing element with respect to the board can be increased.

Since a light-transmitting cover member is mounted on the board to cover the image sensing surface of the solid-state image sensing element, the image sensing surface of the solid-state image sensing element can be protected.

Since the base member also serves as a sealing means, an increase in cost due to an increase in the number of parts can be suppressed.

The optical apparatus according to still another aspect of the present invention has the board on which the photographing optical system and the solid-state image sensing element are mounted, and which has an receiving portion open to the surface on which the photographing optical system is mounted. The photographing optical system is arranged on the board such that at least a portion of a constituent member of the system is inserted into the receiving portion. With this arrangement, an increase in the size of the board in the direction of thickness can be suppressed, and a decrease in the thickness of the apparatus is facilitated.

The photographing optical system has an optical axis parallel to the board. A portion of the constituent member at the farthest position from the optical axis toward the board is inserted into the receiving portion. With this arrangement, an increase in the size of the board in the direction of thickness due to the constituent member can be suppressed.

Since the constituent member partly inserted into the receiving portion is an optical member, an increase in the size of the board in the direction of thickness due to the optical member can be suppressed.

Since the constituent member partly inserted into the receiving portion is a constituent member of the actuator, an increase in the size of the board in the direction of thickness due to the constituent member of the actuator can be suppressed.

Since the constituent member partly inserted into the receiving portion is a holding member for holding the optical member, an increase in the size of the board in the direction of thickness due to the holding member can be suppressed.

The receiving portion may be a recess portion.

The receiving portion may be an opening portion extending through the board.

In the optical apparatus according to still another aspect of the present invention, the position regulation portions for the optical members included in the photographing optical system are formed on the board on which the photographing optical system and the solid-state image sensing element are mounted, with at least one of the position regulation portions being integrally formed. With this arrangement, an increase in the size of the board in the direction of thickness can be suppressed, and at least optical members or the solid-state image sensing element can be accurately positioned on the board by the position regulation portions. A decrease in the overall thickness of the apparatus can be attained, and deterioration in image quality due to inaccuracy of relative positioning between each optical member and a solid-state image sensing element included in a photographing optical system can be prevented.

Since the position regulation portions for the optical members are position regulation portions for the fixed optical members fixed to the board, the fixed optical members can be accurately positioned.

In addition, since the position regulation portions for the optical members are position regulation portions for the movable optical members capable of moving relative to the solid-state image sensing element, the movable optical members can be accurately positioned.

Furthermore, since the position regulation portions for the movable optical members are position regulation portions for the holding means for guiding the movable optical members in their moving directions while holding the movable optical members, the holding means, i.e., the movable optical members, can be accurately positioned.

Moreover, the light amount adjustment means for adjusting the light amount of an object image is mounted on the board, and the position regulation portions for the light amount adjustment means are integrally formed with the board. With this arrangement, the light amount adjustment means can be accurately positioned.

As many apparently widely different embodiments of the present invention can be made without departing from the spirit and scope thereof, it is to be understood that the invention is not limited to the specific embodiments thereof except as defined in the appended claims.

What is claimed is:

1. An optical apparatus for forming an object image on an image sensing element through a photographing optical system, wherein an optical members included in said photographing optical system and said image sensing element are placed with respect to the same board, and wherein, said photographing optical system has a fixed optical member fixed to said board and a movable optical member movably mounted on said board for performing an optical adjustment function for said image sensing element, wherein said optical system includes an optical low-pass filter, and said image sensing element and said optical low-pass filter sandwich said board.

2. The apparatus according to claim 1, wherein said photographing optical system has a fixed focal length with respect to said image sensing element.

3. The apparatus according to claim 1, wherein said photographing optical system has a focal length changing function for said image sensing element.

4. The apparatus according to claim 3, wherein said photographing optical system includes a plurality of movable optical members movably mounted on said board, and a fixed optical member fixed to said board, and focus adjustment of said photographing optical system is performed by moving at least one of said movable optical members, while a focal length of said photographing optical system is changed by moving said other movable optical members.

5. The apparatus according to claim 4, wherein said board has guide means for guiding said movable optical member in a moving direction thereof.

6. The apparatus according to claim 4, wherein a moving direction of said movable optical member is parallel to a surface of said board.

7. The apparatus according to claim 1, wherein said board has guide means for guiding said movable optical member in a moving direction thereof.

8. The apparatus according to claim 1, wherein a moving direction of said movable optical member is parallel to a surface of said board.

9. The apparatus according to claim 1, wherein an image sensing surface of said image sensing element is parallel to said board, and said photographing optical system includes a first portion for guiding an incident light beam along said board, and a portion for guiding the incident light beam in a direction perpendicular to the image sensing surface.

10. An optical apparatus for forming an object image on an image sensing element through a photographing optical system which has an optical member having a reflecting surface and a refracting surface, wherein the optical member included in said photographing optical system and said image sensing element are mounted on the same board; and wherein said photographing optical system includes a movable optical member movably mounted on said board, and a fixed optical member fixed to said board, and optical adjustment for said image sensing element is performed by moving said movable optical member, wherein said optical system includes an optical low-pass filter, and said image sensing element and said optical low-pass filter sandwich said board.

11. The apparatus according to claim 10, wherein said photographing optical system has a fixed focal length with respect to said image sensing element.

12. The apparatus according to claim 10, wherein said photographing optical system includes an optical member fixed to said board.

13. The apparatus according to claim 10, wherein said photographing optical system has a focal length changing function for said image sensing element.

14. The apparatus according to claim 13, wherein said photographing optical system includes a plurality of movable optical members movably mounted on said board, and a fixed optical member fixed to said board, and focus adjustment of said photographing optical system is performed by moving at least one of said movable optical members, while a focal length of said photographing optical system is changed by moving said other movable optical members.

15. The apparatus according to claim 14, wherein said board has guide means for guiding said movable optical member in a moving direction thereof.

16. The apparatus according to claim 14, wherein a moving direction of said movable optical member is parallel to a surface of said board.

17. The apparatus according to claim 10, wherein said board has guide means for guiding said movable optical member in a moving direction thereof.

18. The apparatus according to claim 10, wherein a moving direction of said movable optical member is parallel to a surface of said board.

19. The apparatus according to claim 10, wherein an image sensing surface of said image sensing element is parallel to said board, and said photographing optical system includes a first portion for guiding an incident light beam along said board, and a portion for guiding the incident light beam in a direction perpendicular to the image sensing surface.

20. An image sensing apparatus comprising:
(a) optical system mounted on a board for forming an optical image, wherein said optical system includes a first light axis for directing light to a first direction along a surface of said board, a second light axis for directing light to a second direction along the surface of said board and different from said first direction, and a third light axis for directing light to a third direction across said board; and
(b) an image sensing element placed with respect to said board for receiving the light directed by said third axis;
wherein said optical system includes an optical low-pass filter, and said image sensing element and said optical low-pass filter sandwich said board.

21. An image sensing apparatus according to claim 20, wherein said optical system includes a prism.

22. An image sensing apparatus according to claim 20, wherein said optical system includes a plurality of prisms.

23. An image sensing apparatus according to claim 20, wherein optical system is mounted to one side of said board while said image sensing element is placed with respect to the other side of said board.

24. An image sensing apparatus according to claim 23, wherein said image sensing element receives the light directed by said optical system through an opening of said board.

25. An image sensing apparatus according to claim 20, further including an adjusting means mounted on said board for adjusting said optical system.

26. An image sensing apparatus according to claim 25, wherein said adjusting means includes an electro-magnetic drive means mounted on said board.

27. An image pickup apparatus comprising:
(a) an optical lens for forming an optical image and mounted on a first side of a board;
(b) an optical low-pass filter mounted on a first side of said board, for receiving a light passed through said optical lens and for cutting a high frequency component of said light; and
(c) an image sensing element mounted on a second side of said board for receiving a light passed through said optical low-pass filter and for forming an electrical image signal, wherein said image sensing element and said optical low-pass filter sandwich said board while said board has an opening between said image sensing element and said optical low-pass filter.

28. An image pickup apparatus according to claim 27, wherein said optical lens includes a prism.

29. An image pickup apparatus according to claim 27, wherein said optical lens includes a moving mechanism for moving a part of said optical lens along a surface of said board.

30. An image pickup apparatus according to claim 29, wherein said moving mechanism includes an electro-magnetic driving circuit formed on said board.

* * * * *

UNITED STATES PATENT AND TRADEMARK OFFICE
CERTIFICATE OF CORRECTION

PATENT NO. : 6,498,624 B1
DATED : December 24, 2002
INVENTOR(S) : Ogura et al.

It is certified that error appears in the above-identified patent and that said Letters Patent is hereby corrected as shown below:

<u>Title page,</u>
Item [56], U.S. PATENT DOCUMENTS, for the last cited reference, delete "Ogure et al." and insert therefor -- Ogura et al. --

<u>Column 9,</u>
Line 39, delete "le" and insert therefor -- 1e --

<u>Column 23,</u>
Line 36, delete "tot he" and insert therefor -- to the --

<u>Column 35,</u>
Line 59, delete "an" and insert therefor -- and --

<u>Column 37,</u>
Line 52, delete "members" and insert therefor -- member --

Signed and Sealed this

Fifteenth Day of April, 2003

JAMES E. ROGAN
*Director of the United States Patent and Trademark Office*